United States Patent [19]

Ogawa et al.

[11] 4,297,727
[45] Oct. 27, 1981

[54] FACSIMILE APPARATUS

[75] Inventors: Mutsuo Ogawa; Yuji Koseki; Yuichi Saitoh; Shingo Yamaguchi; Shigeru Katsuragi, all of Tokyo, Japan

[73] Assignee: Ricoh Company, Ltd., Tokyo, Japan

[21] Appl. No.: 164,466

[22] Filed: Jun. 30, 1980

[30] Foreign Application Priority Data

Jul. 9, 1979 [JP] Japan .................................. 54-85826

[51] Int. Cl.³ ........................................... H04M 1/00
[52] U.S. Cl. .................................. 358/261; 358/261; 364/515
[58] Field of Search ............... 358/260, 261, 256, 286; 364/515; 340/347 DD

[56] References Cited

U.S. PATENT DOCUMENTS

| | | | |
|---|---|---|---|
| 4,091,424 | 5/1978 | Widergren | 358/261 |
| 4,135,214 | 1/1979 | Weber | 358/261 |
| 4,193,097 | 3/1980 | Kurahayashi et al. | 358/261 |
| 4,207,599 | 6/1980 | Murayama et al. | 358/261 |

Primary Examiner—Robert L. Richardson
Assistant Examiner—Edward L. Coles
Attorney, Agent, or Firm—David G. Alexander

[57] ABSTRACT

Scanning and recording operations are performed by separate mechanical and electronic units. Signal processing, run length encoding and decoding operations are performed by a microcomputer on a priority interrupt basis utilizing at least two sections of a random access memory. The microcomputer operates on and stores the data on a byte-by-byte basis, with each byte having a predetermined number of bits such as eight.

12 Claims, 68 Drawing Figures

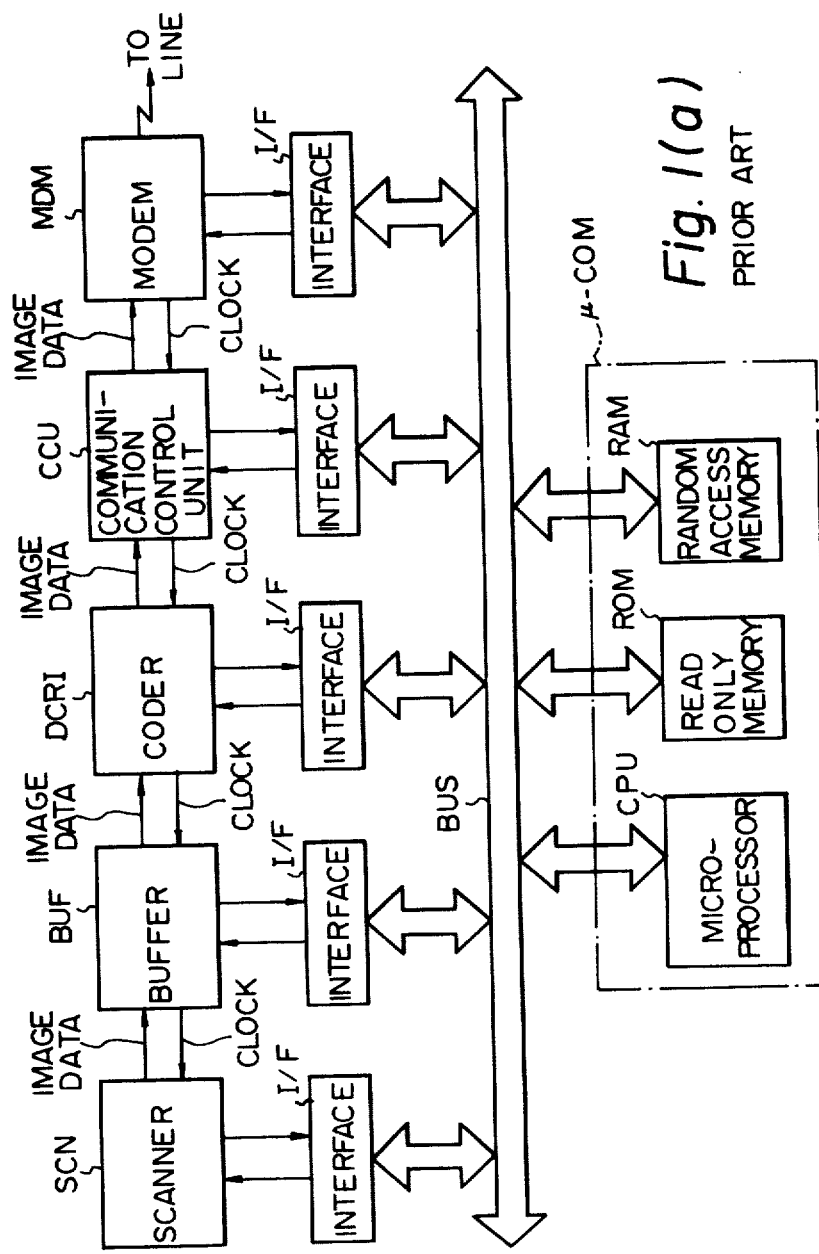

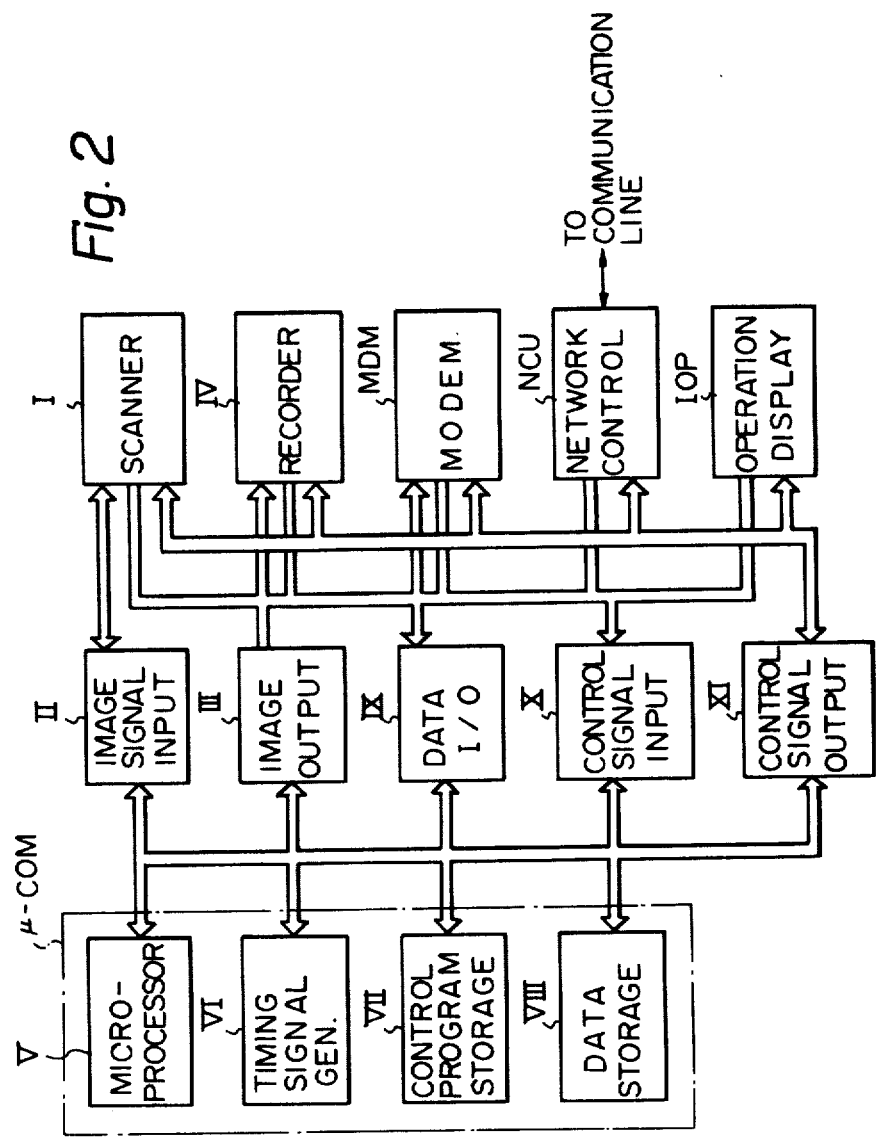

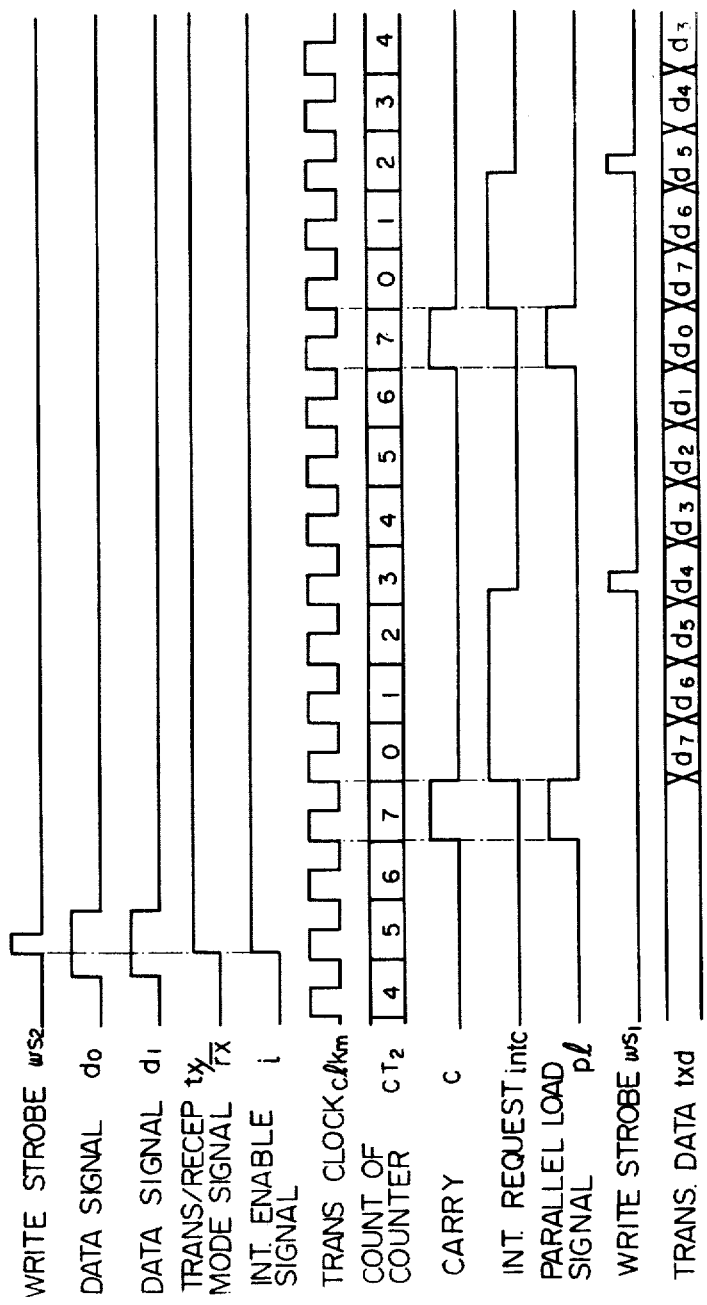

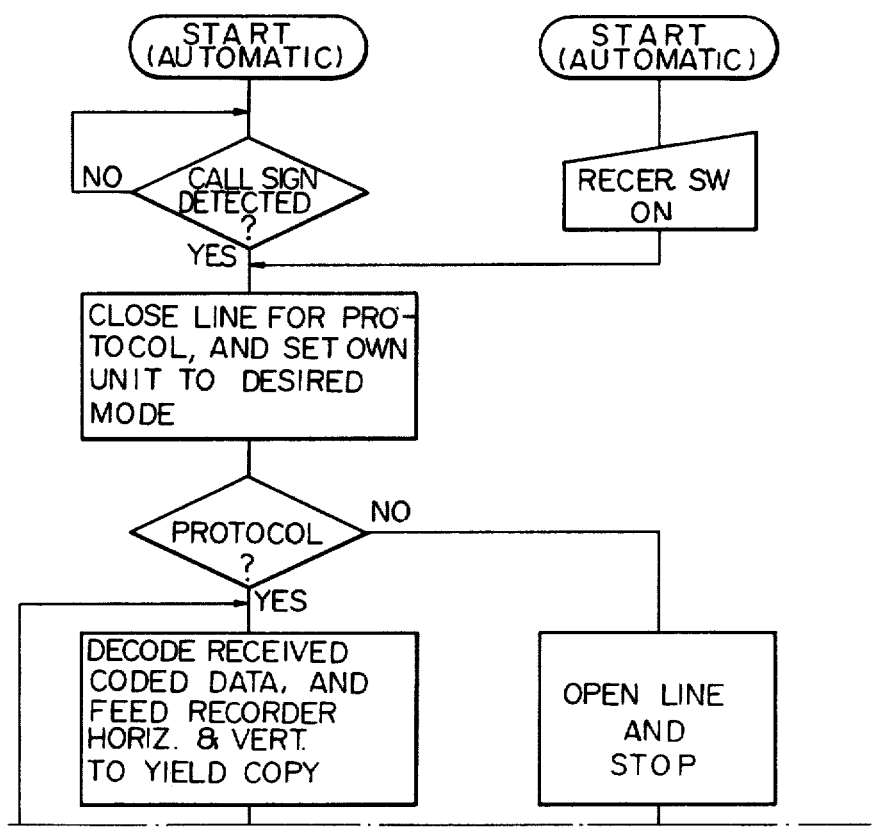

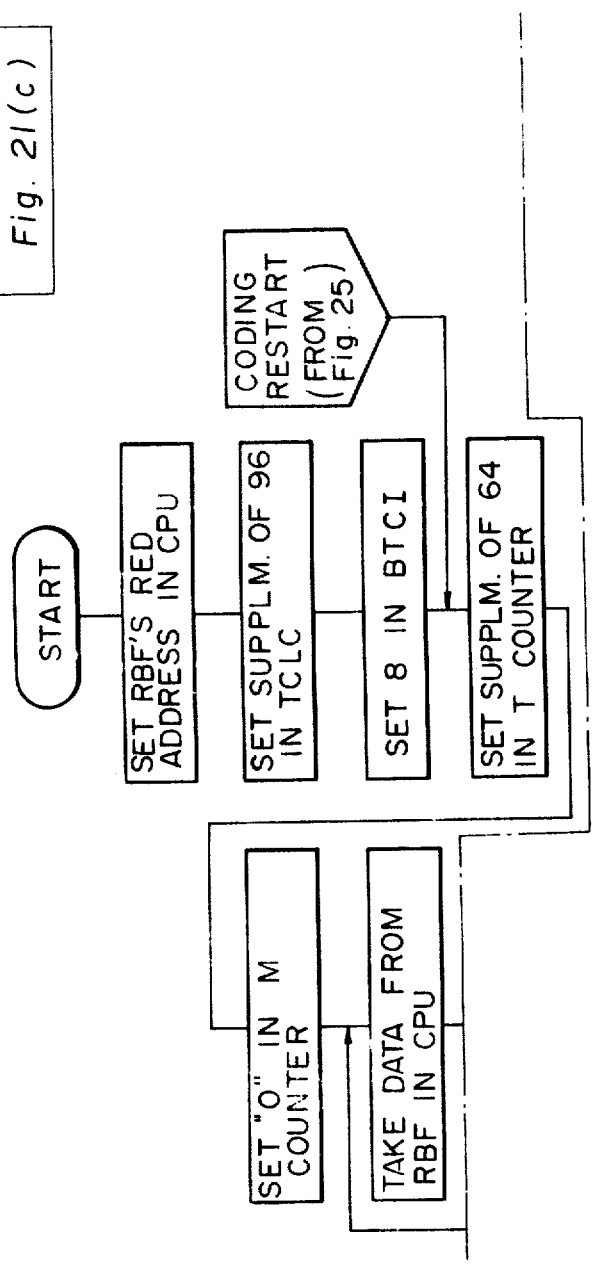

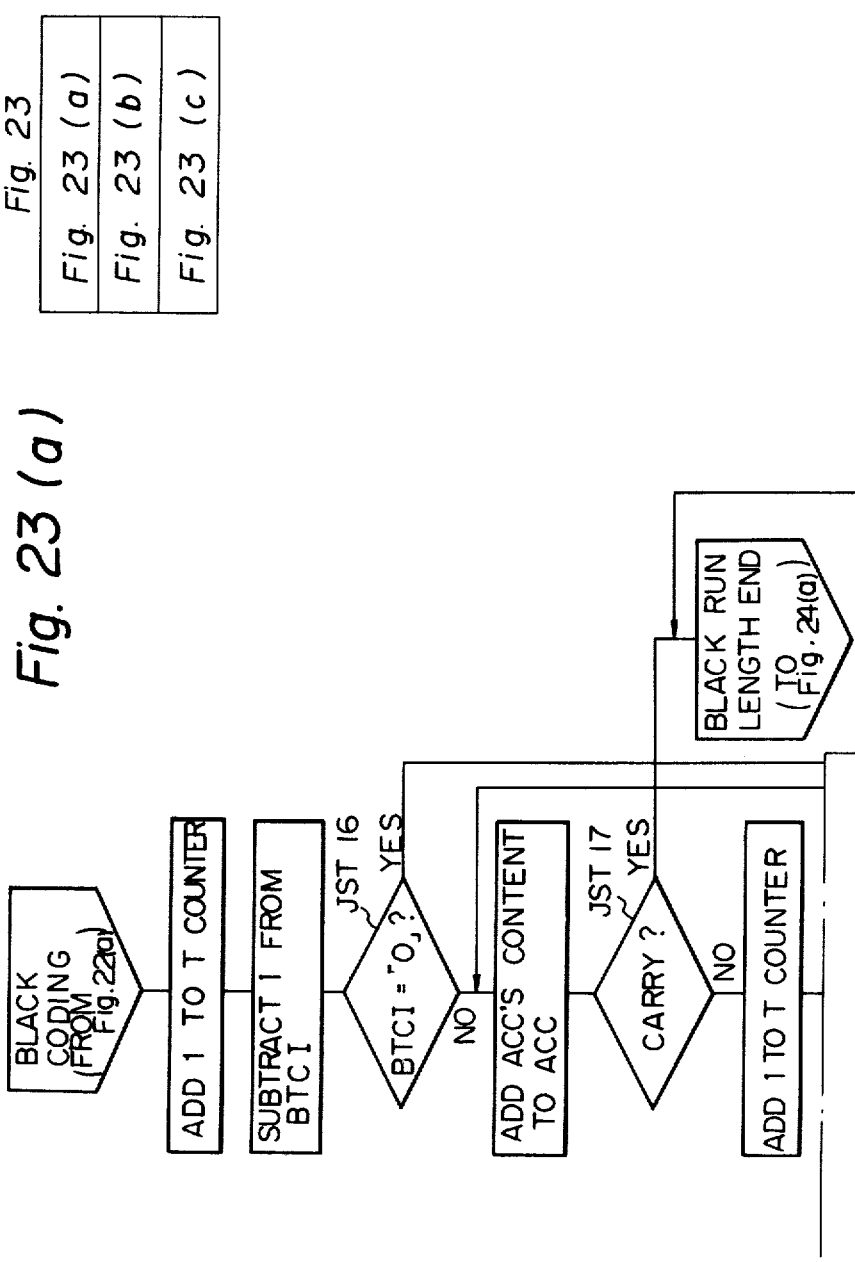

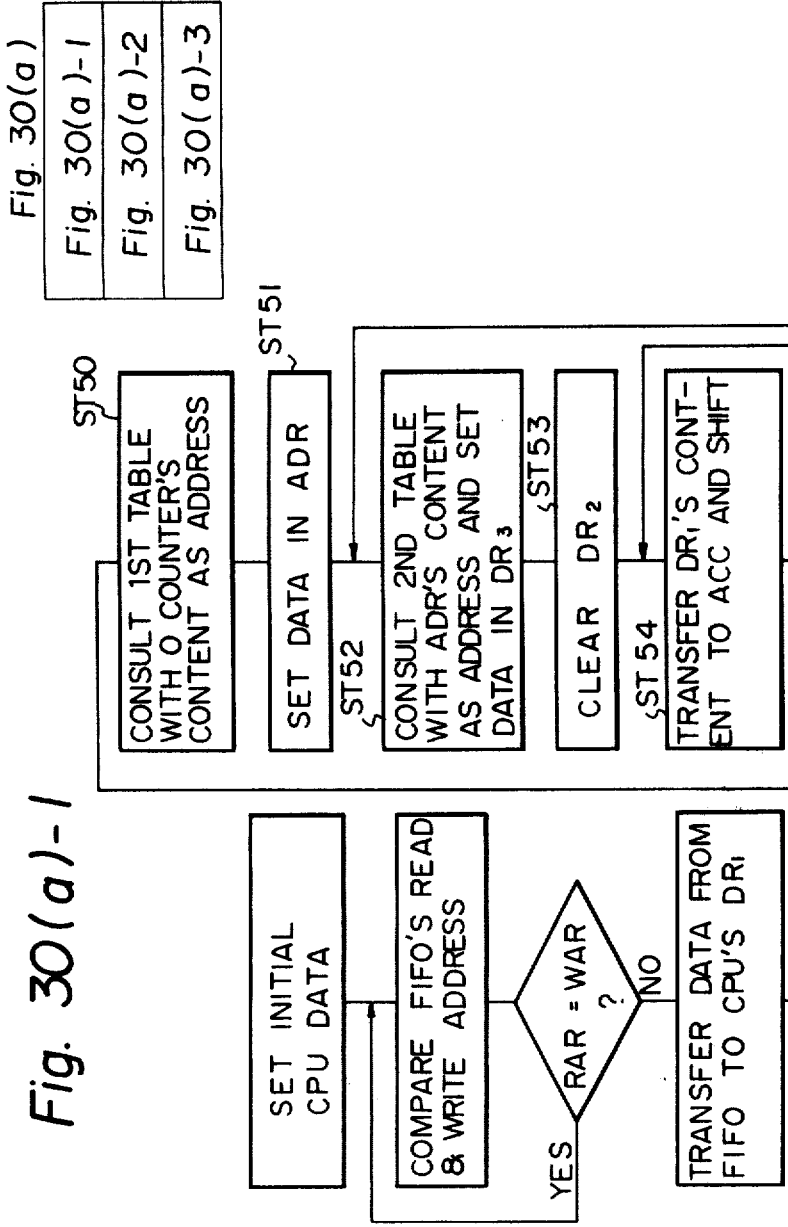

Fig. 30(b)

| ADDRESS | | |
|---|---|---|
| 0 | | |
| 1 | WH₇ | |
| 2 | WH₆ | |
| 3 | WH₅ | T₁ |
| 4 | WH₄ | |
| 5 | WH₃ | |
| 6 | WH₂ | |
| 7 | WH₁ | |
| 8 | WH₀ | |
| WH₀ | | |
| WH₁ | | T₂ |
| WH₂ | | |
| WH₇ | | |

Fig. 30(c)

| ADDRESS | | T₂ |
|---|---|---|
| WH₁ | (READNEXT) | 2 |
| WH₁+0+1 | (GOTO) | a |
| WH₁+1+1 | (GOTO) | b |
| WH₁+2+1 | (GOTO) | c |
| WH₁+3+1 | RUN= 2 | T 1 |
| a | (READNEXT) | 1 |
| a+0+1 | RUN= 11 | T 1 |
| a+1+1 | (GOTO) | d |
| d | (READNEXT)x | 2 |
| d+0+1 | RUN=27 | T 1 |
| d+1+1 | (GOTO) | e |
| d+2+1 | (GOTO) | f |
| d+3+1 | RUN=18 | T 1 |
| e | (READNEXT) | 1 |
| e+0+1 | RUN=59 | T 1 |
| e+1+1 | RUN=60 | T 1 |
| f | (READNEXT) | 2 |
| f+0+1 | RUN=1472 | M 1 |
| f+1+1 | RUN=1536 | M 1 |
| f+2+1 | RUN=1600 | M 1 |
| f+3+1 | RUN=1728 | M 1 |
| | (READNEXT) | 2 |
| | (GOTO) | g |

Fig. 30(d)

| RUN | T/M | 1 |
|---|---|---|

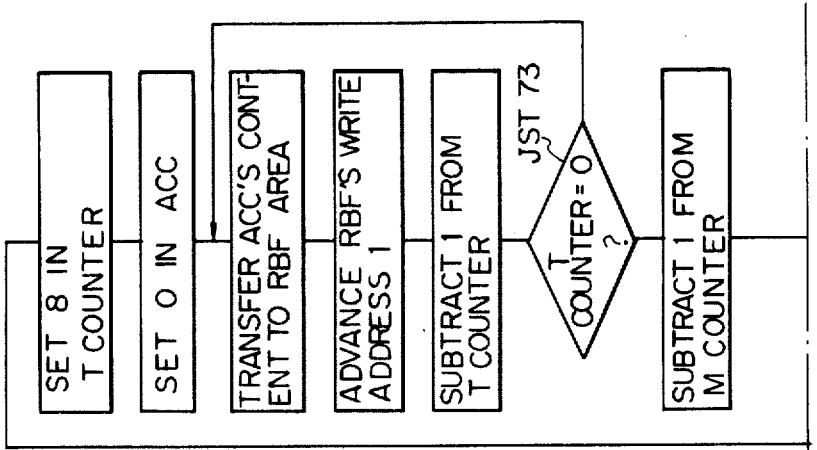
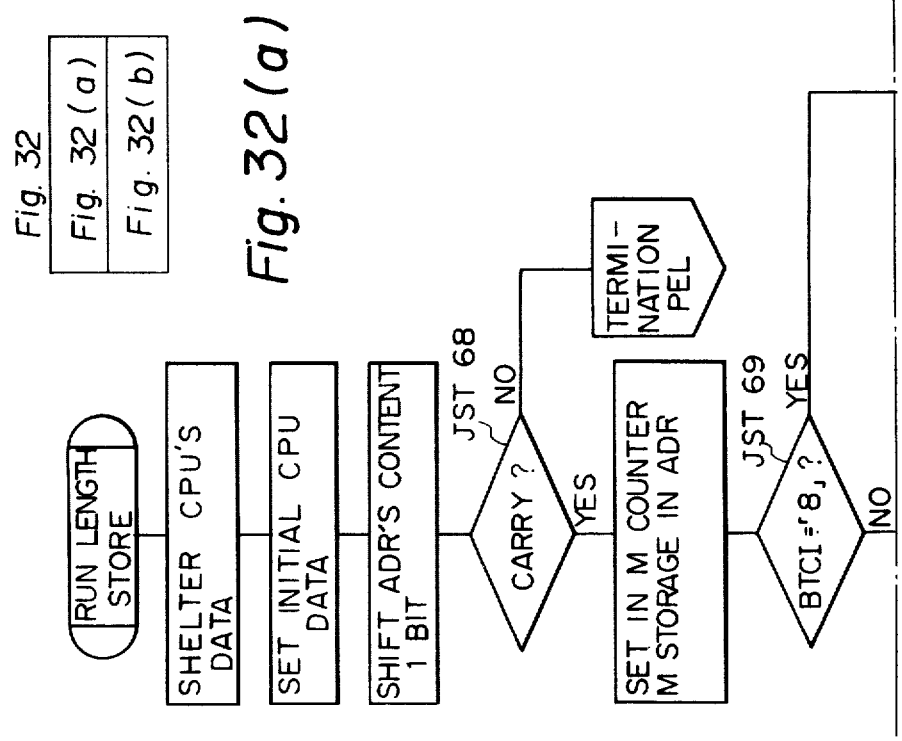
Fig. 32
Fig. 32(a)
Fig. 32(b)
Fig. 32(a)

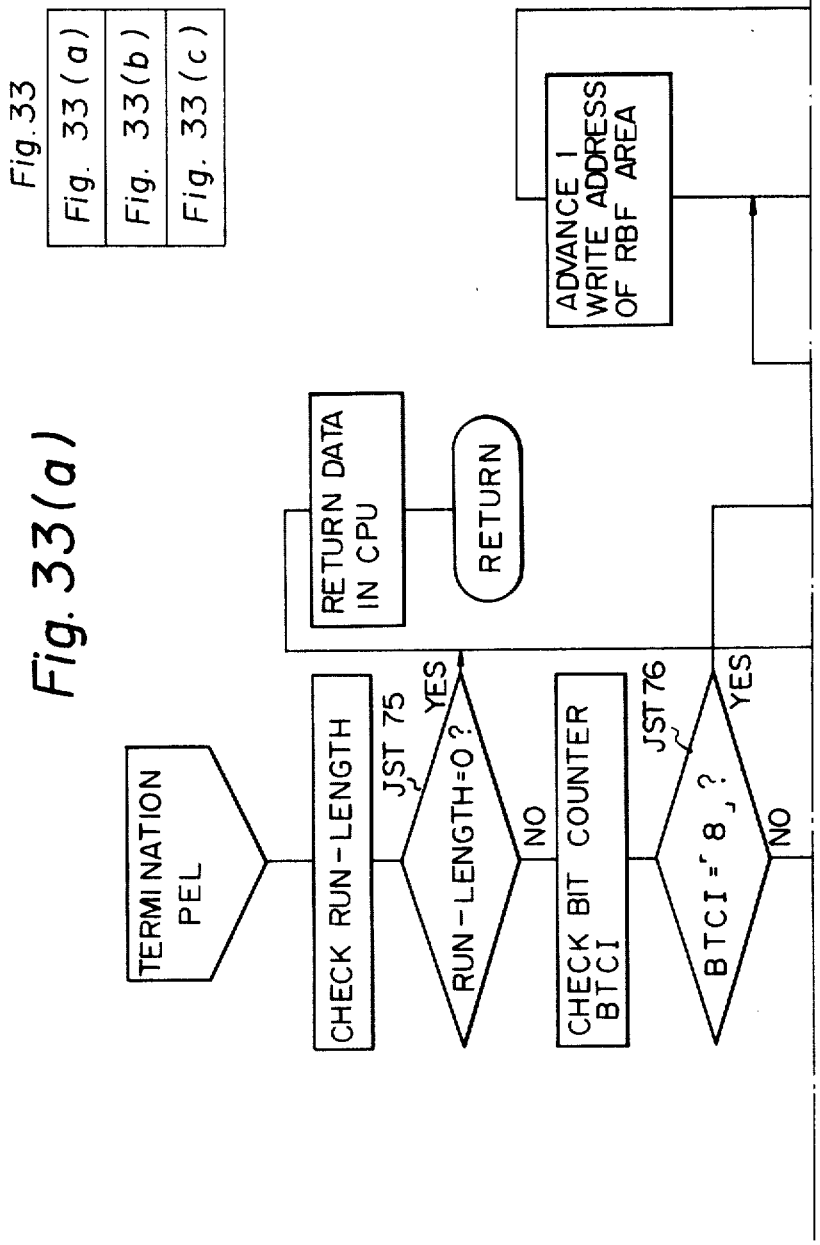

4,297,727

FACSIMILE APPARATUS

BACKGROUND OF THE INVENTION

The present invention relates to facsimile communication systems and, more particularly, to a facsimile communication system using a microcomputer.

Recently, microcomputers have achieved remarkable progress with the development of integrated circuit techniques. Indeed, microcomputers having large capacities despite compact designs and capable of advanced operations are available today at very low prices.

A variety of industrial fields now widely employ microcomputers including the art of facsimile communication systems. Modern systems for facsimile communication utilize microcomputers to replace those portions of a traditional system which consisted of exclusive hardware arrangements.

Presently, however, microcomputers have a certain limit in their operating rate and cannot constitute substitutes for hardware portions operable at high speeds.

Nevertheless, bit-bit-bit processing and, therefore, high-speed operation are required of facsimile systems to code data which they deal with.

In such a situation, systems for facsimile communication heretofore developed using microcomputers commonly rely on exclusive hardware for constituting those portions expected to perform high-speed operations while employing microcomputers merely as auxiliaries to the high-speed hardware portions. They accordingly have failed in putting the inherent and advantageous functions of microcomputers to practical use.

SUMMARY OF THE INVENTION

A facsimile apparatus embodying the present invention comprises scanner means, recorder means, microcomputer means having a central processing unit, a read only memory containing an operating program and a random access memory modem means, first interface means connected between the scanner means and the microcomputer means, second interface means connected between the microcomputer means and the modem means, and third interface means connected between the microcomputer means and the recorder means, in a transmission mode, the operating program controlling the microcomputer means to store image data from the scanner means in a first section of the random access memory through the first interface means, encode the data and store the encoded data in a second section of the random access memory and transfer the encoded data from the second section of the random access memory through the second interface means to the modem for transmission, in a reception mode, the operating program controlling the microcomputer means to store encoded data received through the modem in the second section of the random access memory through the second interface means, decode the data and store the decoded data in the first section of the random access memory and transfer the decoded data from the first section of the random access memory through the third interface means to the recorder for producing a facsimile reproduction.

In accordance with the present invention, scanning and recording operations are performed by separate mechanical and electronic units. Signal processing, run length encoding and decoding operations are performed by a microcomputer on a priority interrupt basis utilizing at least two sections of a random access memory. The microcomputer operates on and stores the data on a byte by byte basis, with each byte having a predetermined number of bits such as eight.

It is an object of the present invention to provide an improved facsimile apparatus which utilizes a microcomputer for signal processing operations performed by special purpose hardware in the prior art, thereby greatly reducing the cost and complexity of the apparatus.

It is another object of the present invention to provide a generally improved facsimile apparatus.

Other objects, together with the foregoing, are attained in the embodiments described in the following description and illustrated in the accompanying drawing.

BRIEF DESCRIPTION OF THE DRAWING

FIG. 11(b) is a timing chart explaining operation of the input/output section of FIG. 11(a) in a data transmission mode;

FIGS. 30(a)-30(d) illustrate a construction of the table;

DESCRIPTION OF THE PREFERRED EMBODIMENTS

While the facsimile apparatus of the present invention is susceptible of numerous physical embodiments, depending upon the environment and requirements of use, substantial numbers of the herein shown and described embodiments have been made, tested and used, and all have performed in an eminently satisfactory manner.

Figure 1B:
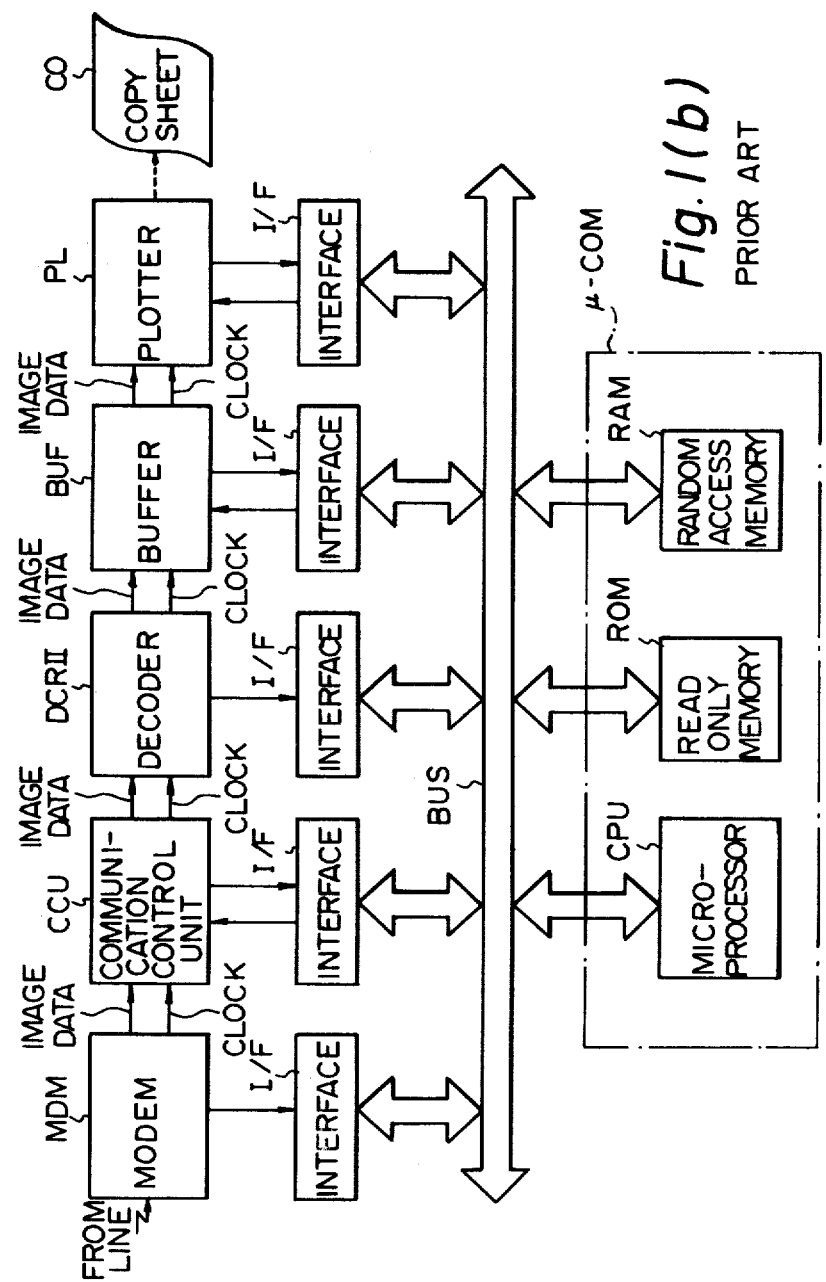
FIGS. 1(a) and 1(b) are explanatory of a conventional facsimile communication system, in which 1(a) is a block diagram of a transmitter arrangement and 1(b) is a block diagram of a receiver arrangement.

A conventional facsimile system using a microcomputer is shown in block diagram in FIGS. 1(a) and 1(b). Data are processed by hardware components alloted exclusively for this purpose whereas a microcomputer $\mu$-COM is not more than a component for controlling the sequence of the hardware components through individual interfaces I/F.

Therefore, even through a facsimile system may be designed to use various components for both transmission and reception, it still needs a buffer unit BUF which includes a storage such as a shift register or a random access memory, counter, numerous gates and timing for controlling flip-flops etc.

For protocol, the system also requires a communication control unit CCU which includes a delay circuit for preparing a HDLC format and decoding the format and decoding the format during data reception, generators and detectors for flags and error check codes, and a number of counters, flip-flops, shift registers and gates.

For data transmission, the system must be equipped with a coder unit DCR made up of a counter for counting run-lengths, flip-flop and exclusive OR gate circuits for detecting points of transition of runs, a read only memory for selecting codes corresponding to run-lengths, a FIFO buffer memory for matching the system rate to the line rate by temporarily storing the output of the read only memory, a counter for transferring the code to the FIFO buffer memory, a counter for generating fill bits necessary for compensating the minimum transmission time to cope with high compression rates, and numerous flip-flop and gate circuits.

Furthermore, for data reception, the system needs a decoder unit $DCR_{II}$ made up of a FIFO buffer memory for converting the rate of received image data coupled from the communication control unit CCU, a circuit for detecting FOL (sync) codes and fill bits to remove them from received image data, shift register and bit counters for picking up codes, a read only memory for selecting run-length binary numerical values corresponding to the processed codes, a run-length couter for transferring run-lengths with bits corresponding to the binary run-length values to a buffer unit which follows the run-length counter, a total counter for checking errors by counting one line of bits, and numerous flip-flop and gate circuits for controlling clock pulses necessary for the error check. In FIGS. 1(a) and 1(b), there also shown a scanner SCN, a modem MDM, a plotter PL, a copy sheet CO, a microprocessor CPU, a read only memory ROM, a random access memory RAM and a bus line BUS. The CPU, ROM and RAM are constituted by a microcomputer.

It will thus be seen that a microcomputer in a traditional facsimile communication system design replaces only a limited number of parts such as a system controller; a major part of the system relies on various logic and hard wired arrangements. The result is a construction which is still bulky and costly.

An object of the present invention is to provide a compact and inexpensive facsimile communication system in which a microcomputer replaces all of the hardware components except a minimum necessary number inclusive of a scanner, a plotter and a modem.

In order to achieve this object, a facsimile communication system according to the present invention characteristically employs a microcomputer for coding image data to be transmitted and/or for decoding received image data.

Before entering into the detailed description of a preferred embodiment, characteristic features of the present invention will be enumerated.

(1) After a scanner reads image data, a microcomputer performs various operations from counting of run-lengths to coding and preparing a transmission format.

(2) After received data are transferred to a microcomputer, the microcomputer undertakes various operations from decoding of the received data to conversion of the decoded data into image data and transfer of the image data to a recorder.

(3) A microcomputer dictates turn-on and -off of a document illustrating light source at the scanner, start and stop of a document feeding mechanism, activation and deactivation of a modem and/or network control unit.

(4) A microcomputer carries out protocol for handshaking with a remote apparatus and mode setting for its own apparatus.

(5) A microcomputer informs the remote apparatus of functions alloted to its own apparatus and/or sets the operating mode of the remote apparatus.

(6) A microcomputer checks errors in received image data and deals with image data involving errors.

(7) A microcomputer controls start and stop of a sheet conveyor in the recorder and the recording timing.

(8) A microcomputer turns on and off indication lamps in an operating section and accepts operation signals.

(9) All of the above-mentioned actions can be carried out by a single microcomputer if they are appropriately proportioned with respect to time.

(10) Data delivery from the scanner is completed within a shorter period of time than integration of images by an image sensor, permitting the system to follow the highest speed of the microcomputer.

(11) Preliminary processing of image data is performed on a plurality of bits simultaneously.

(12) Collective detection of transition points of a plurality of bits occurs first so as to promote quick coding of image signals.

(13) Upon detection of a point of transition, the detection mode changes into a bit-by-bit mode.

(14) During manipulation, operation signals are positively loaded in a microcomputer with chattering of switches avoided.

The embodiment shown in the drawings and described hereinafter uses Intel's 8212, 8085, 8316, 8101A4 etc. for the interface, microprocessing unit, read only memory and random access memory respectively. Obviously, however, they are not restrictive but only illustrative of the present invention.

The present invention will hereinafter be described in detail with reference to the accompanying drawings.

Figures 1, 22A:
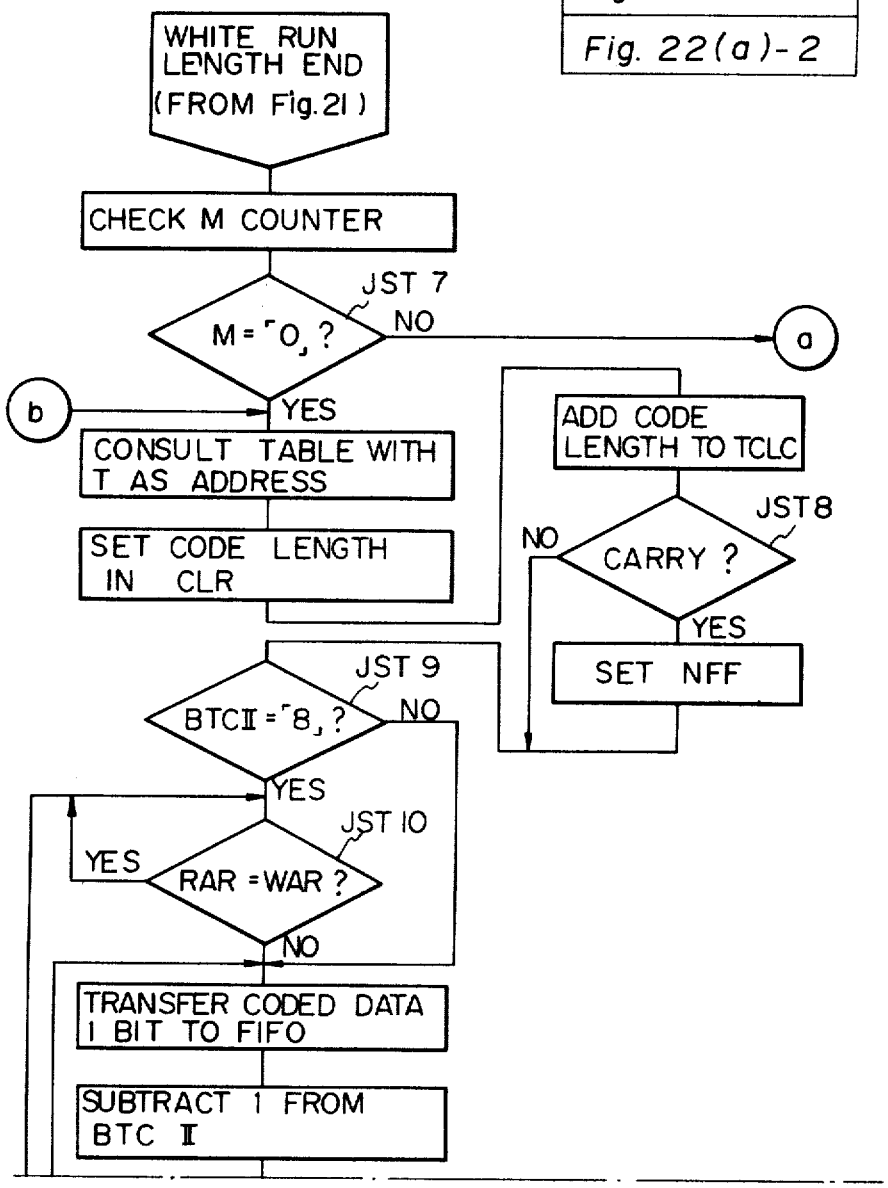
FIGS. 22(a) and 22(b) are flow charts showing a portion of the duty E in which a table is consulated on the basis of the "white" run-length to pick up a WHITE code for transfers to the FIFO area.
Figures 1, 22B:
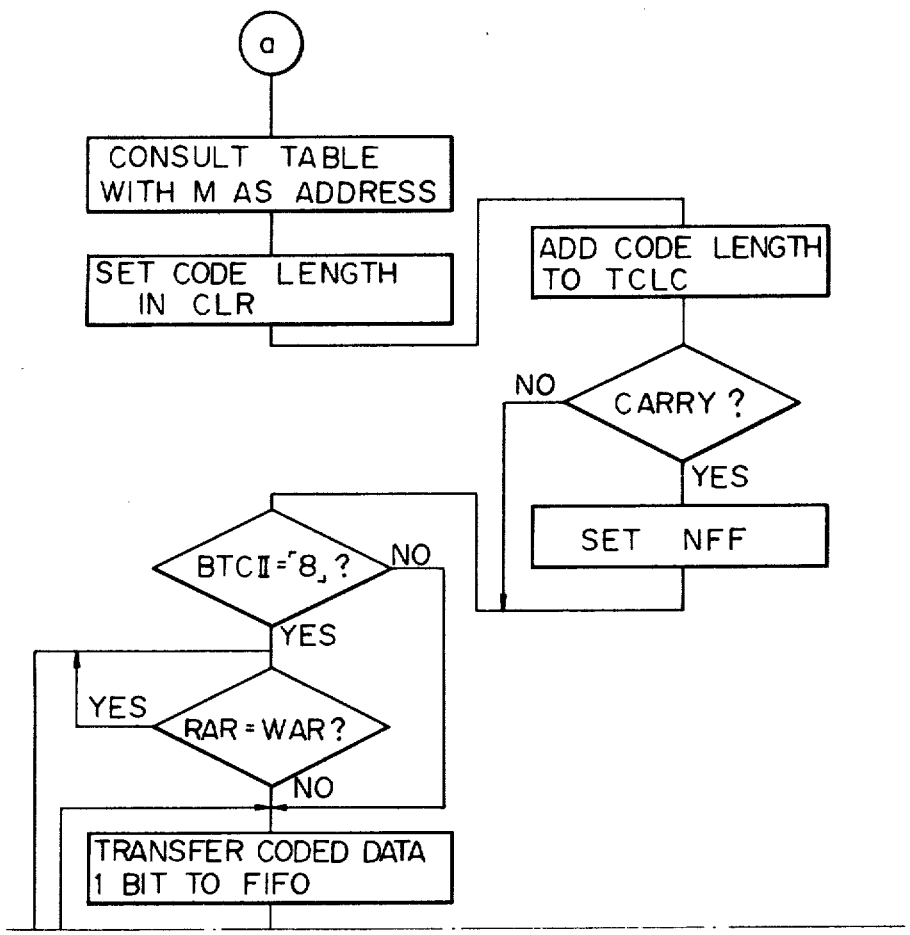
Figures 2, 22B:
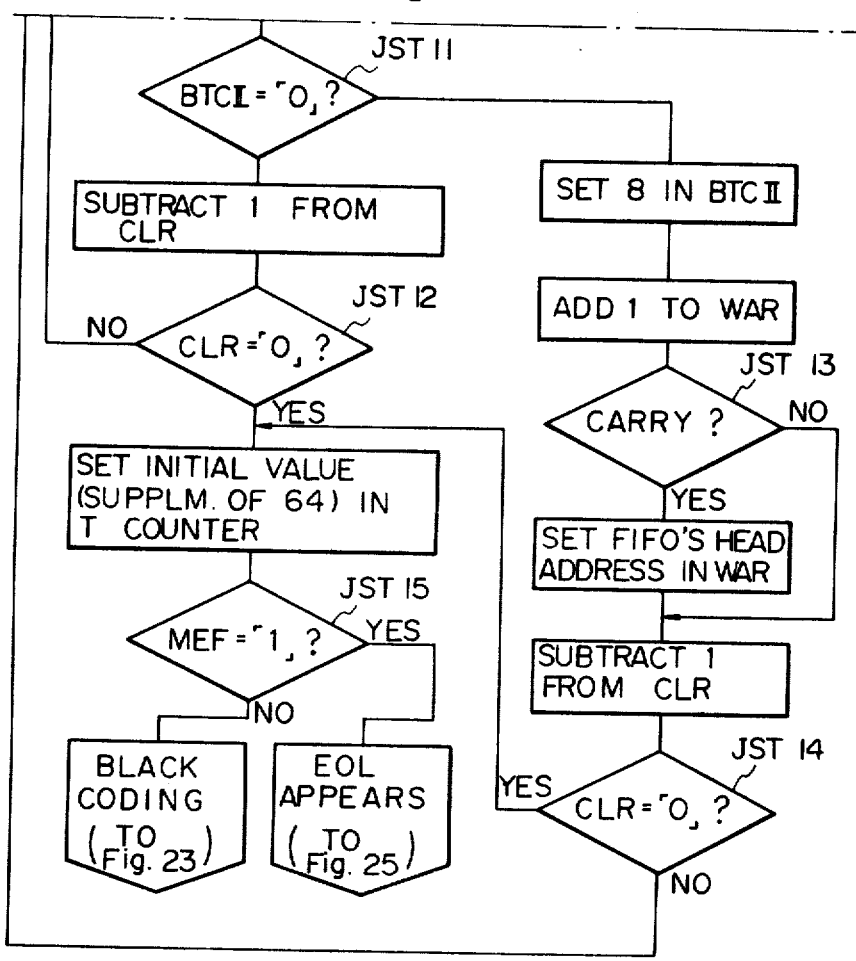
FIG. 2 is a block diagram showing a facsimile communication system according to the present invention.
Figures 2, 22B:
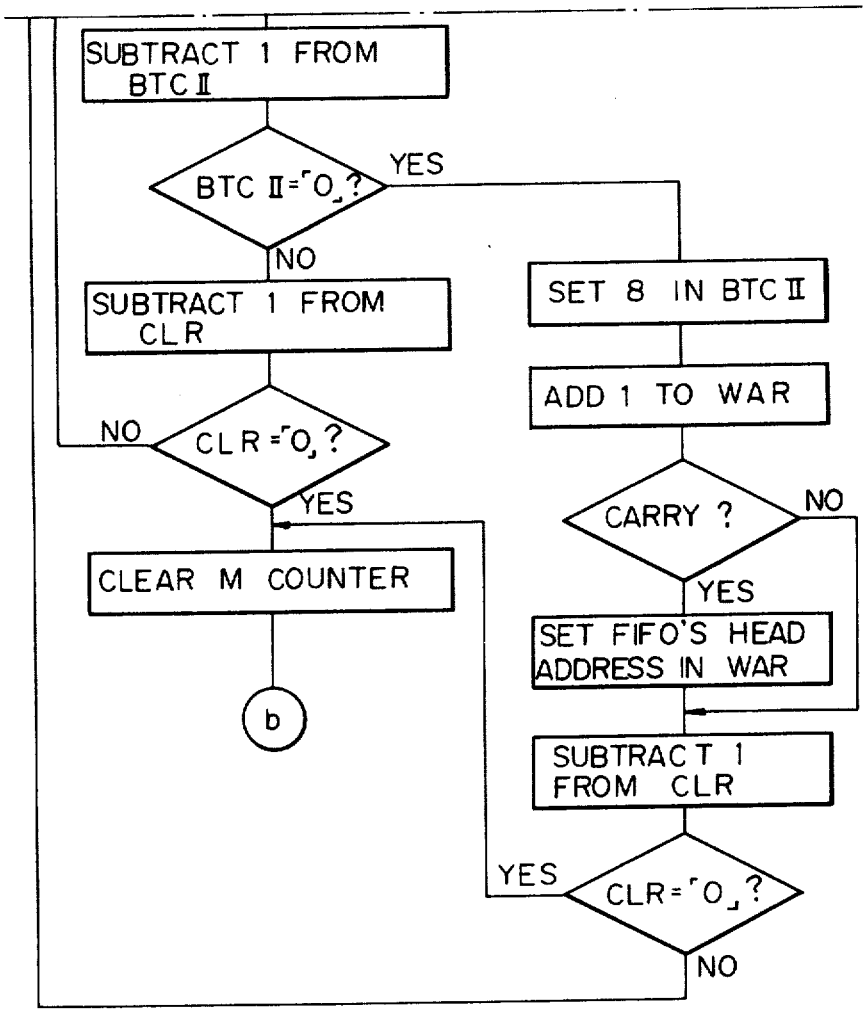

Referring to FIG. 2, there is illustrated in block diagram the overall arrangement of a facsimile communication system according to the present invention. As shown, the system includes a scanning section I adapted to read document during data transmission and produce an image signal, and an image signal input section II which transforms serial data output of the scanning section I into 8-bit parallel data and supplies it to a microcomputer $\mu$-COM. This data mode conversion is to promote high-speed processing of the image signal for coding at the microcomputer. Also included in the system are an image output section III for delivering an image signal decoded by the microcomputer $\mu$-COM during data reception therethrough, and a received image recording section IV which is supplied with the image signal from the section III to produce a copy of a document.

The microcomputer $\mu$-COM has various function such as coding and decoding image signals and controlling various operating sections of the system and is made up of a microprocessing unit section V, a timing signal generating section VI, a control program storing section VII and a data storing section VIII. Further included in the system is a data input/output section IX which, during transmission, supplies a modem MDM with parallel data each having eight bits and coded by the microcomputer by transforming them into serial data while, during reception, being supplied from the modem MDM with coded serial data and delivering it to the microcomputer by transforming it into 8-bit parallel data. Naturally, the data input/output section IX not only serves reception and delivery of image data but functions to receive and supply necessary data when protocol or the like is desired.

A control signal input section X receives signals from the sections I and IV, modem MDM and a network control section NCU and passes them to the microcomputer $\mu$-COM. A control signal output section XI is adapted to supply the respective sections with predetermined control signals.

Constructed as briefly described above, the facsimile communication system will be discussed in greater detail concerning its arrangement and operation with reference to FIG. 3 and onward. The modem MDM, network control unit NCU and an operation display section IOP may comprise components already known in the art and are not directly relevant with the present invention, thus their details are omitted in the following description. In the following paragraph, capital letters in principle indicate buses and signal lines while small letters indicate signals appearing thereon.

Figure 3:
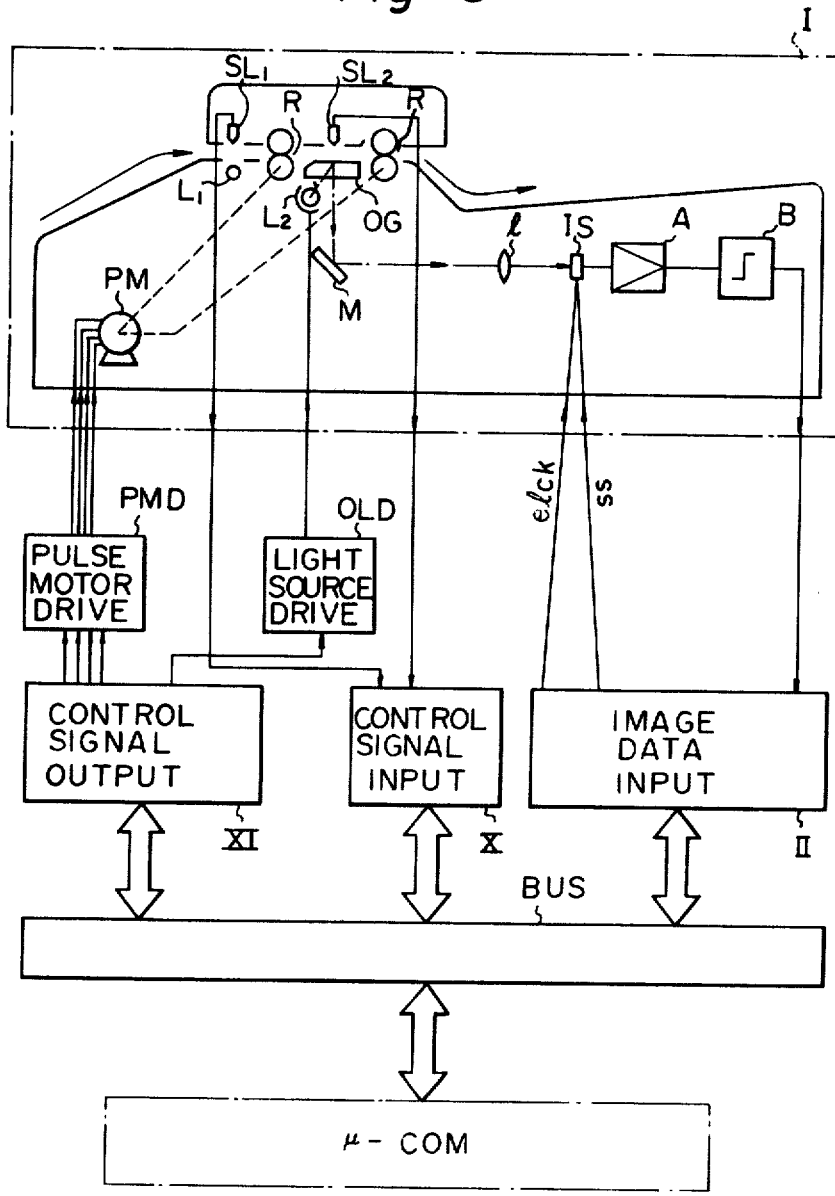
FIG. 3 shows a practical construction of a scanner section I shown in FIG. 2.

SCANNING SECTION I (See FIG. 3.)

The scanning section I shown in FIG. 3 by a dot-and-dash line. Included in this section I are a pulse motor PM for feeding a document vertically, a pair of document conveying rollers R driven by the pulse motor PM, a first light source $L_1$ for detecting a document, a second light source $L_2$ for illuminating a document, and first and second document sensors $SL_1$ and $SL_2$.

As an operator inserts a document into a document inlet as indicated by an arrow either manually or through a document feeder, the first document sensor $SL_1$ is actuated.

The condition of the sensor $SL_1$ is periodically monitored by the microcumenter $\mu$-COM. Upon actuation of the sensor $SL_1$, the microcomputer delivers a turn-on command through the control signal output unit XI to a light source drive circuit OLD which then turns on the light source L₂ for illuminating the document. Simultaneously, the microcomputer couples a drive signal to a pulse motor drive circuit PMD thereby rotating the pulse motor PM.

The pulse motor PM in turn drives the rollers R so as to transfer the document as indicated by an arrow.

As the leading end of the document reaches the position where the second sensor SL₂ is located, the sensor SL₂ informs the microcomputer μ-COM of the arrival of the document through the control signal input unit X.

Then, the microcomputer stops the rotation of the pulse motor PM and conditions it for vertical feed of the document necessary for scanning the document.

An image pattern on the document is focussed onto an image sensor IS by way of a glass platen CG, mirror M and lens 1. The image data input unit II produces element clock pulses elck and line sync pulses ss. Synchronized with the clock pulses, image signals are delivered from the image sensor IS bit by bit in a serial format to the image data input unit II through an amplifier A and a binary circuit B.

Figure 4A:
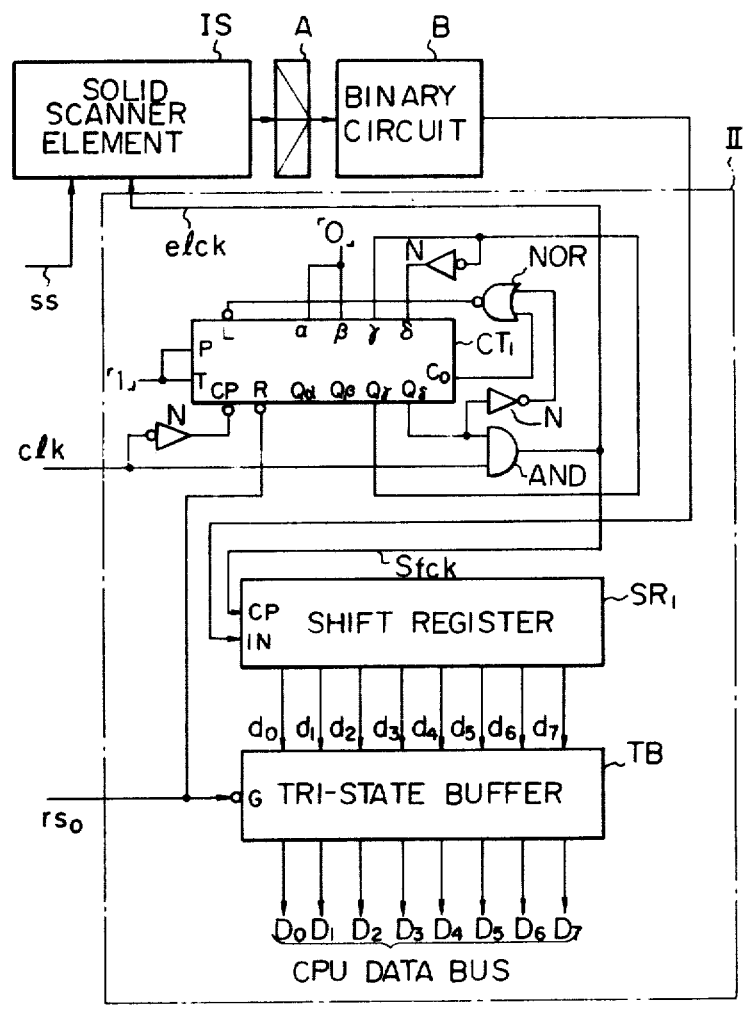
FIG. 4(a) shows a practical arrangement of an image data input section II.
Figure 4B:
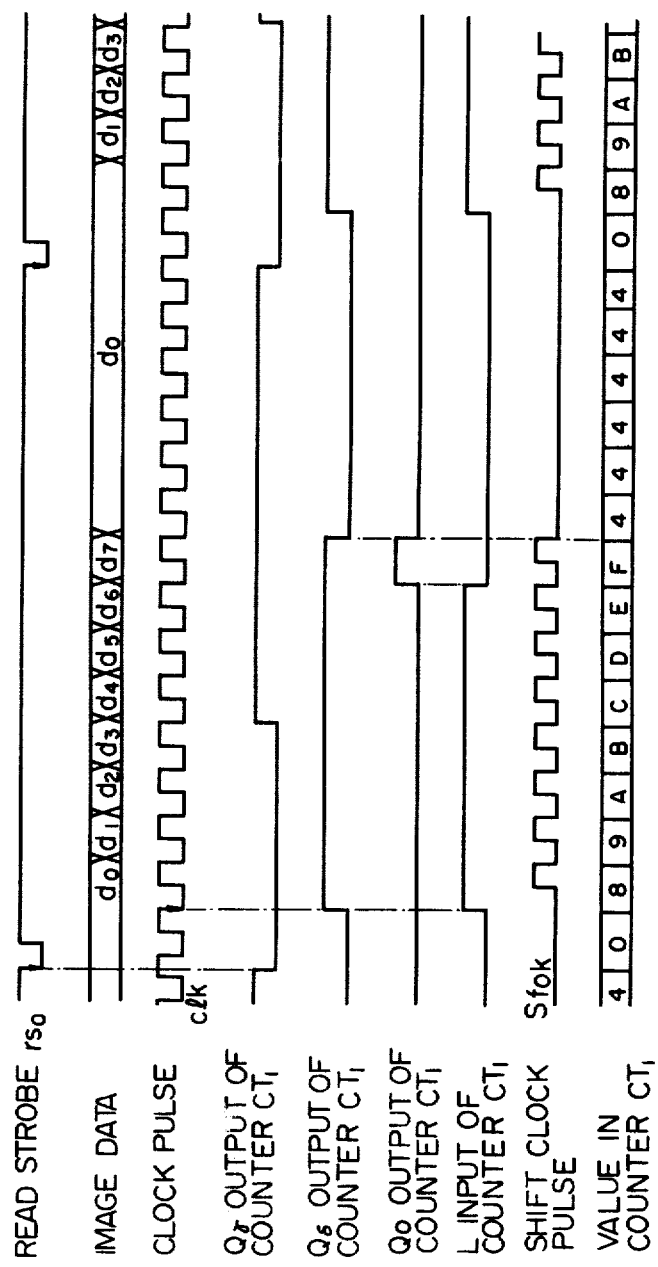
FIG. 4(b) is a timing chart explanatory of the operation of the section II.

IMAGE DATA INPUT SECTION II (see FIGS. 4(a) and 4(b).)

Shown in FIG. 4(a) by a dot-and-dash line, the image data input section II comprises a counter $CT_1$, a shift register $SR_1$ and a tri-state buffer TB. In this section II, the serial image data output of the binary circuit B is converted into parallel image data which will be coupled to data buses $D_0$-$D_7$.

A known method for the conversion of serial data into parallel data employs two shift registers and picks up parallel data from one of them while the other is receiving serial data. In contrast, the illustrated embodiment uses a single shift register, since the clock rate is so determined as to fill the shift register with the next data during the time period the microcomputer μ-COM processes parallel data.

The counter $CT_1$ comprises a presetable synchronous 4-bit binary counter in order that, upon arrival of a read strobe $rs_0$ from the microcomputer as will be described, the counter may produce eight element clock pulses elck in succession.

As long as the counter $CT_1$ receives a logical "1" input at its L terminal, it will be incremented by the leading edge of each clock pulse coupled to a CP terminal. When the input at the L terminal is logical "0", logic coupled to terminals $\alpha$, $\beta$, Y and $\delta$ of the counter will appear at output terminals $Q_\alpha$, $Q_\beta$, $Q_Y$ and $Q_\delta$. As a "0" input appears at the R terminal, the counter will be reset in asynchronous relation with the clock pulses.

The counter $CT_1$ produces a "1" output at its $C_0$ terminal when all of the outputs $Q_\alpha$-$Q_\delta$ are "1" constituting a 16-bit number F.

A $C_0$ output and a $\overline{Q_\delta}$ output are applied through a NOR gate to the L terminal of the counter $CT_1$. Therefore, a logical "0" appears at the L terminal when the value in the counter $CT_1$ becomes 0-7 and a 16-bit number F. The set terminals $\alpha$ and $\beta$ always are "0", the Y terminal the $Q_Y$ output, and the $\delta$ terminal the $\overline{Q_Y}$ output. It follows that the input at the Y terminal is "1" and that at the $\delta$ terminal is "0" when the value of the counter $CT_1$ is 4-7 or a 16-bit number C-F and they are "0" and "1", respectively, when the value of the counter is 0-3 or 8-13. Consequently, "4" will be set when the value of the counter $CT_1$ is 4-7 or F and "8" when it is 0-3, each at the leading edge of the next clock pulse which will be applied to the CP terminal.

The $Q_\delta$ output of the counter $CT_1$ is supplied to an AND gate so as to control the generation and interruption of the element clock pulses.

The shift register $SR_1$ is an 8-bit serial input, parallel output shift register.

Concerning the tri-state buffer TB, it supplies eight data buses $D_0$-$D_7$ of the microcomputer μ-COM with eight bits of data shifted in the shift register $SR_1$ while the read strobe $rs_0$ is active.

Operation of the image data input unit will be discussed with reference to the timing chart shown in FIG. 4(b).

A read strobe $rs_0$ (negative pulse) provided by the microcomputer μ-COM is passed to a G terminal of the tri-state buffer TB via a signal line $rs_0$ as will appear whereby data in the shift register $SR_1$ are delivered in parallel relation to the eight data buses $D_0$-$D_7$. At the same time, the read strobe $rs_0$ is coupled to the R terminal of the counter $CT_1$ and resets it at the trailing edge thereof.

The parallel data on the data buses are introduced into an accumulator of the microcomputer μ-COM.

In this instance, the read strobe $rs_0$ may occur at any timing and may have any desired pulse width. Also, the clock pulses clk may occur at any period as long as at least nine of them appear during the time period from the instant the microcomputer takes data in by delivering a read strobe $rs_0$ to the instant it produces another read strobe $rs_0$ to take in the next data. Should the number of clock pulses clk appearing in the time period mentioned above be less than nine, the shift register $SR_1$ would fail to be filled with 8-bit data and, therefore, disable the normal function.

When the counter $CT_1$ is reset, its $Q_\alpha$-$Q_\delta$ output becomes "0000".

As a result, the L input becomes "0" and the $\alpha$-$\delta$ input become "0001" and, when the next clock pulse clk reaches the counter $CT_1$, the $Q_\alpha$-$Q_\delta$ output is set to "00001" or "8" at the trailing edge of the clock pulse.

As the counter $CT_1$ is thus set to "8" and the $Q_\delta$ output becomes "1" to open the AND gate, a clock pulse is passed through the AND gate and coupled to the image sensor IS as an element clock pulse elck. Simultaneously, the clock pulse is applied as a shift clock pulse SFCK to the shift register $SR_1$.

Comprising a CCD for example, the image sensor IS delivers a video signal in a serial format in synchronism with the element clock pulses. This video signal is supplied to the shift register $SR_1$ through the amplifier A and binary circuit B as discussed and introduced therein bit by bit in synchronism with the shift clock pulses sfck also coupled to the shift register.

The "1" output at $Q_\delta$ terminal makes the L input "1" so that the counter $CT_1$ thereafter keeps on incrementing its value one by one in synchronism with the clock pulses clk.

Upon arrival of the 7th clock pulse clk, the value of the counter $CT_1$ becomes F which is "1111" and, therefore, the $C_0$ output becomes "1" and the L input again becomes "0". The $\alpha$-$\delta$ input on the other hand is "0010". Accordingly, the next clock pulse clk sets the counter $CT_1$ to "4" at its trailing edge for thereby closing the AND gate.

During this period of time, the AND gate delivers eight clock pulses in total. The shift register $SR_1$ will have received 8-bit serial data $D_0$-$D_7$ based on the eight clock pulses.

Thereafter, the counter $CT_1$ is repeatedly set to "4" in synchronism with the clock pulses clk while the shift register $SR_1$ holds the 8-bit data $d_0$-$d_7$ therein.

When the microcomputer $\mu$-COM supplies another read strobe $rs_0$, the 8-bit data in the shift register $SR_1$ are delivered to the eight data buses $D_0$-$D_7$ and the counter $CT_1$ is reset to repeat the process described hereinabove.

The microcomputer $\mu$-COM takes in one horizontal line of data in this way. Supposing that the microcomputer is to take in one line of data made up of 2048 bits from a document of a format B4, it will repeat the above procedure 256 times each by eight bits, or eight bits at a time.

The microcomputer $\mu$-COM codes the introduced image data line by line as will be described and transmits them to an addressee's station by way of the data input/output unit V, modem MDM and network control unit NCU. Before entering a detailed description of such actions, let us discuss the received image output section III and image recording section IV functioning to record data which the microcomputer has provided by decoding data transmitted thereto from the addressee's station.

It should be born in mind that the illustrated embodiment employs a heat-sensitive recording system and, therefore, in two sections III and IV have their circuit arrangements designed to match with the recording system. Obviously, however, the present invention is applicable to various other recording systems with minimum modification.

Figure 5A:
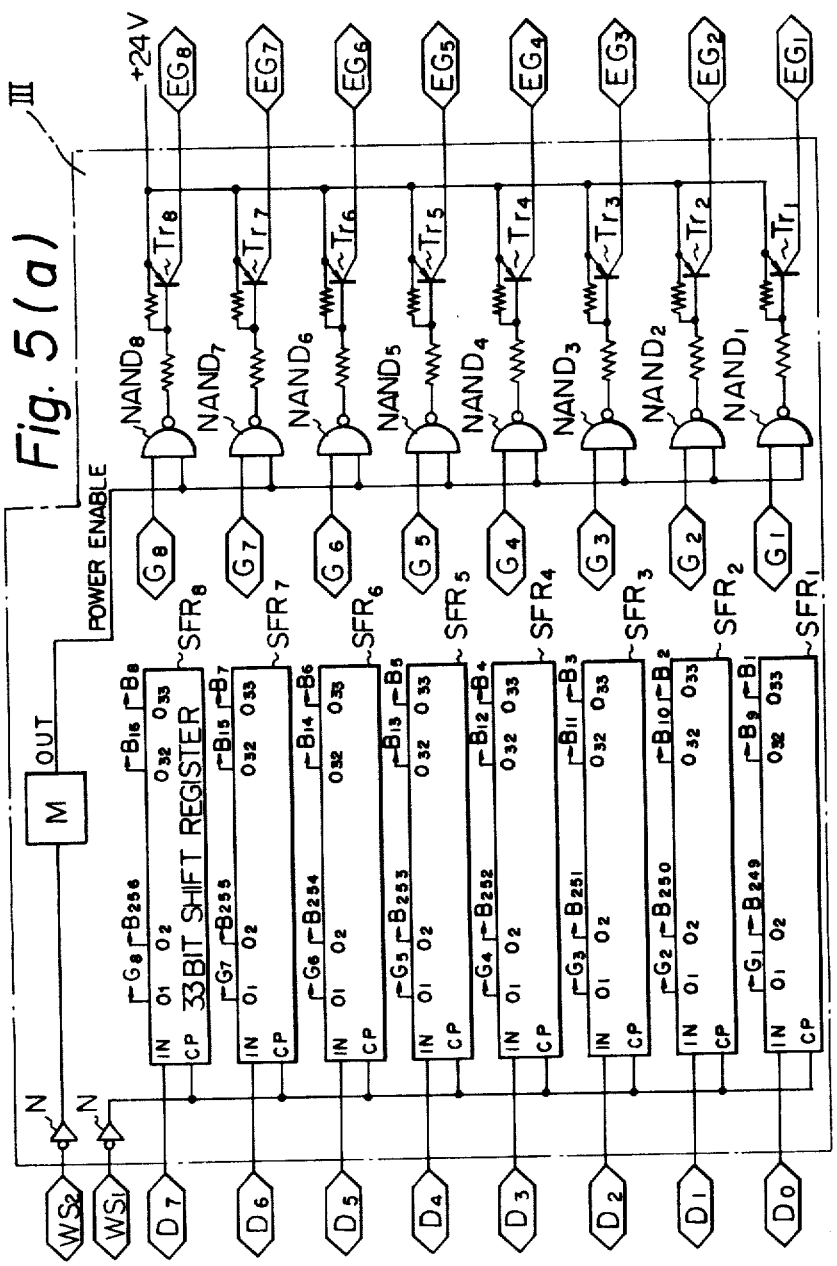
FIG. 5(a) shows a practical arrangement of a received image output section III indicated in FIG. 2.
Figure 5B:
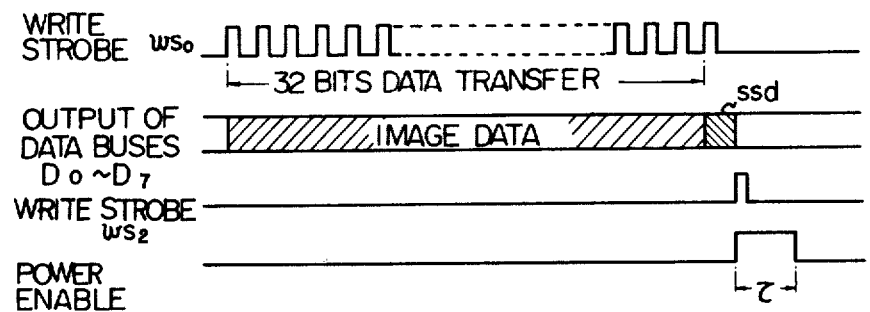
FIG. 5(b) is a timing chart explanatory of the operation of the section III.

RECEIVED IMAGE OUTPUT SECTION III (See FIGS. 5(a) and 5(b).)

As seen in FIG. 5(a), this section has 33-bit shift registers $SFR_1$-$SFR_8$, NAND gates $NAND_1$-$NAND_8$, power switching transistors $Tr_1$-$Tr_8$, a monostable multivibrator M and inverters N which are connected as illustrated.

The data buses $D_0$-$D_8$ are connected to individual input terminals IN of the shift registers $SFR_1$-$SFR_8$ while output terminals $O_1$ of these shift registers $SFR_1$-$SFR_8$ are connected to the individual NAND gates $NAND_1$-$NAND_8$ and output terminals $O_2$-$O_7$ are connected to signal input lines $B_1$-$B_{256}$ of a thermal element of the image recording section IV as will be described.

Output terminals of the power switching transistors $Tr_1$-$Tr_8$ are connected with respective segment selection input lines $EG_1$-$EG_8$ of the thermal element.

Reference will be made to the timing chart of FIG. 5(b) for describing the operation of the section III.

During data reception, the microcomputer $\mu$-COM decodes received data and delivers the decoded image data to the data buses $D_0$-$D_7$ in parallel each by eight bits. In this instance, the microcomputer applies a write strobe $ws_0$ to a signal line $WS_0$ in synchronism with each of the 8-bit parallel data.

By the write strobes $ws_0$, the 8-bit parallel data are sequentially coupled to and written in the individual shift registers $SFR_1$-$SFR_8$.

When thus 32 bits of data are fully transferred to each of the shift registers $SFR_1$-$SFR_8$, that is, when picture element data of 256 bits in total are fully transferred to the image data output section III, the microcomputer $\mu$-COM temporarily stops the data transfer and, finally, delivers data ssd for selecting respective segments of the thermal element together with a write strobe $ws_0$.

The data ssd are shifted in the 33th bit of the individual shift registers $SFR_1$-$SFR_8$ through the data buses $D_0$-$D_7$.

The segment selection data are added to each image data of 256 bits and, therefore, make the $0_1$ output of the shift registers $SFR_1$-$SFR_3$ "1" in sequence every time the data in the shift registers are altered as will be described.

As soon as preselected data from the microcomputer $\mu$-COM are stored in the shift registers $SFR_1$-$SFR_8$ of the image data output section III, the microcomputer supplies a read strobe $rs_2$ to the monostable multivibrator M of the same section III.

Then the monostable multivibrator M produces a power enable signal for a preselected time period and couples it to the NAND gates $NAND_1$-$NAND_8$. At the other input terminal, the NAND gates receive the segment selection data ssd from the output terminals $O_1$-$O_8$ of the shift registers $SFR_1$-$SFR_8$ through the signal lines $G_1$-$G_8$. Hence, a specific one of the NAND gates produces a "0" output; when the first segment on one line is to be recorded, for instance, the NAND gate $NAND_1$ will make its output "0" and the corresponding transistor $Tr_1$ will be turned on to establish connection between the signal line $EG_1$ of the thermal element SE of the section IV and the power source.

Figure 6A:
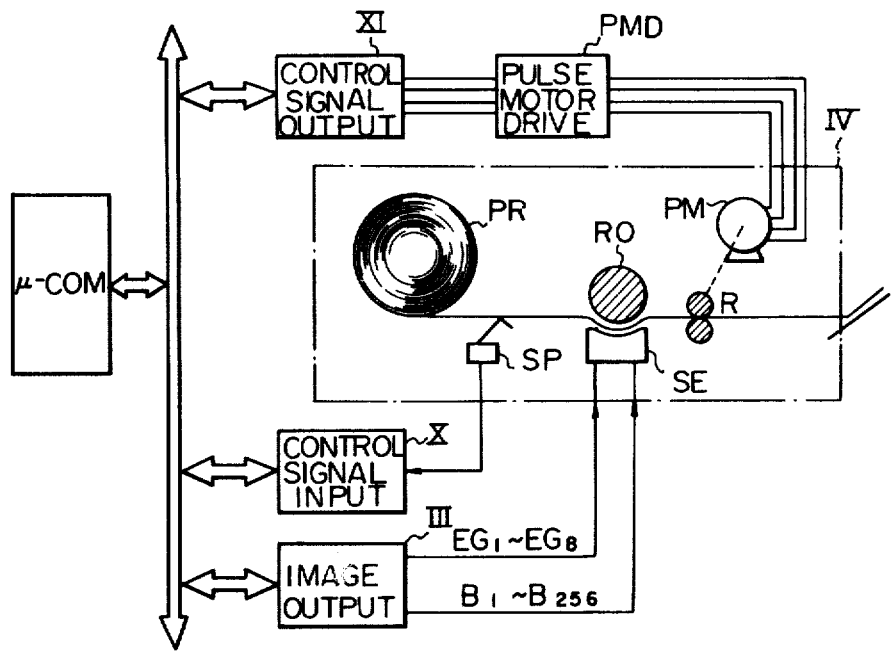
FIG. 6(a) shows an arrangement of a received image recorder section IV of FIG. 2.
Figure 6B:
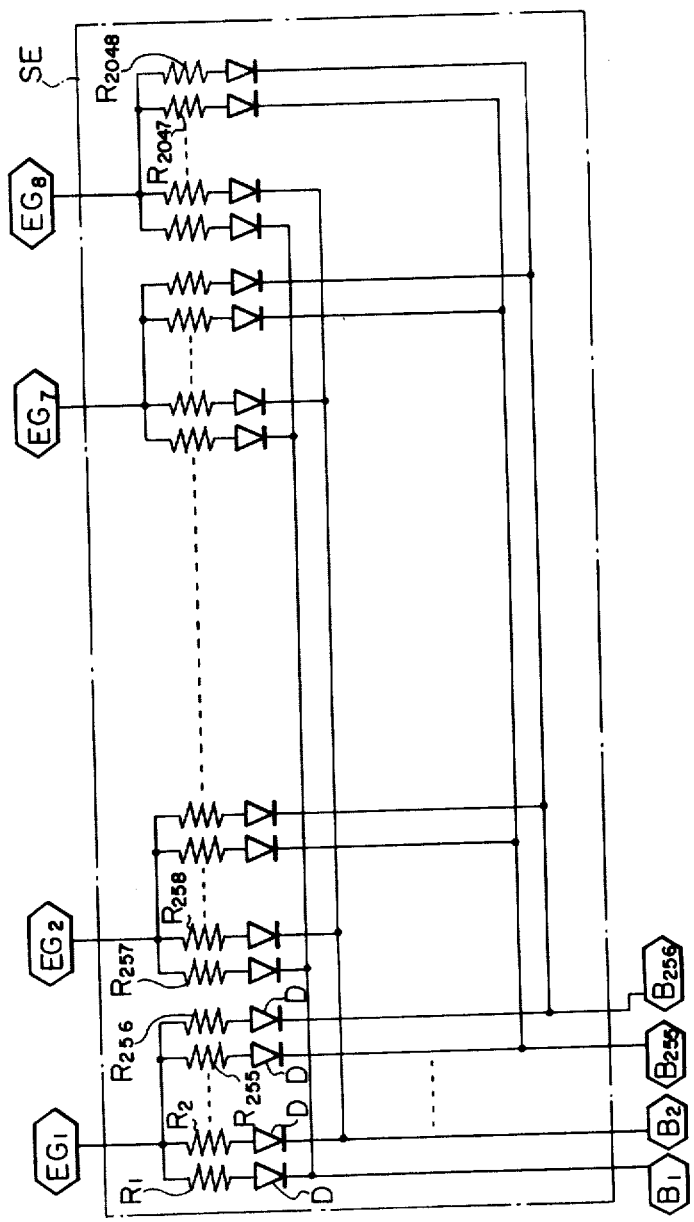
FIG. 6(b) shows a practical arrangement of a thermal element SE indicated in FIG. 6(a)

IMAGE RECORDING SECTION IV (See FIGS. 6(a) and 6(b).)

As shown in FIG. 6(a), the recording section IV comprises a pulse motor PM for vertically feeding a heat-sensitive recording sheet, a conveyor roller pair R driven by the pulse motor PM to transfer the recording sheet, a presser roller RO, a thermal element SE, a roll of recording paper PR and sheet sensor SP.

As viewed in FIG. 6(b9, the thermal element SE has an array of heat-generating resistance elements $R_1$-$R_{2048}$ corresponding to 2048 bits on one line in order to record information on sheets of B4 format. These resistance elements $R_1$-$R_{2048}$ are divided into eight segments each having 256 bits and all of the elements in each segment have their one and commonly connected with one of the segment selection signal lines $EG_1$-$EG_8$. The other ends of the elements are connected with common thermal element input lines $B_1$-$B_{256}$ in the order of arrangement in the individual segments. Diodes D associated with the individual resistance elements serve to avoid turn-on of a current.

The recording section operates as follows.

When, as discussed, image data of the first 256-bit segment from the microcomputer $\mu$-COM and segment selection data are applied to the image output section III shown in FIG. 5(a) and a write strobe $ws_2$ is supplied, the individual resistance elements $R_1$-$R_{256}$ of the thermal element are impressed with the power source voltage through the segment selection signal line $EG_1$ and the image signals through the signal lines $B_1$-$B_{256}$. Then, the image signals on the first segment are recorded on the recording sheet. This recording time is determined by the output holding time $\zeta$ of the monostable multivibrator M.

As one segment of data are fully recorded on the sheet, the microcomputer $\mu$-COM delivers image data of the next segment and segment selection data to the image output section III. Then, in response to a write strobe $ws_2$, the resistance elements $R_{257}-R_{512}$ are activated to record image signals of the second segment.

This procedure is repeated eight times to record one line or 2048 bits of image signals on the recording sheet.

In the meantime, the microcomputer $\mu$-COM supplies the control signal output section XI with pulse motor drive data, which will be described later, whereby the pulse motor PM is driven to feed the recording sheet vertically.

The microcomputer periodically checks the condition of the sheet sensor SP and, if the sheet is fed out, it will perform a predetermined action.

It will be recalled that the microcomputer $\mu$-COM according to this embodiment is made up of the microprocessor unit section V, timing signal generator section VI, control program storage section VII and data storage section VIII. These sections of the microcomputer are constructed as will be explained in succession.

Figure 7:
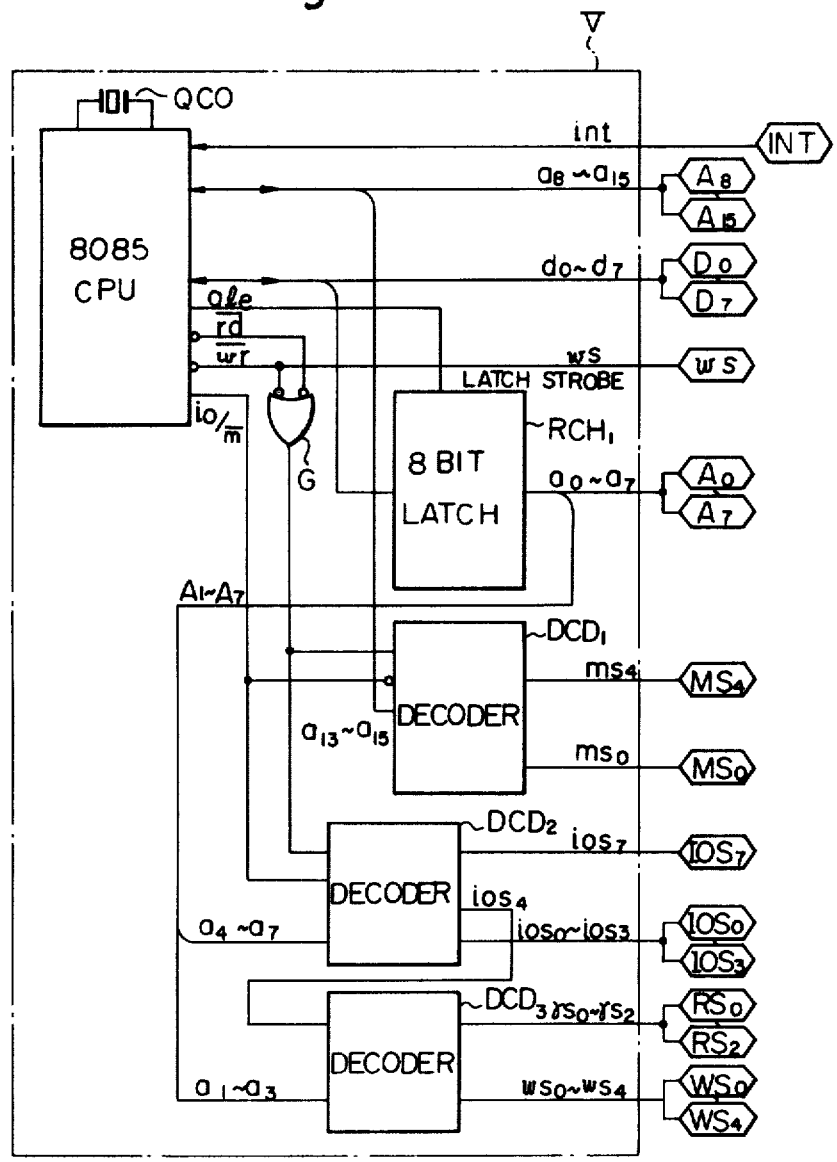
FIG. 7 shows a practical arrangement of a microprocessing unit (CPU) V indicated in FIG. 2.

MICROPROCESSOR SECTION V (See FIG. 7.)

In this embodiment, the microprocessor section V comprises Intel's 8085 CPU as viewed in FIG. 7.

The 8085 CPU has 16 terminals in total for delivering addresses and data. At a first timing, address signals $a_0-a_{15}$ of 16 bits which are upper eight bits and lower eight bits appear at the 16 terminals. At a second timing, the address signals $a_8-a_{15}$ of upper eight bits and 8-bit data signal $d_0-d_7$ appear at the same 16 terminals. Accordingly, the lower 8-bit address signal $a_0-a_7$ which appeared at the first timing must be latched so that the upper and lower 16-bit address signal $a_0-a_7$ can be produced when the data signal $d_0-d_7$ is provided. For this purpose, the microprocessor V includes a latch circuit $RCH_1$ which is connected with eight output terminals of the 8085 CPU where the lower 8-bit address signal $a_0-a_7$ and an 8-bit data signal $d_0-d_7$ deviated in timing from the address signal will appear.

The 8085 CPU thus produces an ale signal in synchronism with the address signal $a_0-a_7$ which will appear at the first timing. This ale signal is coupled as a latch strobe to the latch circuit $RCH_1$ to latch the lower 8-bit address signal $a_0-a_7$.

The number of terminals of the 8085 CPU available for the delivery of signals to and from the same is quite limited. However, to simplify the construction of a facsimile communication system and promote more convenient operation thereof, a larger number of signal lines must be installed between the CPU and its associated input/outut device so as to enable the delivery of a larger number of signals to and from the CPU.

To meet this requirement, the illustrated embodiment additionally includes decoders $DCD_1-DCD_3$ for thereby increasing the number of available signal lines.

The decoder $DCD_1$ is supplied with the 14th bit to the 16th bit ($a_{13}-a_{15}$) of the upper address to increase the signal lines by eight; the decoder $DCD_2$ is supplied with the 5th bit to the 8th bit ($a_1-a_7$) of the lower address to increase the signal lines by sixteen; and the decoder $DCD_3$ is supplied with the 2nd bit to the 4th bit ($a_1-a_3$) of the lower address to increase the signal lines by eight. Since in this embodiment it is needless to use all of such signal lines, the decoder $DCD_1$ uses two of the eight lines and the decoder $DCD_2$ six of the sixteen signal lines.

The 8085 CPU produces an $\overline{rw}$ signal in an input mode wherein it takes in an address, data and like signals while, in an output mode, producing an $\overline{rd}$ signal. These signals are coupled through a gate G to the decoders $DCD_1$ and $DCD_2$. Also coupled from the 8085 CPU to the decoder $\overline{DCD_1}$ (NOT terminal) and decoder $DCD_2$ is an io$\sqrt{m}$ signal which determines which of memory data and data from the input/output device is to be coupled to the data bus.

Where it is the memory data that the data bus is to receive, the decoder $DCD_1$ will be selected and produce a signal $ms_4$ or $ms_0$ on a memory select signal line $MS_4$ or $MS_0$ corresponding to an address signal $a_{13}-a_{15}$ which will then be applied thereto. Where data of the input/output device is to be applied to the data bus, the decoder $DCD_2$ will be selected and produce one of signals $ios_0-ios_4$ and $ios_7$ on one of IO select lines $IOS_0-IOS_4$ and $IOS_7$ corresponding to an address signal $a_4-a_7$ applied at that time. Particularly, when the signal $ios_4$ is produced on the IO select line $IOS_4$, the decoder $DCD_3$ is additionally selected and a read strobe signal $rs_0-rs_2$ or a write strobe signal $ws_0-ws_4$ appears on the signal lines $RS_0-RS_2$ or signal lines $WS_0-WS_4$ depending on the address signal $a_1-a_3$ coupled thereto at that time.

Further connected with the 8085 CPU is a signal line INT adapted to accept interrupt signals $int_1-int_d$ as will be decribed hereinafter.

Having the above construction, the CPU V according to this embodiment is connected with eight upper address buses $A_8-A_{15}$, eight data buses $D_0-D_7$, one write strobe signal line WS, eight lower address buses $A_0-A_7$, two memory select signal lines $MS_4$ and $MS_0$, five IO select signal lines $IOS_7$ and $IOS_0-IOS_3$, three read strobe signal lines $RS_0-RS_2$, five write strobe signal lines $WS_0-WS_4$, and one interrupt request signal line INT. However, this is only one embodiment of the present invention and will naturally be modified if a different type of microprocessor is employed.

Of the various signal lines, the read strobe signal line $RS_0$ for example is connected with the data input section II already discussed in connection with FIG. 4(a) and write strobe signal lines $WS_0$ and $WS_2$ are connected with the data output section III of FIG. 5(a). The rest of the buses and signal lines will be connected with various portions described hereinafter.

Figure 8:
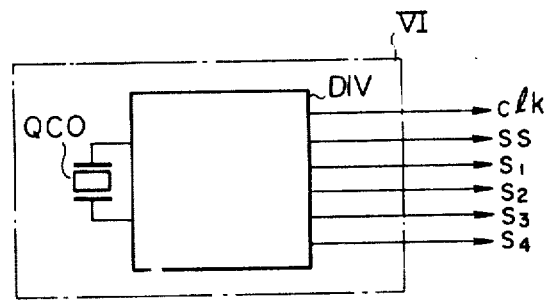
FIG. 8 shows a practical arrangement of a timing signal generating section VI in FIG. 2.

TIMING SIGNAL GENERATOR VI (See FIG. 8.)

The timing signal generator is shown in FIG. 8 and comprises a quartz oscillation circuit having a quartz vibrator QCO and a frequency division circuit DIV adapted to divide the frequency of clock pulses provided by the quartz oscillator. The timing signal generator produces clock pulses clk applied to the data input section II of FIG. 4(a), a line sync signal ss, timing signals $s_1-s_4$ as will be described, etc.

Figure 9:
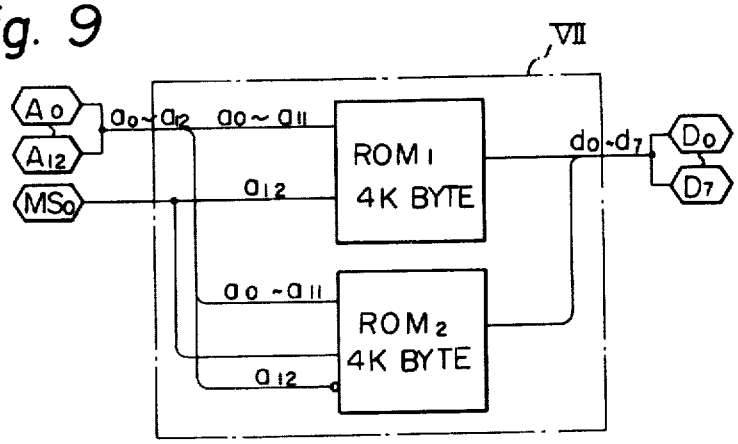
FIG. 9 shows a practical arrangement of a control program storage section VII in FIG. 2.

CONTROL PROGRAM STORAGE VII (see FIG. 9.)

The control program storage section VII comprises two 4K-byte read-only memories $ROM_1$ and $ROM_2$ as seen in FIG. 9 and serves to store procedures for causing various actions described and those to appear hereinafter and a code conversion table which will be discussed.

Connected to each of these read-only memories $ROM_1$ and $ROM_2$ are 13 address buses $A_0-A_{12}$, a memory select signal line $MS_0$ and data buses $D_0-D_7$.

When the CPU produces a memory select signal $ms_0$ on the signal line $MS_0$ as mentioned, delivery of memory data to the data buses is enabled. Then an address signal $a_{12}$ on the address bus $A_{12}$ selects the read-only memory $ROM_1$ or $ROM_2$ and 12 bits of address signal $a_0$-$a_{11}$ on the address buses produce on the data buses $D_0$-$D_7$ 8 bits of memory data $d_0$-$d_7$ stored in a selected address of the memory.

Figure 10:
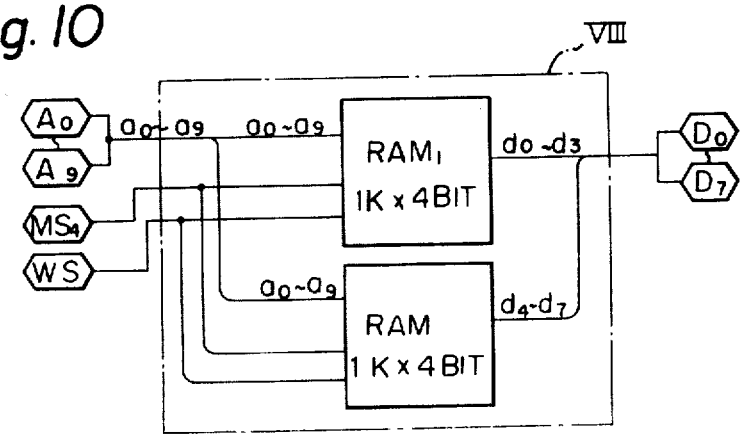
FIG. 10 shows a practical arrangement of a data storage section VIII in FIG. 2.

DATA STORAGE VIII (See FIG. 10.)

As shown in FIG. 10, this section VIII comprises two $1K \times 4$ bit random access memories $RAM_1$ and $RAM_2$ and functions to temporarily store data which will become necessary when the CPU executes a given program. These random access memories $RAM_1$ and $RAM_2$ are furnished with 10 address buses $A_0$-$A_9$, a memory select signal line $MS_4$, a write strobe signal line WS and data buses $D_0$-$D_7$. Of these eight data buses, the data buses $D_0$-$D_3$ are connected with the random access memory $RAM_1$ and the others $D_4$-$D_7$ with the random access memory $RAM_2$.

With this arrangement, a memory select signal $ms_4$ on the signal line $MS_4$ supplied by the CPU selects either one of the random access memories $RAM_1$ and $RAM_2$ while a write strobe signal ws on the signal line also supplied by the CPU conditions the selected random access memory for write-in or read-out operation. Simultaneously, 10 bits of address signal $a_0$-$a_9$ on the buses $A_0$-$A_9$ selects given addresses of the random access memories whereupon data $d_0$-$d_7$ on the buses $D_0$-$D_7$ are introduced each by 4 bits (4 bits at a time) in the selected addresses of the two random access memories or data are delivered therefrom each by 4 bits to the data buses $D_0$-$D_7$.

Figure 11A:
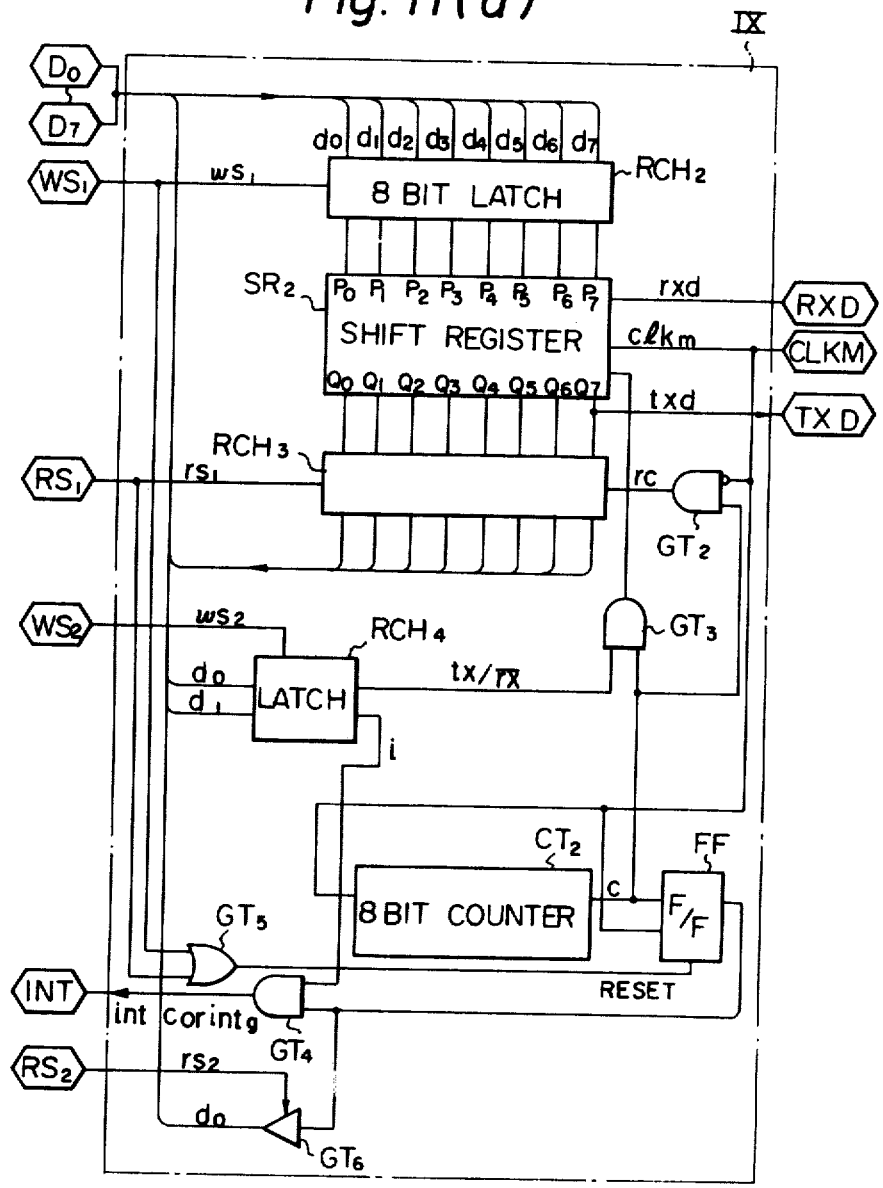
FIG. 11(a) shows a practical arrangement of communicated data input/output section IX in FIG. 2.

DATA INPUT/OUTPUT SECTION IX (See FIGS. 11(a) and 11(b).)

This section IX comprises latch circuits $RHC_2$-$RHC_4$, a shift register $SR_2$, an 8-bit counter $CT_2$, a flip-flop FF, and gates $GT_2$-$GT_6$. A function of this section is transmitting to the addressee's station parallel data each having 8 bits provided by the microcomputer $\mu$-COM during transmission or parallel data each with 8 bits also provided by the microcomputer during protocol by supplying the 8-bit parallel data serially to a modem. This section also functions, during reception, to convert serial data fed from the addressee's station into parallel data each having 8 bits before they reach the microcomputer $\mu$-COM.

The latch circuit $RCH_2$ has eight data buses $D_0$-$D_7$ and a write strobe signal line $WS_1$ and, when a write strobe $ws_1$ appears on the signal line $WS_1$ from the CPU, it latches data $d_0$-$d_7$ on the data buses $D_0$-$D_7$ and couples them to eight input terminals $P_0$-$P_7$ of the shift register $SR_2$.

Connected with the shift register $SR_2$ are a signal line RXD for accepting received data rxd from the modem, a signal line CLKM for receiving transfer clock pulses clkm also from the modem, and a signal line to which a parallel load signal pl from the gate $GT_3$ is applied. A parallel data output terminal $Q_7$ of the shift register $SR_2$ is connected with the modem by a signal line RXD for the delivery of transmission data txd thereto. When a parallel load signal pl is applied to the shift register $SR_2$ in the event of data transmission, data $d_0$-$d_7$ in the latch circuit $RCH_2$ are taken in the shift register at the leading edge of transfer clock pulses and said data are supplied serially from the $Q_7$ terminal to the modem in synchronism with transfer clock pulses.

The latch circuit $RCH_3$ is afforded by a latch circuit with a tri-state output and connected with a read strobe signal line $RS_1$, data buses $D_0$-$D_7$ and a a signal line through which a latch strobe rc will be supplied thereto from the gate $GT_2$. During data reception and when a latch strobe rc is supplied, the latch circuit $RCH_3$ takes in 8-bit data $d_0$-$d_7$ from the shift register $SR_2$ at the leading edge of the latch strobe. Then, in response to a read strobe $rs_1$, the latch circuit $RCH_3$ delivers the data $d_0$-$d_7$ to the data buses $D_0$-$D_7$.

The latch circuit $RCH_4$ in response to a write strobe $ws_2$ sets signals $d_0$ and $d_1$ then appearing on the data buses $D_0$ and $D_1$ and supplies them to the individual gate $GT_3$ and $GT_4$.

The counter $CT_2$ couples a carry signal c to the gates $GT_2$ and $GT_3$ and flip-flop FF every time it counts eight transfer clock pulses clkm. After the delivery of the carry c, the flip-flop FF is set by the leading edge of the next transfer clock pulse clkm and produces a signal r so as to provide an interrupt request signal $int_c$ or $int_g$ as will be described. The gate $GT_4$ supplies the CPU with the interrupt request signal $int_c$ or $int_g$ in response to the signal r while the latch circuit $TCH_4$ is delivering an interrupt enable signal i.

The CPU receives interrupt request signals from other input/output devices through the single signal line INT. The gate $GT_6$ is provided to distinguish the interrupt request from the input/output section IX from those of the other input/output devices. More specifically, the CPU periodically produces a read strobe $rs_2$ to take in the signal r through the data bus $D_0$ and thereby determine that interrupt request appearing at that time is from the input/output section IX. Therefore, this gate $GT_6$ will be needless if individual signal lines are allocated to individual interrupt requests.

Operation of the input/output section IX will be described with reference to FIGS. 11(b) and 11(c) which individually represent a transmission mode and a reception mode.

In a transmission mode, signals $d_0$ and $d_1$ produced from the CPU on the data buses $D_0$ and $D_1$ as shown in FIG. 11(b) are latched by the latch circuit $RCH_4$ in response to a write strobe $ws_2$. The latch circuit $RCH_4$ then produces a transmission mode signal $tx\lor rx$ = logical "1" and an interrupt enable signal i = logical "1".

The counter $CT_2$ counts eight transfer clock pulses clkm and, when the count reaches "7", produces a carry c.

The flip-flop FF receiving the carry c is set at the leading edge of the next transfer clock pulse clkm to supply a signal r to the AND gate $GT_4$. Then, the gate $GT_4$ passes an interrupt request signal $int_c$ to the CPU. The carry c from the counter is also coupled through the gate $GT_3$ to the shift register $SR_2$ as a parallel load signal pl.

The parallel load signal pl causes the shift register $SR_2$ to take data $d_0$-$d_7$ from the latch circuit $RHC_2$ at the leading edge of the next transfer clock pulse clkm. The data $d_0$-$d_7$ are shifted by the transfer clock pulses clkm and delivered serially bit by bit from the $Q_7$ terminal to the modem.

In response to the interrupt request $int_c$, the CPU supplies the next 8-bit data $d_0$-$d_7$ to the data buses $D_0$-$D_7$ while coupling a write strobe $ws_1$ to the signal line $WS_1$.

Consequently, the latch circuit $RCH_2$ latches the data $d_0$-$d_7$ at the leading edge of the write strobe $ws_1$. At the same time, the flip-flop FF is reset.

Upon arrival of the 8th transfer clock pulse clkm, all of the data $d_0$-$d_7$ are transferred to the modem. The counter $CT_2$ delivers another carry c so that a parallel load signal pl appears to shift the data in the latch circuit RCH$_2$ to the shift register SR$_2$ which then delivers them to the modem bit by bit in the manner described.

Thus, the data input/output section IX transforms 8-bit parallel data output of the CPU into serial data and supplies the serial data continuously to the modem.

The CPU needs only to produce 8-bit data on the data buses D$_0$-D$_7$ together with a write strobe ws$_1$ during the period from the instant it accepts an interrupt request signal int$_c$ to the instant the counter CT$_2$ provides the next carry c. Meanwhile, the latch circuit RCH$_2$ can be omitted if the processing rate of the CPU is so high that it is capable of producing data d$_0$-d$_7$ and write srobe ws$_1$ within one bit of transfer clock pulse clkm after the receeption of an interrupt request signal int$_c$. It will thus be seen that the illustrated arrangement is effective where the transfer clock pulses clkm appear at a very high rate or where the processing rate of the CPU is very low.

In a data reception mode, the latch circuit RCH$_4$ produces a reception mode signal tx$\sqrt{}$rm = logical "0" and an interrupt enable signal i = logical "1" in response to signals d$_0$ and d$_1$ and write strobe ws$_2$ coming out of the CPU.

Figure 11C:
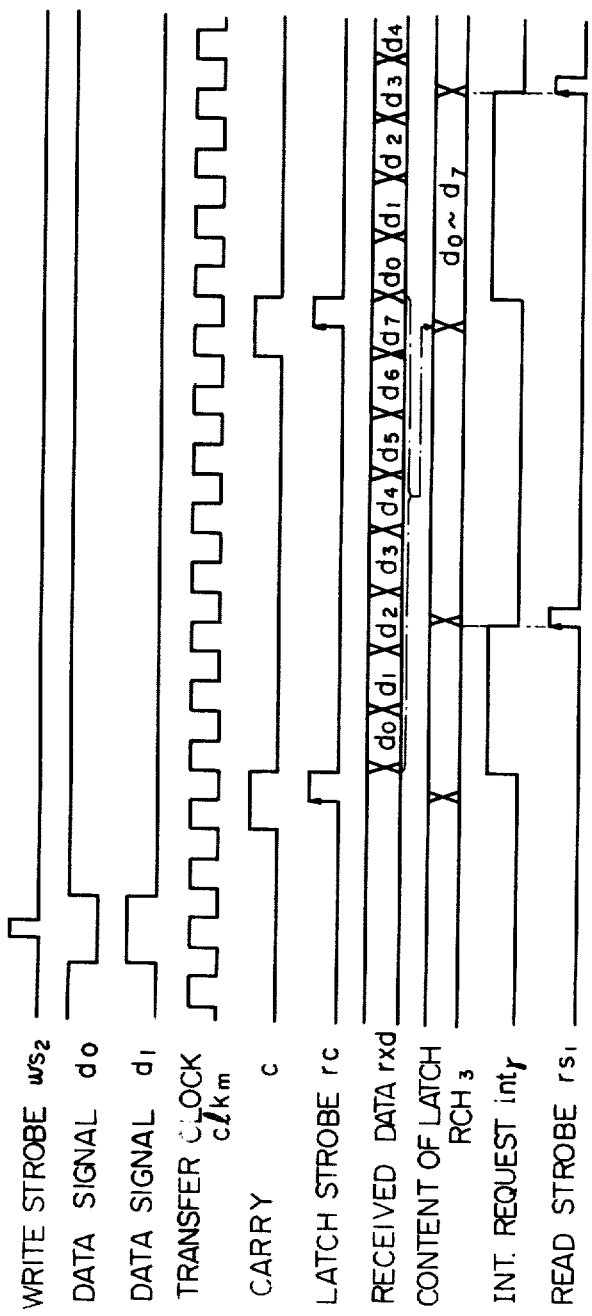
FIG. 11(c) is a timing chart explaining operation of the input/output unit in a data reception mode.

As in the data transmission mode, the counter CT$_2$ counts eight transfer clock pulses clkm and, when its count reaches "7", produces a carry c as shown in FIG. 11(c).

This carry c is coupled to the gate GT$_2$ and flip-flop FF.

Accordingly, the gate GT$_2$ provides a latch strobe rc at the illustrated timing. At the leading edge of the latch strobe, data then shifted in the shift register SR$_2$ is latched in the latch circuit RCH$_3$.

Synchronized with the transfer clock pulses clkm, the modem constantly supplies the shift register SR$_2$ bit by bit in a continuous manner.

Therefore, after the data in the shift register SR$_2$ have been latched in the latch circuit RCH$_3$, the next data d$_0$-d$_7$ are sequentially shifted in the shift register SR$_2$ in synchronism with the transfer clock pulses clkm.

After the data d$_7$ has been shifted in the shift register SR$_2$, the counter CT$_2$ produces a carry c at the timing when data d$_0$-d$_7$ appear at the output terminals Q$_0$-Q$_7$. When the gate GT$_2$ delivers a latch strobe rc to thereby latch said data d$_0$-d$_7$ in the latch circuit RCH$_3$. At this time, the flip-flop FF is set to couple an interrupt request signal int$_g$ to the CPU.

Receiving this signal int$_g$, the CPU again produces a read strobe rs$_1$ so as to take in the data d$_0$-d$_7$ from the latch circuit RCH$_3$.

In this way, the input/output section IX functions to convert serial data coupled thereto from the modem and supply them to the CPU.

With the write strobe ws$_1$ in the transmission mode, the read strobe rs$_1$ may appear at any timing if within the period before the next latch strobe rc is produced.

While the input/output section IX has been shown and described as including two latch circuits RH$_2$ and RH$_3$, these latch circuits are not always necessary.

In an alternative design of the CPU, the data buses D$_0$-D$_7$ are directly connected with the terminals P$_0$-P$_7$ of the shift register SR$_2$ and terminals Q$_0$-Q$_7$ of the same. In a trasmission mode, the CPU delivers data d$_0$-d$_7$ and write strobe ws$_1$ within one bit of transfer clock pulse clkm after the reception of an interrupt request signal int$_c$. In a reception mode, the CPU produces a read strobe within one bit of transfer clock pulse clkm after the reception of an interrupt request signal int$_g$ and thereby takes in the data d$_0$-d$_7$.

With this alternative CPU design, data d$_0$-d$_7$ can be delivered directly from the CPU to the shift register and vice versa without the intermediary of the latch circuits RH$_2$ and RH$_3$. Then, as in the aforementioned case, coded 8-bit parallel data from the CPU will be converted into serial data by the shift register SR$_2$ and delivered therefrom to the modem bit by bit while coded serial data supplied from the modem bit by bit will be converted by the shift register SR$_2$ into 8-bit parallel data and introduced in the CPU.

Furthermore, the latch circuit RCH$_3$ is needless if the processing rate of the CPU is so high that it can produce a read strobe rs$_1$ within one bit of transfer clock pulse after receiving an interrupt request signal int$_g$. It may therefore be concluded that the illustrated arrangement is effected when the transfer clock pulses appear at quite a high rate or where the processing rate of the CPU is very low.

Figure 12:
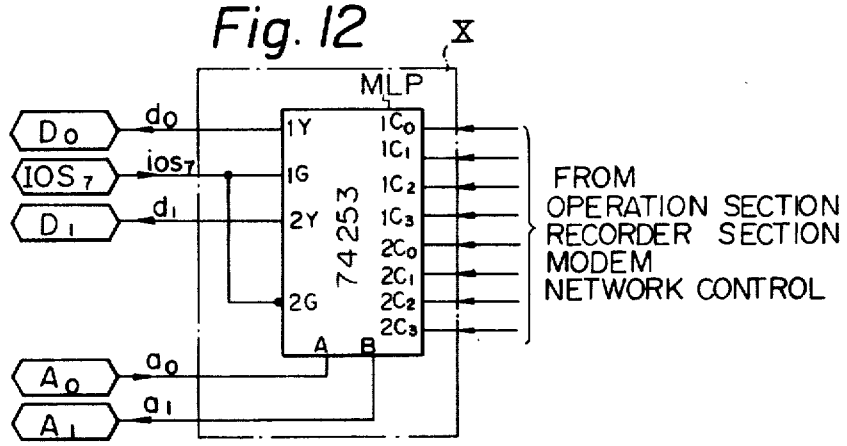
FIG. 12 shows a practical arrangement of a control signal input section X in FIG. 2.

CONTROL SIGNAL INPUT SECTION X (See FIG. 12.)

Comprising a multiplexer, the control signal input section X is adapted to feed to the CPU therethrough various detection signals and status signals supplied from the scanner section I, recorder section IV, modem MDM, network control section NCU, operation display section IOP and like input/output units. This section X is connected with the CPU by data buses D$_0$ and D$_1$, address buses A$_0$ and A$_1$ and signal line IOS$_7$.

The CPU periodically supplies the multiplexer with an input/output select signal ios$_7$ and address signals a$_0$ and a$_1$ while the multiplexer couples to the data bus D$_0$ or D$_1$ a signal appearing at its input terminal selected by the signals ios$_7$ and a$_0$ and a$_1$.

Figure 13:
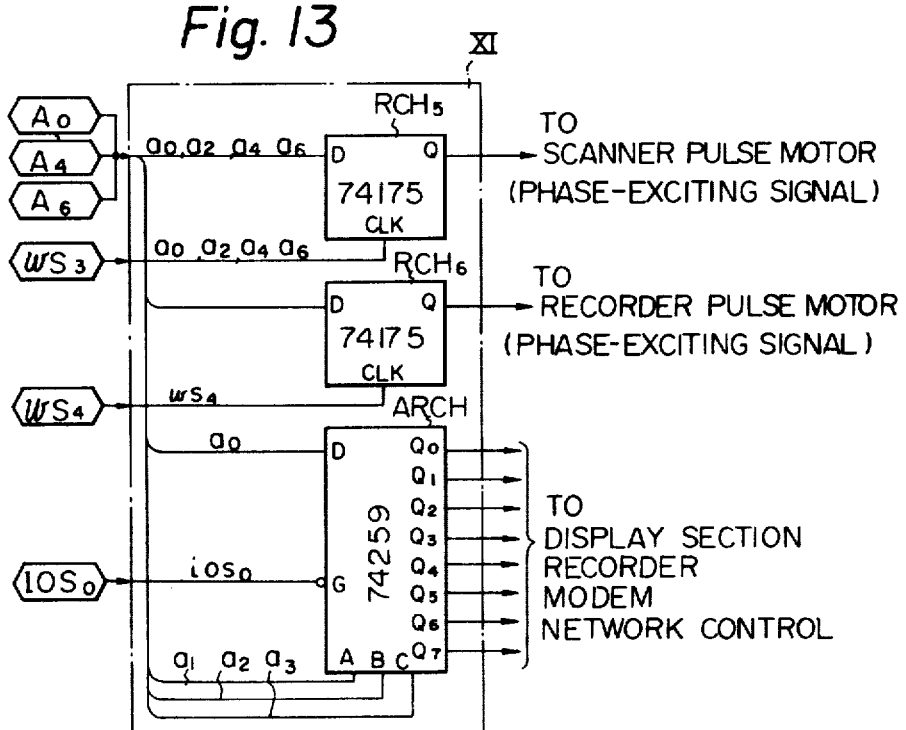
FIG. 13 shows a practical arrangement of a control signal output section XI in FIG. 2.
Figure 4:
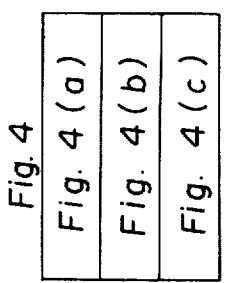

CONTROL SIGNAL OUTPUT SECTION XI (See FIG. 13.)

This section XI consists of latch circuits RCH$_5$ and RCH$_6$ for supplying the pulse motor of the scanner I and that of the recorder IV with phase exciting signals, and an addressable latch circuit ARCH for delivering operation signals, display signals and others to the scanner I, recorder IV, modem MDM, network control NCU, operation display IOP etc. Address buses A$_0$-A$_4$ and A$_6$ and signal lines WS$_3$ and WS$_4$ and IOS$_0$ connect this section XI to the CPU.

When supplied with a write strobe ws$_3$ from the CPU, the latch circuit RCH$_5$ latches signals a$_0$, a$_2$, a$_4$ and a$_6$ on the address buses and supplies them to the scanner section I to thereby phase-excite the associated pulse motor. In response to a write strobe ws$_4$ from the CPU, the latch circuit RCH$_6$ latches signals a$_0$, a$_2$, a$_4$ and a$_6$ then appearing on the address buses and phase-excites the pulse motor associated with the recorder section IV therewith.

When the CPU delivers an input/output select signal ios$_0$, the addressable latch circuit ARCH latches the signal a$_0$ on the address bus A$_0$ and couples the latched signal to a selected input/output unit from its output terminal which is selected on the bases of the signals a$_1$-a$_3$ on the address buses.

A facsimile communication system according to the present invention is constructed as outlined hereinabove. The CPU in a data transmission mode performs the processing represented by a flow chart in FIG. 14 and, in a data reception mode, the processing indicated by a flow chart in FIG. 15.

Details of the operations will be described in connection with the transmission and reception modes.

TRANSMISSION MODE

Figure 14A:
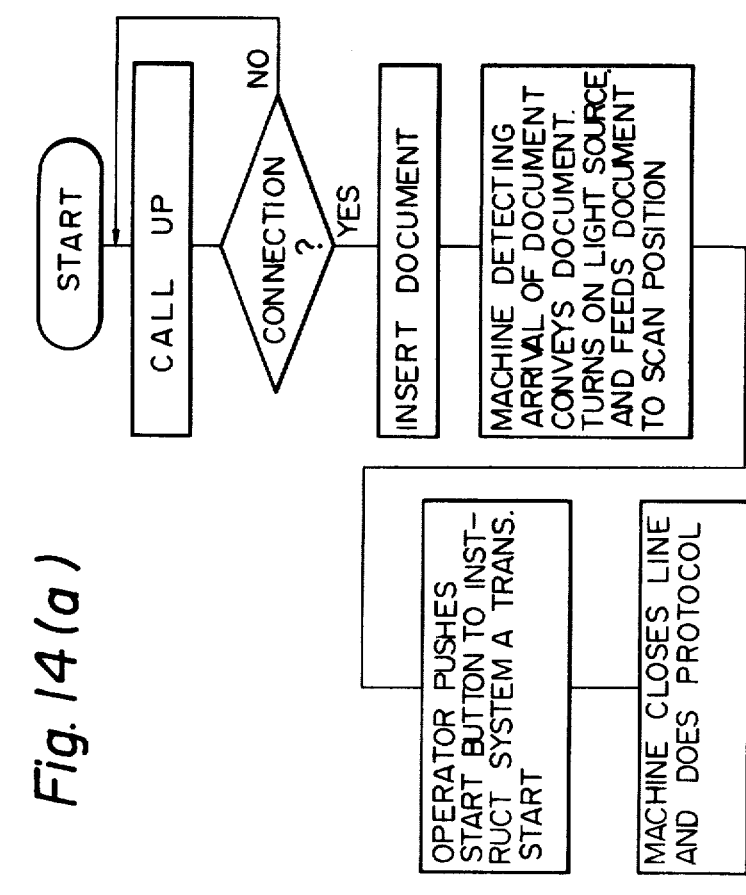
FIG. 14, including A–C, is a flow chart demonstrating the general operation of a facsimile system of the present invention in a transmission mode.
Figure 14B:
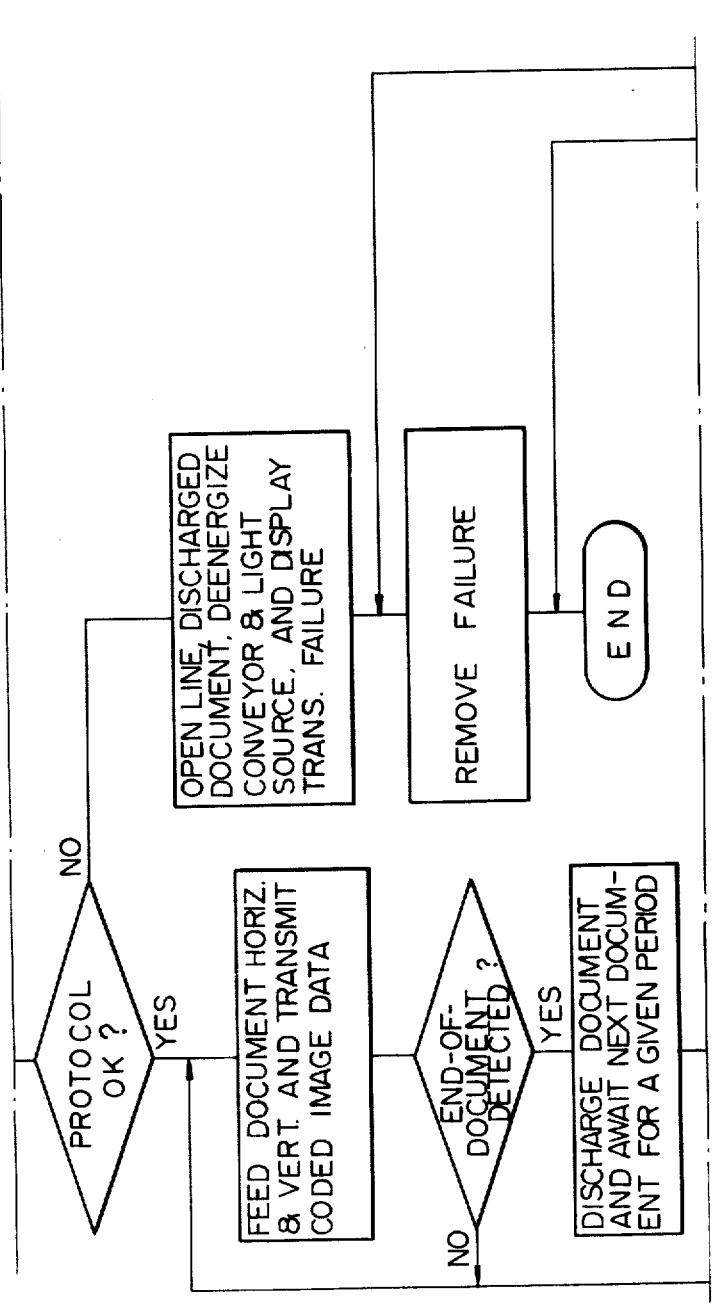
Figure 14C:
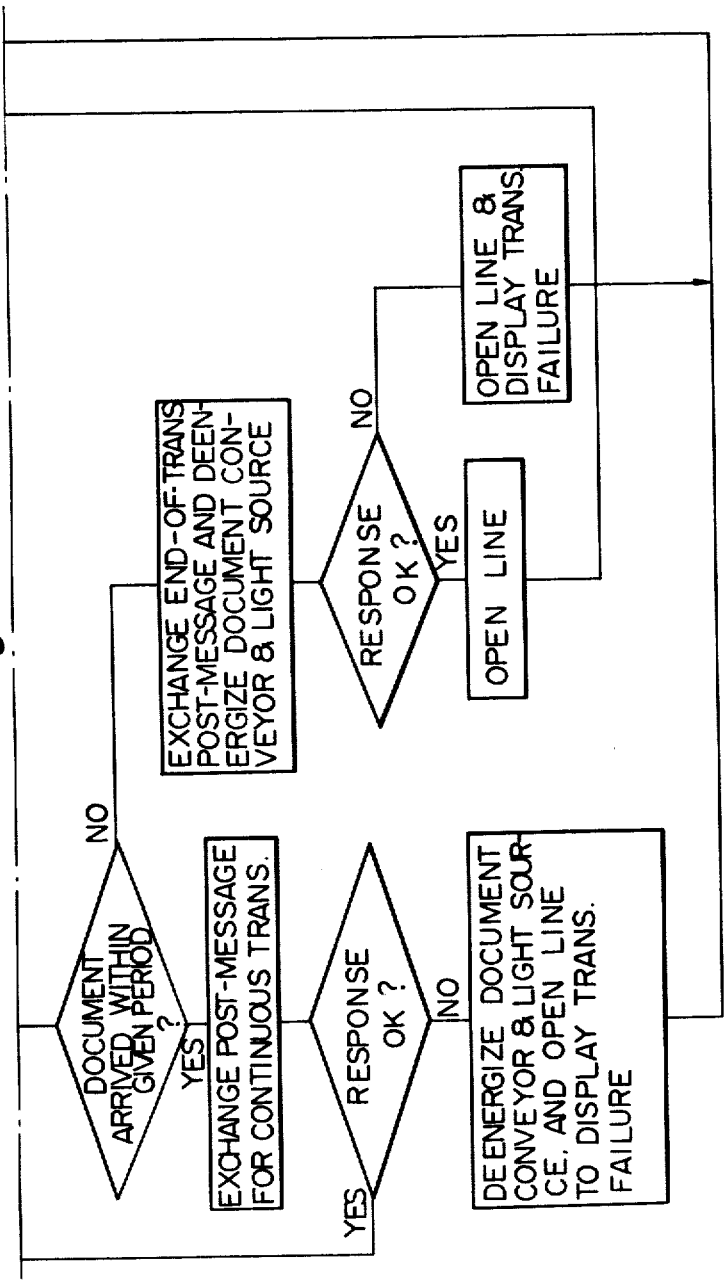

In practicing the process shown in FIG. 14, the CPU needs to proportion time for operations or duties A-E which will be described and, thus, it carries out duties A-E on a time division basis in accordance with various interrupt request signals.

Applied to the CPU through the signal line INT are an interrupt request signal $int_a$ based on a sync signal $s_1$ and supplied from the timing signal generator VI, an interrupt request signal $int_b$ based on a sync signal $s_2$ and an interrupt request signal $int_d$ based on a sync signal $s_3$ in addition to an interrupt request signal $int_c$ from the input/output section IX. The duties A-D performed by the CPU in accordance with the interrupt request signals $int_a$–$int_d$ have the order of priority expressed as $A>B>C>D$. Usually the CPU performs the duty E.

The duties A-E which the CPU carries out will be briefly described with reference to FIG. 16.

DUTY A

The CPU carries out duty A in response to the interrupt request signal $int_a$.

When in Duty A, the CPU resets a memory empty flag $MEF_I$ or $MEF_{II}$ if it is set in a working area (WK area) of the random access memory RAM of the data storage VIII; the memory empty flags $MEF_I$ and $MEF_{II}$ would indicate that line buffer areas (RBF areas) I and II of the random access memory for storing image data are empty, respectively. Simultaneously, the CPU sets a data write or reception flag $DRF_I$ or $DRF_{II}$. Further, if the memory empty flag $MEF_I$ of $MEF_{II}$ is reset, the CPU will reset the data reception flag $DRF_I$ or $DRF_{II}$.

DUTY B

When supplied with the interrupt request signal $int_b$, the CPU accepts it only when the data reception flag $DRF_I$ or $DRF_{II}$ is set and then performs duty B for advancing the vertical scan pulse motor one step.

However, the timing at which the CPU performs duty B somewhat differs from one vertical scan line density to another. Where the density of vertical scan lines is 7.7 line/mm, the CPU will accept every second interrupt request signals $int_b$ to carry out 8-step vertical scan for one line. In the case of a scan line density of 3.85 line/mm, the CPU will accept every interrupt request signal $int_b$ while the flag DRF is being set and thereby perform 16-step vertical scan for one line.

Details of the duty B will be explained later.

Next, duties D and E will be discussed before discussing duty C.

DUTY D

The CPU carries out duty D in response to the interrupt request signal $int_d$.

Figure 16:
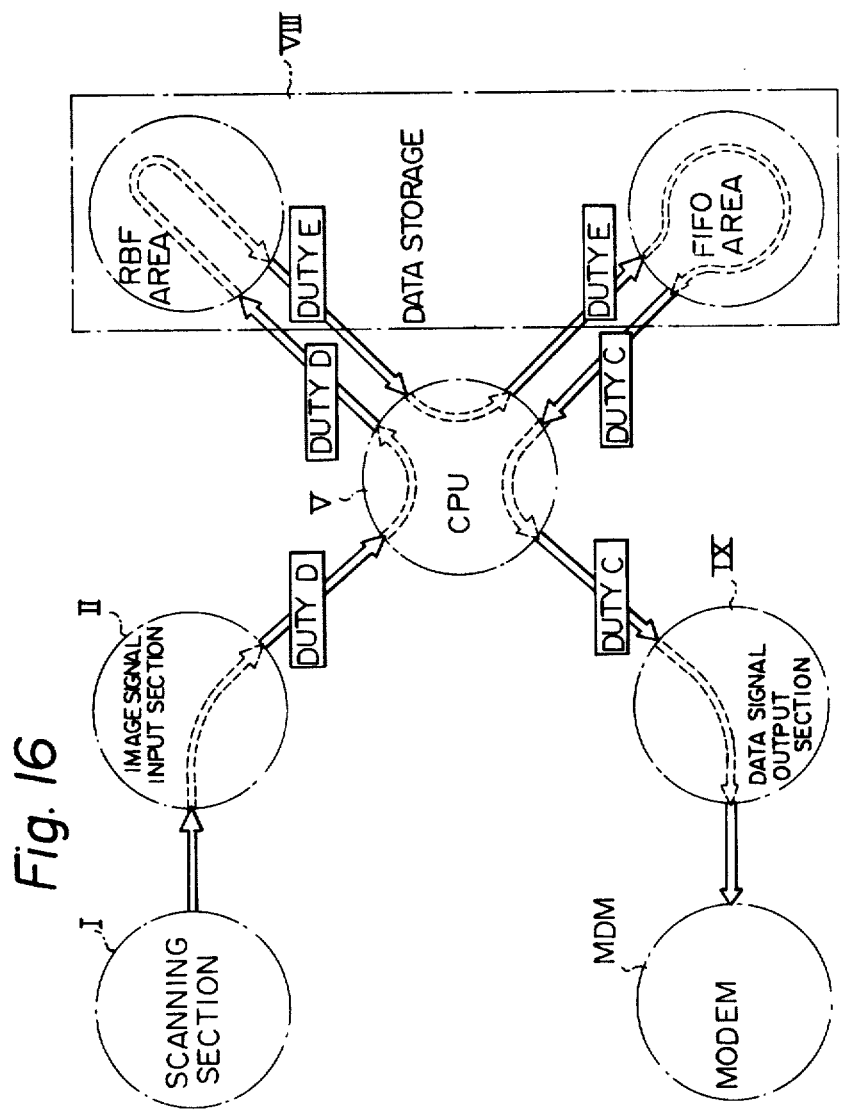
FIG. 16 indicates paths for image data flow in a transmission mode of a facsimile system according to the present invention.

The duty D is, as shown in FIG. 16, to store image data read out by the scanner I in the line buffer area (RBF area) I or II of the RAM of the data storage VIII by way of the CPU on an 8-bit basis when the data reception flag $DRF_I$ or $DRF_{II}$ is set. The above description of duty D is concerned with the vertical scan line density of 7.7 line/mm. In the case of the scan line density of 3.85 line/mm, the CPU also accepts interrupt request signals $int_d'$; one line of data will be taken in with the signals $int_d$ and then another line of data will be taken in with the signals $int_d'$ whereupon the second line of data will be logically processed together with the first line of data with the data thus stored in the line buffer area (RBF area) I or II.

After complete reception of the data, the CPU sets a memory full flag $MFF_I$ or $MFF_{II}$.

DUTY E

Duty E is usually performed by the CPU in which, if the memory full flag $MFF_I$ or $MFF_{II}$ is set, it is reset and the data stored in the line buffer area by duty D are introduced in the CPU on an 8-bit basis as viewed in FIG. 16. These data are coded by the CPU and stored in an area FIFO of the data storage VIII as will be described. When coding of one line of data is completed, the CPU sets the memory empty flag $MEF_I$ or $MEF_{II}$.

DUTY C

The CPU performs duty C when accepting an interrupt request presented by the signal $int_c$.

The duty C is to supply the data input/output section IX with coded data stored in the FIFO area sequentially by eight bits.

Figure 17:
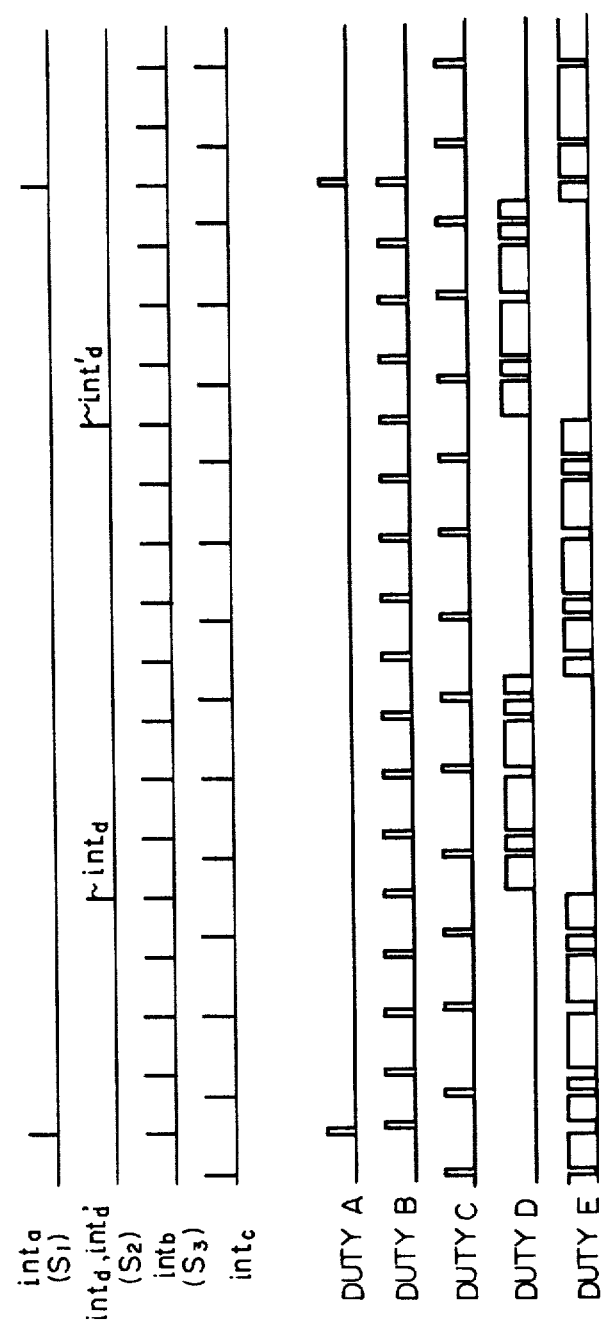
FIG. 17, including A-E, is a timing chart representing duties A-E which the microprocessor unit section V of FIG. 7 performs during transmission mode of operation.

FIG. 17 is a timing chart showing an exemplary relationship between the duties A-E with the vertical scan line density supposed to be 3.85 line/mm. Assume that the CPU has received interrupt request signals $int_a$ and $int_b$ based on sync signals $s_1$ and $s_3$ while carrying out duty E for taking in and coding data from the line buffer area (RBF area) by eight bits. Then the CPU sets or resets the data reception flag $DRF_I$ or $DRF_{II}$, performs duty A, and then advances the vertical scan pulse motor one step, in duty B, whereafter it resumes duty E. In the meantime, the data input/output section IX delivers coded data serially to the modem and an interrupt request signal $int_c$ appears every time 8 bits of data arrive at the modem as mentioned.

When applied with the interrupt request signal $int_c$, the CPU interrupts the duty E and carries out duty C for setting the coded 8-bit data in the FIFO area into the data input/output section IX whereupon it resumes duty E.

Accepting an interrupt request signal $int_d$ based on the sync signal $s_2$, the CPU performs duty D wherein image data read out by the scanner I are stored in the line buffer area (RBF area) by each 8 bits; duty E is interrupted until one line of image data is fully stored in the line buffer area (RBF).

Naturally, duty C continues even in the above period to deliver coded data to the data input/output section IX so that the modem MDM is supplied with data without intermission.

The capacity of the FIFO area depends on the coding speed, the scanner speed and modem rate and has a number of bits large enough to ensure a minimum time period for continuously delivering data to the modem. In this embodiment, the capacity of the FIFO area is determined to be 256 bits with some margin taken into account.

Upon completion of the duty D, which is temporary, the CPU resumes duty E. When an interrupt request signal $int_d'$ based on a sync signal $s_2$ arrives at the CPU, the CPU performs duty D in which, when storing image data provided by the scanner I in the line buffer area (RBF area), it simultaneously reads out the image data previously stored and stores their logical sum in the line buffer area (RBF area).

Reference will now be made to FIG. 18 and onward for describing the various duties in greater detail.

Figures 18A, 18B, 18C:
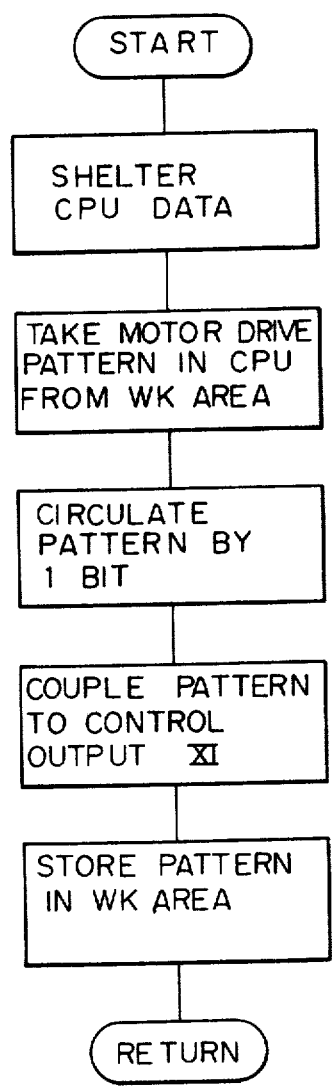
FIG. 18(a) is a flow chart of duty B which the section V carries out to advance a vertical scan pulse motor of the scanner section I one step.
FIG. 18(b) shows a pattern for phase-exciting the pulse motor relevant with duty B.
FIG. 18(c) indicates phase-exciting signals actually coupled to the pulse motor.

FIG. 18(a) shows the procedures for the duty B which advances the vertical scan pulse motor of the scanner I one step.

This duty B occurs on the basis of a sync signal s₂, which appears at a predetermined frequency, when data delivery into the line buffer area (RBF area) is enabled as already discussed.

The CPU accepting an interrupt request signal int$_b$ interrupts the duty D or E and shifts the data present in the respective counters, registers and the like of the CPU to a working area (WK area) of the RAM.

Then a pulse motor exciting pattern is brought from the working area (WK area) into the CPU and set therein.

In the illustrated embodiment, a 1-2 phase exiciting system is employed for the pulse motor. As mentioned in relation with the control signal output section XI in FIG. 13, address signals a₀, a₂, a₄ and a₆ serve as signals for the phase excitation of the pulse motor.

Thus, such a pulse motor phase exciting pattern as "11100000" is set in the working area (WK area) of the RAM at the time of start of the system. Every time the duty B is performed, the pattern is introduced in the CPU and, after one bit of circulation, it is fed to the control signal output section XI via address buses A₀, A₂, A₄ and A₆ while being returned to the working area (WK area) again.

As a result, the pulse motor phase exciting pattern circulates bit by bit every time the duty B is performed as viewed in FIG. 18(b) and its output a₀, a₂, a₄ and a₆ varies as indicated in FIG. 18(c), thereby driving the pulse motor step by step.

Completing the duty B, the CPU resumes the duty which it had been previously performing.

Figure 19A:
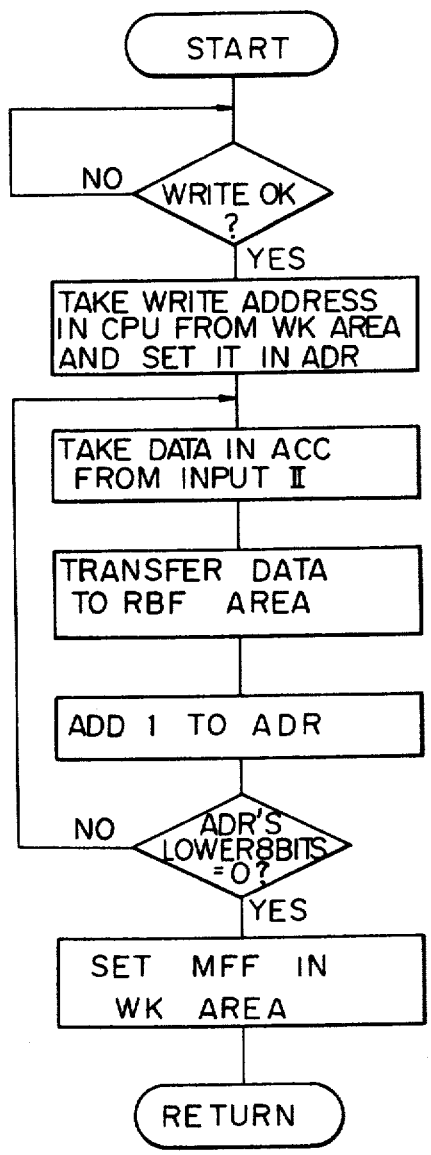
FIG. 19(a) is a flow chart of a procedure included in duty D the microprocessor section V performs and for transferring image data read at the scanner section I from the image data input section II to the data storage section VIII.
Figure 19B:
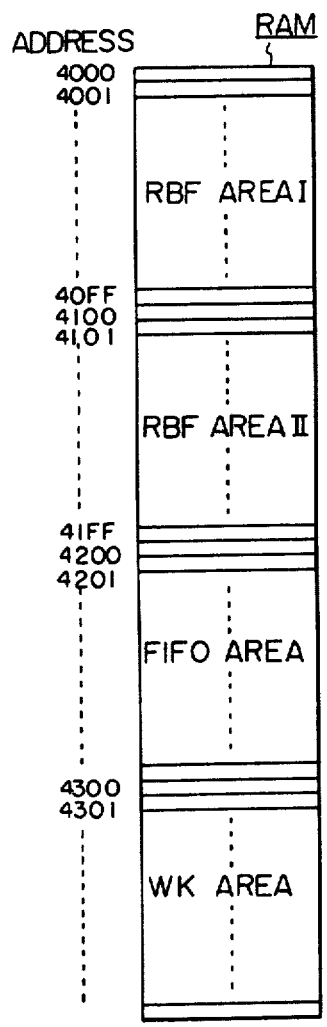
FIG. 19(b) shows a RAM arrangement explaining various areas of a RAM of the storage section VIII whose interior is divided in accordance with the kinds of data to be stored therein.

FIG. 19(a) indicates a flow for transferring image data read out by the scanner I from the image input section II to the line buffer area (RBF area) of the data storage VIII. This flow chart is void of the 2-line OR processing which has been described.

It will be noted that, since the illustrated embodiment is designed to handle sheets of B4 format, picture element data are assumed to have 2048 bits on one line though this is not restrictive in any way.

2048 bits is 8 bit/byte and, therefore, it may be expressed as 256 bytes.

The line buffer area (RBF area) occupies addresses "16384" to "16896" of the two 1 K×4 bit random access memories RAM, that is, a 1 K×8 bit random access memory, shown in FIG. 10. Employing hexadecimal codes, the line buffer or RBF area I occupies address 4000 to address 40FF while the RBF area II occupies addresses 4100-41FF.

Also, addresses 4200-42FF of the random access memory RAM are alloted to the FIFO area and addresses 4300-43FF to the working or WK area.

The WK area is adapted to store various flags, addresses for writing and reading operations, etc. Let it be supposed in the following description on the flow chart that such various initial settings in the WK area have already been made and stored in said area.

The CPU starts the program shown in FIG. 19(a) by checking the flags stored in the WK area to determine whether data can be introduced in the RBF area I or II. If any one of the two RBF areas is empty and ready to receive data, an address stored in the WK area where data should be written in the RBF area is set in the address register ADR of the CPU.

Then data each having 8 bits are applied from the CPU to that address of the RBF area through the image data input section II thereby adding "1" to the address register ADR. Repeating this action 256 times for one line makes the lower 8 bits of the 16-bit address register "0". This means that the RBF area has stored one full line of image data and, thus, a memory full flag MFF indicating full state of the RBF area is set in the WK area.

Figure 20A:
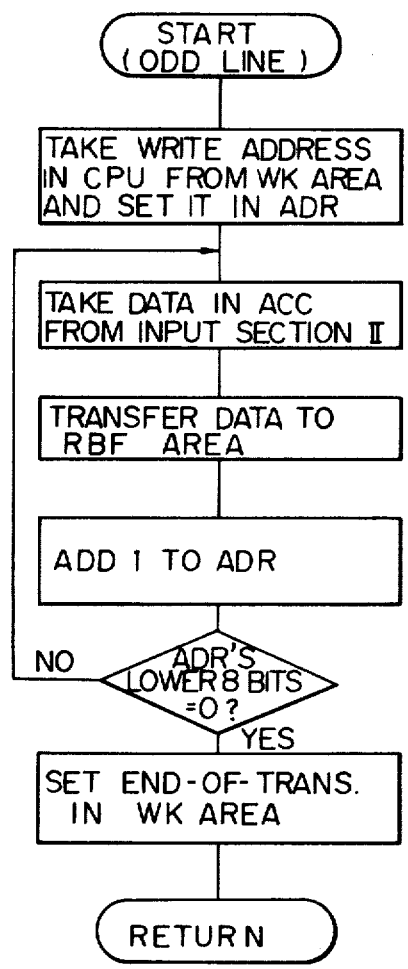
FIGS. 20(a) and 20(b) are flow charts showing a part of the duty D in which image data are subjected to preliminary processing and transferred to the storage section VIII.
Figure 20B:
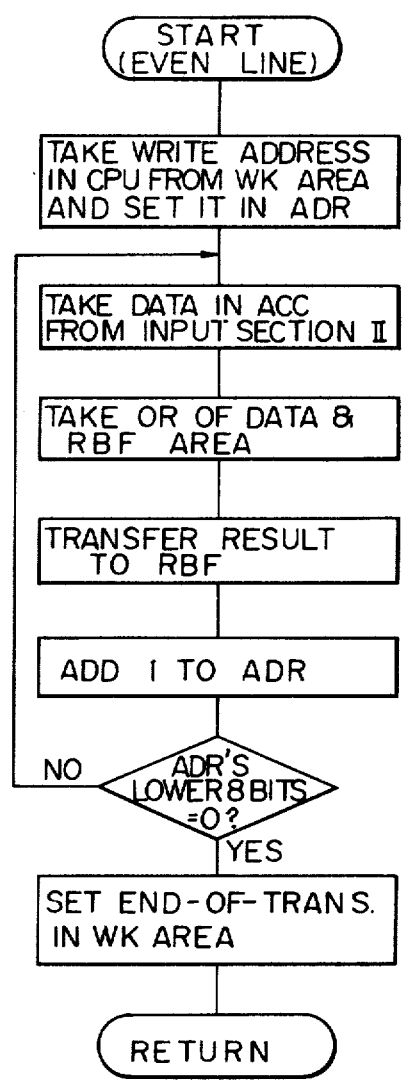

In case the density of vertical scan lines is 7.7 line/mm, one line of image data is stored in the preselected RBF area as discussed above.

Where the vertical scan line density is 3.85 line/mm, programs shown in FIGS. 20(a) and 20(b) will be employed to produce the logical sum of two lines of image data and store it in a predetermined RBF area as one line of image data.

The flow chart shown in FIG. 20(a) is concerned with image data on lines of odd numbers. As shown, image data on an odd number line are stored in the RBF area I for example in exactly the same way as the case of FIG. 19(a).

Concerning image data on a line having an even number, image data of an odd number line previously stored in the RBF area I are produced by 8 bits each and processed together with the data on the even number and their logical sum is again introduced in the RBF area I as indicated in FIG. 20(b). In this way, one line of OR-processed image data is stored in the RBF area I.

Referring to FIGS. 21-25, there will be described a flow of the duty E which takes image data out of the RBF area, processes them into run-length codes and stores them in the FIFO area.

Though any known coding system is applicable to the present invention, the illustrated embodiment uses the modified Huffman coding method for run-length coding.

Termination codes are the codes corresponding to run-lengths 0-63 as indicated in Table 1 shown below. Makeup codes are the codes corresponding to integral multiples of 64 as shown in Table 2. Furthermore, a sync code EOL is the code having a train of 11 "0"s and "1" following the last "0".

TABLE 1

|  | PL (= T) | WHITE code | BLACK code |
|---|---|---|---|
|  | 0 | 00110101 | 0000110111 |
|  | 1 | 000111 | 010 |
|  | 2 | 0111 | 11 |
|  | 3 | 1000 | 10 |
| Termination | 4 | 1011 | 011 |
| Code | 5 | 1100 | 0011 |
|  | . | . | . |
|  | . | . | . |
|  | . | . | . |
|  | 63 | 0010100 | 000001100111 |

TABLE 2

|  | PL (= 64 × M) | WHITE code | BLACK code |
|---|---|---|---|
|  | 64 (= 64 × 1) | 11011 | 0000001111 |
|  | 128 (= 64 × 2) | 10010 | 000011001000 |
|  | 192 (= 64 × 3) | 010111 | 000011001001 |
| Makeup | . | . | . |
| Code | . | . | . |
|  | 1728 (= 64 × 27) | 010011011 | 0000001100101 |

TABLE 2-continued

| PL (= 64 × M) | WHITE code | BLACK code |
|---|---|---|
| 2048 (= 64 × 32) | 000000010011 | 000000010011 |

TABLE 3

| Sync Code | EOL | 000000000001 | (one line starting with WHITE code) |
|---|---|---|---|

As will be seen from the above tables, each run-length code appears as a WHITE code representing "white" or a BLACK code representing "black".

Now, supposing that run-lengths 0–63 for preparing a termination code is T and run-lengths for preparing a makeup code is 64×M (M=0, 1, 2, 3 . . . ), all the run-lengths can be expressed as RL=(64×M)+T.

Then, data can be run-length coded line by line by sequentially picking up T and M from each line of data, producing selected coded data from a table stored in the ROM on the basis of the T and M, and successively storing them in the FIFO area.

In the table in the ROM, a data block for picking up one coded data consists of 3 bytes. The first byte of the table stores code lengths using four bits while the second and third bytes store run-length coded data.

More specifically, codes lengths are different from one another as will be understood from the tables. Hence, the design is such that, when a certain run-length code is to be obtained from the table according to given T and M, code lengths in the first byte serve the identification of an effective part of the second and third bytes.

Obviously, the above-mentioned arrangement of the table is merely illustrative. As the tables show, even run-length codes having more than 8 bits have their 9th bit and onward occupied by "0". Therefore, one data block may consist of two bytes to store coded data in the first byte and run-length codes in the second byte. This alternative arrangement also permits a given run-length code to be picked up according to speicific T and M.

It has generally been agreed to, when coding data line by line, produce a WHITE code necessarily after a sync code. In other words, a reference color at the head of one line should be "white". Therefore, where coding starts with a "black" picture element, a WHITE code of zero run-length will be transmitted first.

Figure 21B:
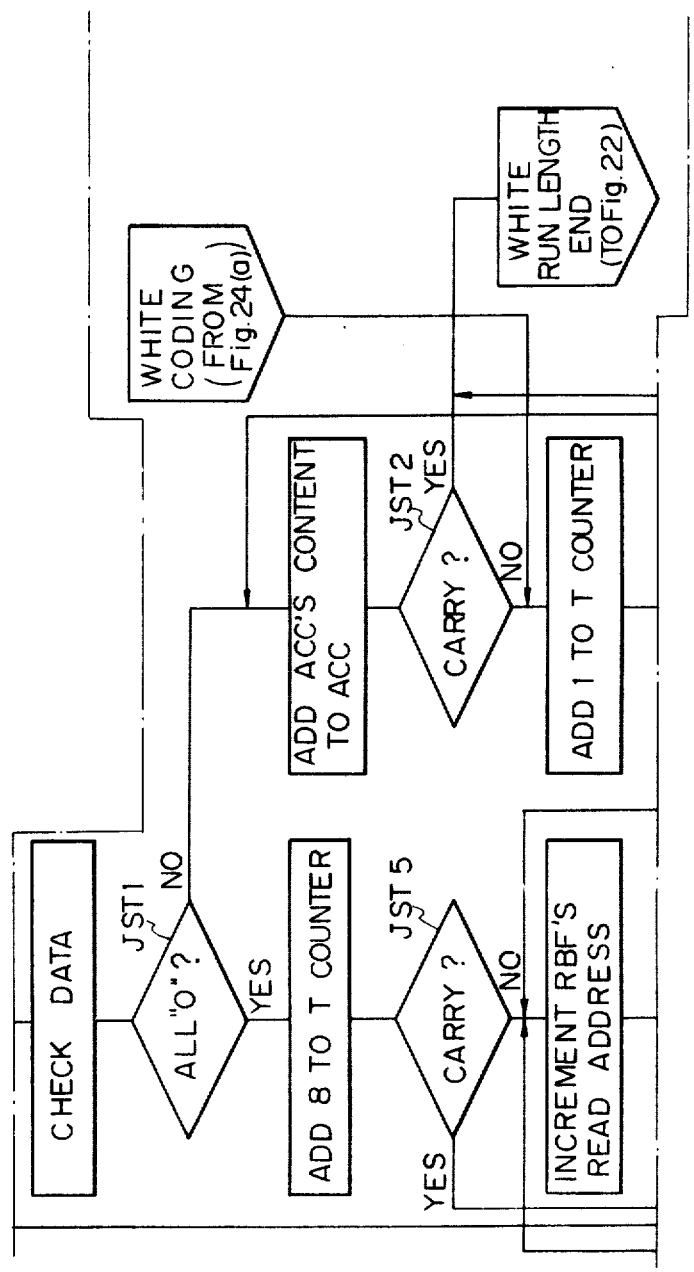
FIG. 21, including A-B, is a flow chart showing a portion of the duty E in which image data are read out of the RBF area of the RAM to obtain a "white" run-length.

Of the duty E which the CPU usually performs, a part for taking image data out of the RBF area of the RAM and obtaining the run-lengths is indicated by the flow chart of FIG. 21.

Since this duty E is carried out on a time division basis as mentioned, it will be preceded by a procedure wherein the CPU picks up from the WK area an address where 8-bit image data is to be taken out of the RBF area and sets it in the address register ADR of the CPU.

Subsequently, the CPU sets a supplement of "96" in its total code length counter TCLC, "8" in a bit counter BTCI, a supplement of "64" in a T counter and "0" in an M counter. The total code length counter TCLC comprises an 8-bit counter which will function, when any point of change exists in the 8-bit data taken out from the RBF area, to locate the point of change through processing of bits. The T counter is an 8-bit counter adapted to obtain run-lengths 0–63 for looking up in the termination code table, having a supplement of "64", viz., 256–64, set initially therein. The M counter is an 8-bit counter for counting M to consult a makeup code table. The total code length counter TCLC will be described later in detail.

Next, in the program step JST$_1$, it is determined whether the 8-bit data intruduced in an accumulator ACC of the CPU are all "0" or "white".

If the result at the step JST$_1$ is NO, then bit processing occurs. That is, when the 8-bit image data at the accumulator ACC contain "black" picture element data, the content of the accumulator is added to the accumulator ACC to thereby shift the 8-bit image data by one but.

Then at step JST$_2$, whether a carry was produced by the above step is determined, that is, the point of transition from "white" picture element data to "black" picture element data is checked. If the result is YES, counting of the "white" run-length is finished and followed by a flow shown in FIG. 22 which is for picking up given coded data from the table.

For example, where "black" picture element data appears first on one line, the CPU goes from the step JST$_1$ to the flow shown in FIG. 22 by way of the step JST$_2$ with the count of the T counter kept at "0".

When "0" initially appears in the 8-bit image data or one byte data at the accumulator ACC, the result at the step JST$_2$ is NO and "1" is added to the T counter. Stated another way, the "white" run-length of one byte data is counted.

Then at step JST$_3$, it is determined whether a carry appeared from the T counter, that is, whether addition of "1" to the T counter allowed the total number to reach 64 bits.

This step JST$_3$ has no connection with a case wherein the initial "white" run-length on one line is counted, but it becomes significant when, thereafter, run-length coding of "black" is practiced and again followed by counting of "white" run-length with the same flow.

As will gradually become apparent, where 8-bit image data at the accumulator ACC involves a point of transition, the next run-length will naturally be counted after counting the rest of the data and by bringing the next one byte from the RBF area. Since therefore a fraction less than 8 bits enters the T counter, it happens that the total number of bits introduced in the T counter exceeds 64 and a carry appears when "1" is added to the T counter in the midst of the bit processing.

If the carry appears at the step JST$_3$, "1" will be added to the M counter for preparing makeup codes and the T counter will be set to its initial value which is 256–64; this will be followed by subtraction of "1" from BTCI for thereby storing in the BTCI that one bit counting has been completed.

If a carry does not appear despite the addition of "1", "1" will be immediately subtracted from the bit counter BTCI. Then at step JST$_4$, whether the BTCI became "0" is determined. As the step JST$_3$, the step JST$_4$ also becomes significant when fractions less than 8 bits are processed.

Until the fraction processing completes, the above-mentioned actions are repeated; if a point of transition is present, the flow for picking up coded data will be started and, if 64 bits in total are introduced in the T counter, "1" will be added to the M counter to set the initial value which is a supplement of 64 in the T counter.

If the result at the step JST$_4$ is YES meaning that the bit counter BTCI has become "0", byte processing occurs.

Byte processing will be performed when the result at the step JST$_1$ is YES.

When all of one byte data are "0", "8" is added to the T counter to check a carry which may appear from the T counter.

If the carry appears, initial setting is carried out taking the fraction at the T counter into consideration. That is, with the lower three digits of the T counter kept the same, a supplement of 64 is set in the upper digits and "1" is added to the M counter.

When a carry does not appear, the read address in the RBF area is incremented in order to shift the next one byte data from the RBF area into the accumulator ACC.

As already described, one line of image data are stored in the addresses 4000-40FF or 4100-41FF of the RBF area of the RAM. It may therefore occur that one line of data has run out when the one byte data have been taken out from the RBF area. To check this, at step JST$_6$, it is determined whether a carry appeared from the address register when the read address of the RBF was incremented.

If the result is NO, then the above procedures will be repeated. If YES, then one line of image data will fully be taken out of the RBF area. If YES, this means that one line of data has been fully read out of the RBF area and the run-length counting thereof has been completed. Then a flow for obtaining a WHITE code from a table occurs.

FIGS. 22(a) and 22(b) are flow charts for picking up a white code from a table on the basis of the result of the run-length counting.

First, whether a makeup code is necessary is determined. For this purpose, the content of the M counter is checked and whether M is "0" is determined a step JST$_7$.

If the result is YES, the CPU will immediately start preparing a termination code since a makeup code is needless in this case.

That is, a given block data is read out by consulting the table on the basis of the value T stored in the T counter in the flow shown in FIG. 21.

As stated, the block data thus read out has 3 bytes, the first of which stores its code length and the second and third storing a WHITE termination code.

The code length is first introduced in a code length register and applied to the total code length counter TCLC.

This total code length counter TCLC is necessary for determining whether fill bits are necessary. For the transmission of one line of coded data, one line must consist of a given number bits such as 96 bits in order to ensure a minimum transmission time. Accordingly, fill bits need to be added if the compression rate of one line of image data is relatively high.

Thus, every time coded data are prepared in accordance with the run-length, the code lengths are totaled to monitor one line of code lengths.

In practicing the flow of FIG. 21, the total code length counter TCLC is set with a supplement of 96.

If the result at the step JST$_8$ is YES, no fill bits are required and, therefore, a non-fill flag NFF appears.

The coded data from the table are transferred bit by bit to the FIFO area of the RAM. Every time 8 bits of data reach the FIFO area, data delivery from the FIFO area to the input/output section IX is enabled.

It will be recalled that the FIFO area occupies 32 bytes of the RAM from the address 4200 onward. For the FIFO to function, there must be provided a write address register WAR for storing addresses when one byte of data is written in the FIFO area, a read address register RAR for storing addresses when one byte of data is read out, and a bit counter BTC$_{II}$ which, when coded data are written in bit by bit, stores up to which bit of data has been written in out of the one byte of data.

These component elements in coordination cause coded data to be written sequentially in selected write addresses of the FIFO area while data thus written in the FIFO area are read out from selected read addresses byte by byte into the input/output section IX.

The write and read addresses continuously circulate through 0-32 and data are written in and out of the FIFO area endlessly.

Two conditions must be satisfied, however. They are (1) that the write address must not go beyond the read address and (2) that the write address must not be passed by the read address. The condition (1) is to prevent data written in the FIFO area from being lost while the condition (2) is to prevent the FIFO area from becoming empty. This embodiment is meaningless unless the two conditions are satisfied. Stated in another way, it is an important feature of this embodiment that the system is so constructed as to always fulfill the two conditions.

Now, in step JST$_9$, whether coded data are being written in selected addresses of the FIFO area is determined and, if so, one bit next to the coded data read out of the table is written in the FIFO area.

When the result at the step JST$_9$ is YES meaning that no bits have yet been written in that address, whether the read and write addresses are coincident is checked at step JST$_{10}$.

If the result is YES, indicating the coincidence between the read and write addresses, further data are prevented from being written in that address until data are read out of the same, thereby avoiding loss of the data.

As the FIFO area gets ready to accommodate data, one bit of coded data is transferred to the FIFO area "1" is subtracted from the bit counter BTC$_{II}$.

At step JST$_{11}$, whether the bit counter BTC$_{II}$ reached "0", that is, whether 8 bits of data entered given addresses of the FIFO area is determined.

If NO, "1" is subtracted from the code length register CLR to monitor the number of bits transferred to the FIFO area.

At step JST$_{12}$, whether the code length reached "0", that is, whether the coded data were fully transferred to the FIFO area is discriminated.

If NO, that is, if the coded data read out of the table have not yet been entirely transferred to the FIFO area, the above process is repeated for transferring the coded data to the FIFO area.

If the result at the step JST$_{11}$ is YES, meaning that 8 bits of coded data are in given addresses of the FIFO area, the bit counter BTC$_{II}$ is set to "8" and "1" is added to the write address register WAR to update the write address.

Data are written in and read out from the FIFO area in an endless manner as already stated. Accordingly, when data has been written in the last address of the FIFO area, the next data must be written in the leading address of the FIFO area.

Thus, in the event of updating of the write address, overflow of the write address register WAR is checked at step $JST_{13}$ and, if YES, the leading address is set in the write address register WAR. If NO, then "1" is subtracted from the code length register CLR.

At step $JST_{14}$, whether the coded length register CLR reached "0", that is, whether the transfer of all of the coded data is over is discriminated.

If the result at this step is NO, whether the next data can be written in will be determined at step $JST_{10}$ and the above procedure repeated.

If the transfer of the coded data read out of the table is all over, the initial value will be set in the T counter.

Then at step $JST_{15}$, whether a memory empty flag MEF is set is checked.

In the flow of FIG. 21 for taking out "white" image data from the RBF area and counting its run-length, the memory empty flag MEF is set when one line of image data has just been fully taken out at the instant one byte of image data has been read out.

If therefore the last coded data on one line is transferred to the FIFO area, the result at step $JST_{15}$ will be YES and the CPU will go to the flow for generating a sync code EOL.

If the result at the step $JST_{15}$ is NO, "black" image data will be picked up from the RBF area to enter the flow for counting the run-length.

The foregoing actions of the CPU are concerned with the case wherein the M counter is "0". When the M counter is not "0" necessitating a makeup code, the flow will proceed to one shown in FIG. 22(b) wherein the table is looked up in with the content M of the M counter as an address.

Thereafter, the CPU will operate in the same way as in the case of preparing a termination code. The code length is set in the code length register CLR and this code length is applied to the total code length counter TCLC. If this causes a carry to appear, the NFF flag will be set to "1" and, if not, whether the bit counter $BTC_{II}$ is checked.

When the bit counter $BTC_{II}$ is "0" and coded data are to be transferred for the first time to that address of the FIFO area, whether data can be written in that address is checked and the CPU remains in stand-by until such a state is established. If coded data have already been transferred to that address, the next one bit is immediately transferred to the FIFO area.

In the meantime, whether 8 bits of data were transferred to the FIFO area is checked by the bit counter $BTC_{II}$ and whether all of the coded data at that instant were transferred to the FIFO area is determined by the code length register.

When 8 bits of coded data have been transferred to the FIFO area, that is, when a given one byte of data has been stored at a given address of the FIFO area, the write address is updated to transfer coded data to the next address.

If the precedingly transferred data is in the last address of the FIFO area, the first address will be re-set in the write address register so that the next data can be introduced in the first address of the FIFO area.

The above procedure is repeated until makeup coded data read out of the table on the basis of the content M of the M counter are fully transferred to the FIFO area. Upon completion of this transfer, termination coded data will be transferred as indicated in FIG. 22(a).

Following such compression of "white" image data, compression of "black" image data is carried out.

Figure 23B:
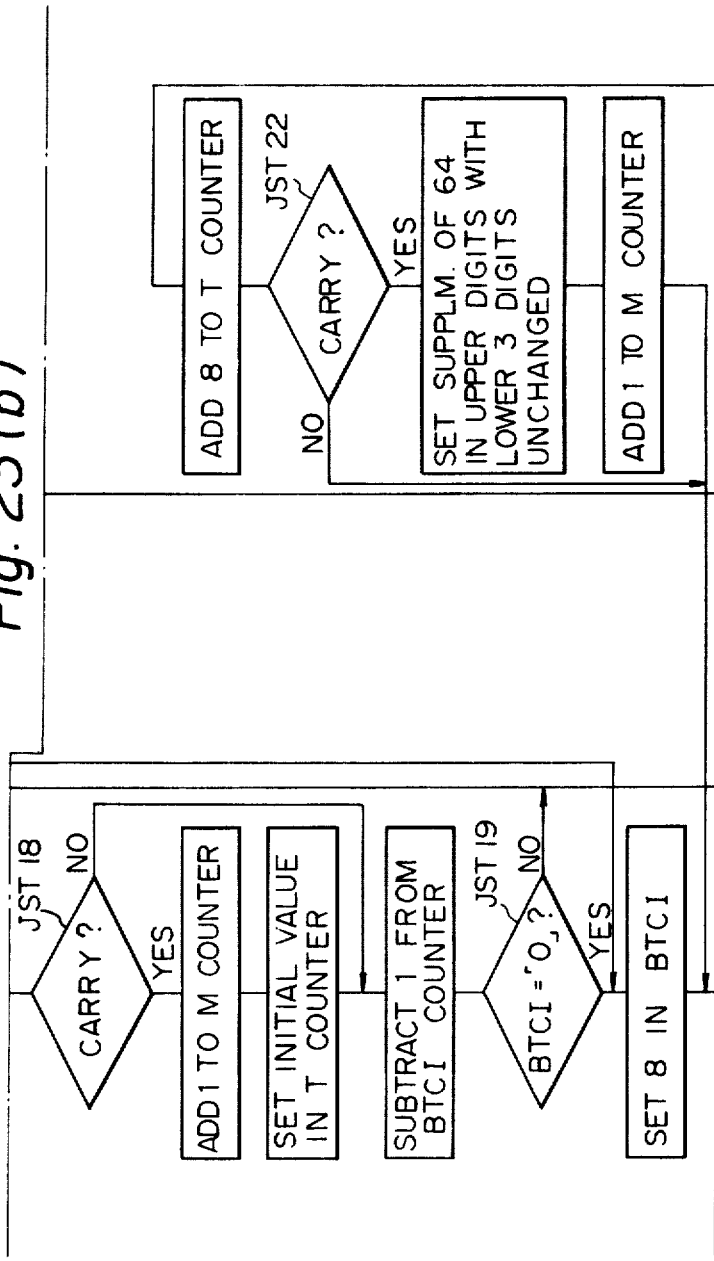
FIG. 23, including A-C, is a flow chart showing a procedure in the duty E for obtaining a "black" run-length.
Figure 23C:
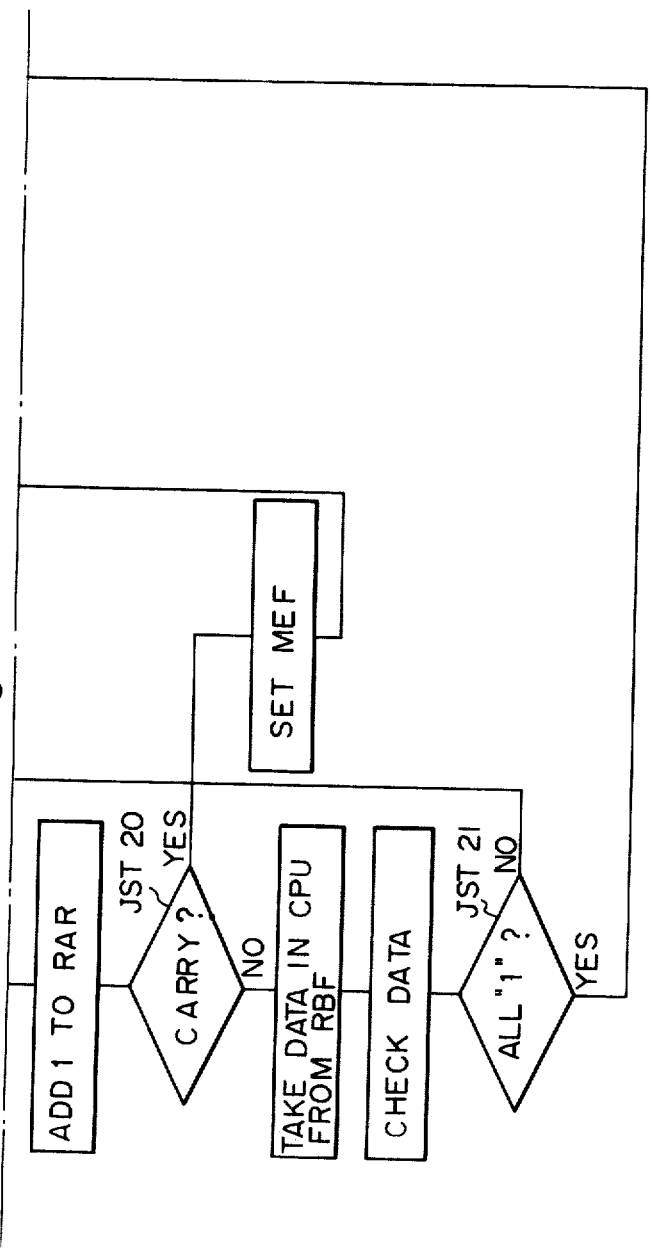

FIG. 23 shows a flow for obtaining T and M by counting "black" run-lengths.

This flow in FIG. 23 necessarily occurs after the flow of FIG. 21 has been done and, therefore, the respective registers and counters still hold certain values based on the flows.

The T counter holds the initial value, the M counter "0", the bit counter $BTC_I$ the remaining fraction bits which resulted from the flow of FIG. 21, and the accumulator ACC of the CPU "black" image data corresponding to the fraction bits.

To be more precise, when a "white" run-length was fully counted in the flow of FIG. 21, one bit of "black" data of the 8-bit image data transferred from the RBF area to the accumulator ACC was shifted out but the rest were and still are retained in the accumulator ACC.

The number of "black" picture element data, which is produced by removing "white" picture element data from 8-bit image data, has been stored in the bit counter $BTC_I$.

When the flow of FIG. 23 is performed after that of FIG. 22, "1" is first added to the T counter and "1" is subtracted from the bit counter $BTC_I$. At step $JST_{16}$, whether this made the bit counter $BTC_I$ "0" is checked to determine whether the run-length of the fraction was fully counted.

If NO, the content of the accumulator ACC is added to the accumulator ACC to shift it one bit.

Since in this case "black" run-lengths are being counted, "0" will be shifted out from the ACC if any point of transition is present.

Accordingly, when a carry is found at step $JST_{17}$, run-length counting is completed and followed by an operation for writing coded data into the FIFO area.

If the result at the step $JST_{17}$ is NO, then "1" is added to the T counter and whether its value T exceeded "64" is discriminated at step $JST_{18}$.

If the step gives YES, "1" is added to the M counter and the initial value is set in the T counter whereafter "1" is subjected from the bit counter $BTC_I$.

If the T counter has not yet exceeded "64" viz., NO, "1" is immediately subtracted from the bit counter $BTC_I$.

At step $JST_{19}$, whether this made the bit counter $BTC_I$ "0" is checked to determine whether the fraction was fully processed.

If the result is NO, the above procedure for shifting the content of the accumulator is repeated.

If YES at the step $JST_{19}$, "8" is set in the bit counter $BTC_I$ and "1" is added to the read address register thereby updating the read address in the RBF area.

Whether this caused a carry to appear from the read register is determined at step $JST_{20}$.

If YES, meaning that the entire line of picture element data have been read out, the memory empty flag MEF is set and preparation of coded data is started based on the T and M of that instant.

If NO, one byte of data are coupled from the RBF area to the accumulator ACC of the CPU and it is checked whether the picture element data are all "1".

If YES, byte-by-byte processing will take place. If NO, suggesting the presence of a point of transition in that one byte of data, the aforesaid bit-by-bit processing will be repeated to add the content of the accumulator to the accumulator ACC.

In the event the byte-by-byte processing occurs, "8" is added to the T counter and, at step $JST_{22}$, whether a carry was set is determined to find whether the T counter exceeded "64".

If the T counter has exceeded "64" when added with "8", the proportion beyond "64" is equal to the fraction processed in the initial stage of this flow and its value is directly set in the T counter.

It follows that, if the initial value which is the supplement of "64" is set in the upper digits with the lower three digits unchanged in order to leave the fraction, the T counter will store the count of the processed fragement.

Next, "1" is added to the M counter and then "1" is added to the read address register to read the next byte of data into the CPU thereby updating the read address.

After the T and M counters have thus obtained the result of "black" run-length counting, the table is consulted with the values T and M as an address and "black" coded data are transferred to the FIFO area. This is shown in the flow charts of FIGS. 24(a) and 24(b).

Figure 24A:
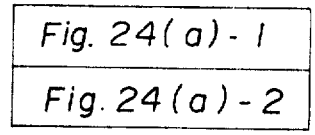
FIGS. 24(a) and 24(b) are flow charts showing a procedure in the duty E for consulting the table based on the "black" run-length to pick up a BLACK code for transfer to the FIFO area.
Figure 1:
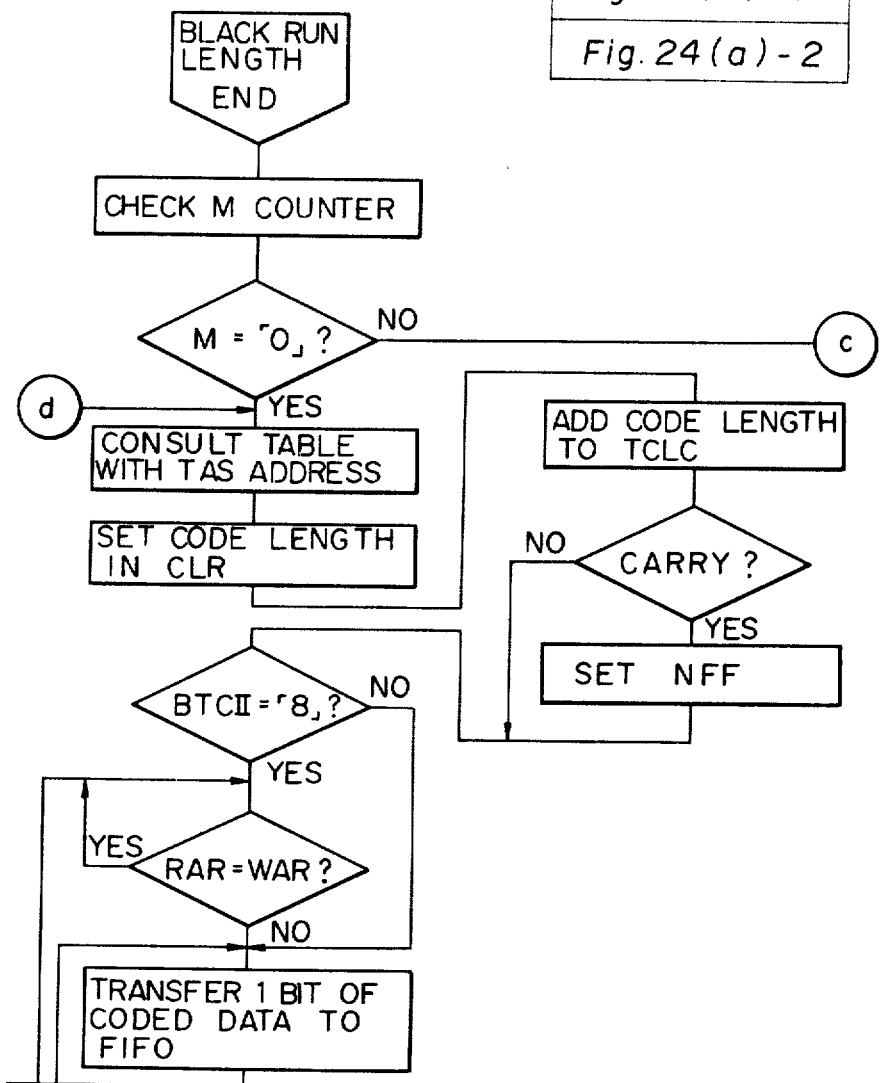
Figure 24:
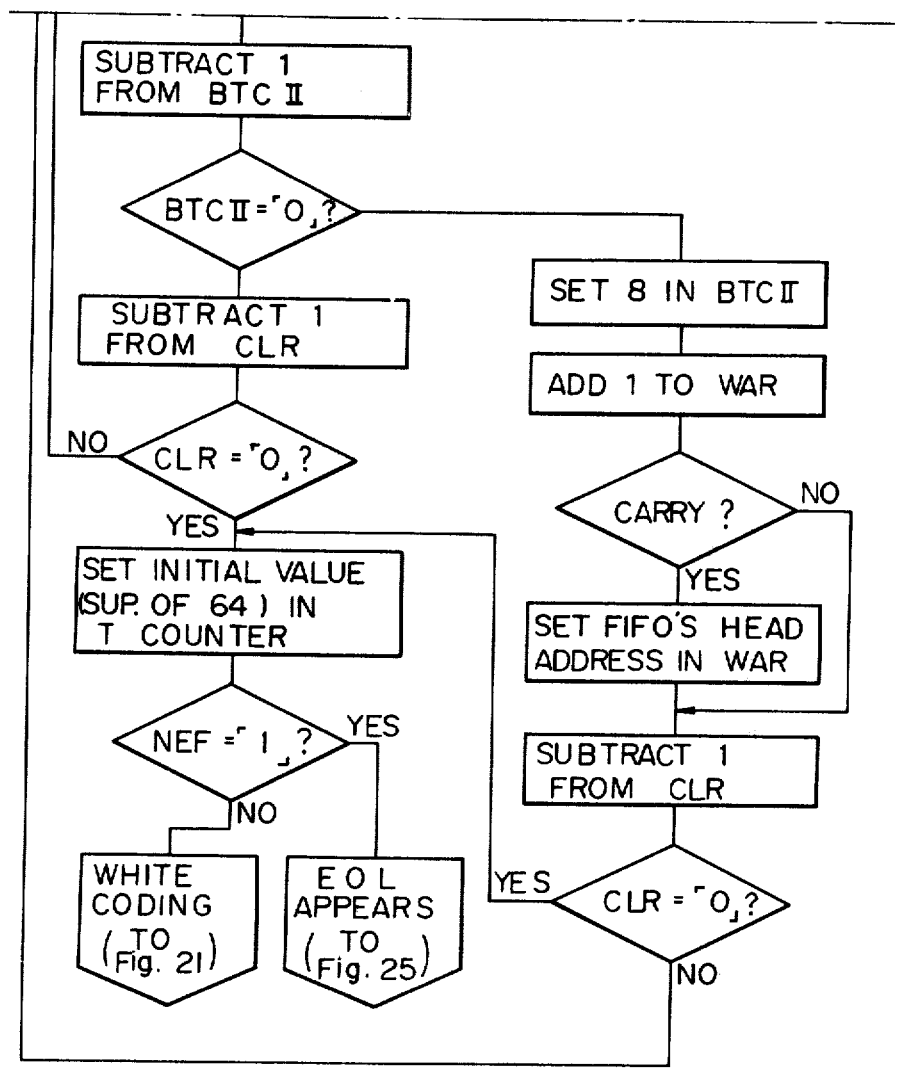
Figures 1, 24B:
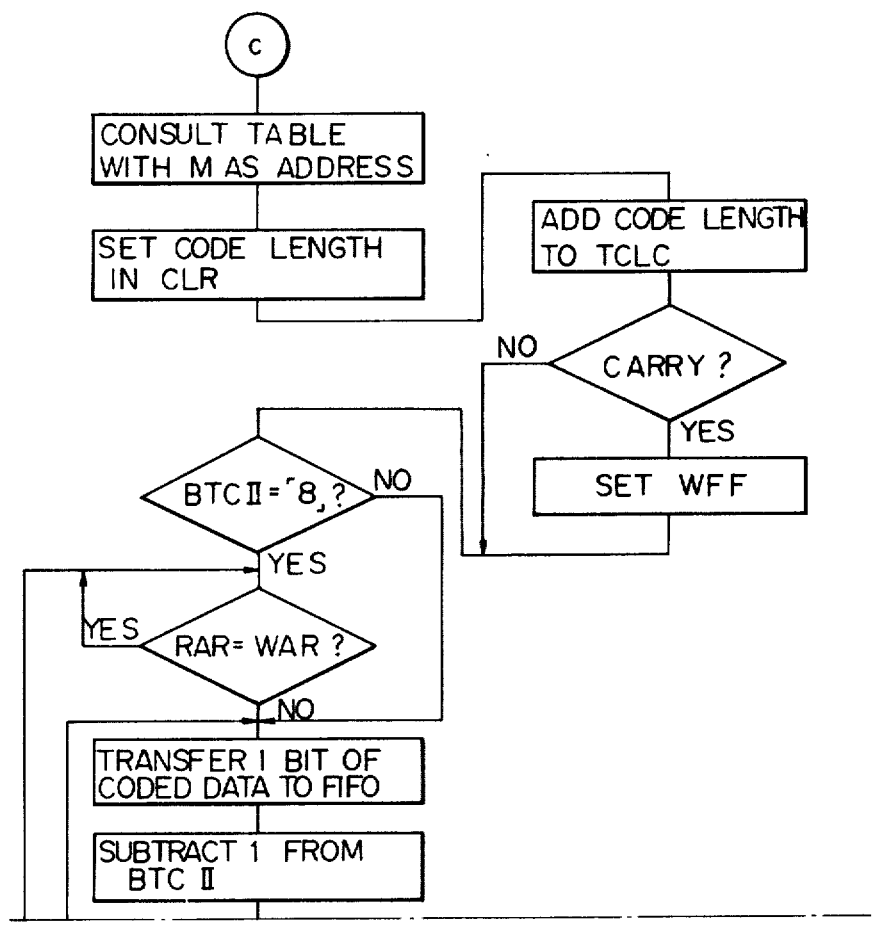
Figures 2, 24B:
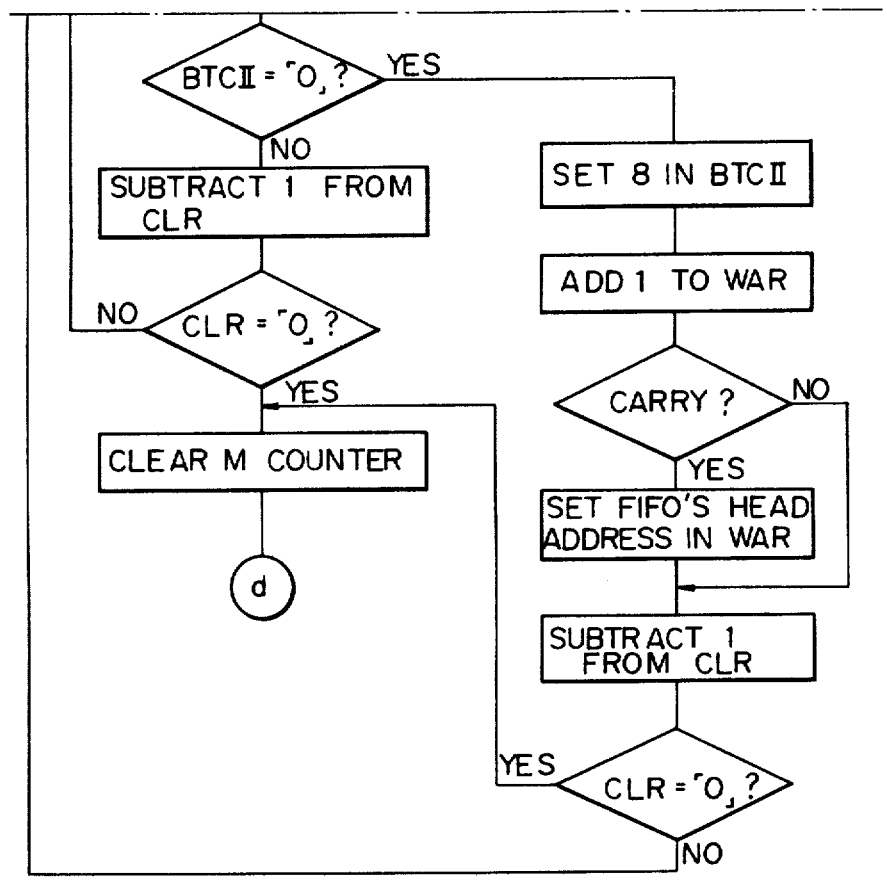

The flow indicated in FIGS. 24(a) and 24(b) is precisely the same as the flow of FIGS. 22(a) and 22(b) except that data to be read out of the table are "black" coded data. Thus, details of this flow will be omitted.

Figure 25A:
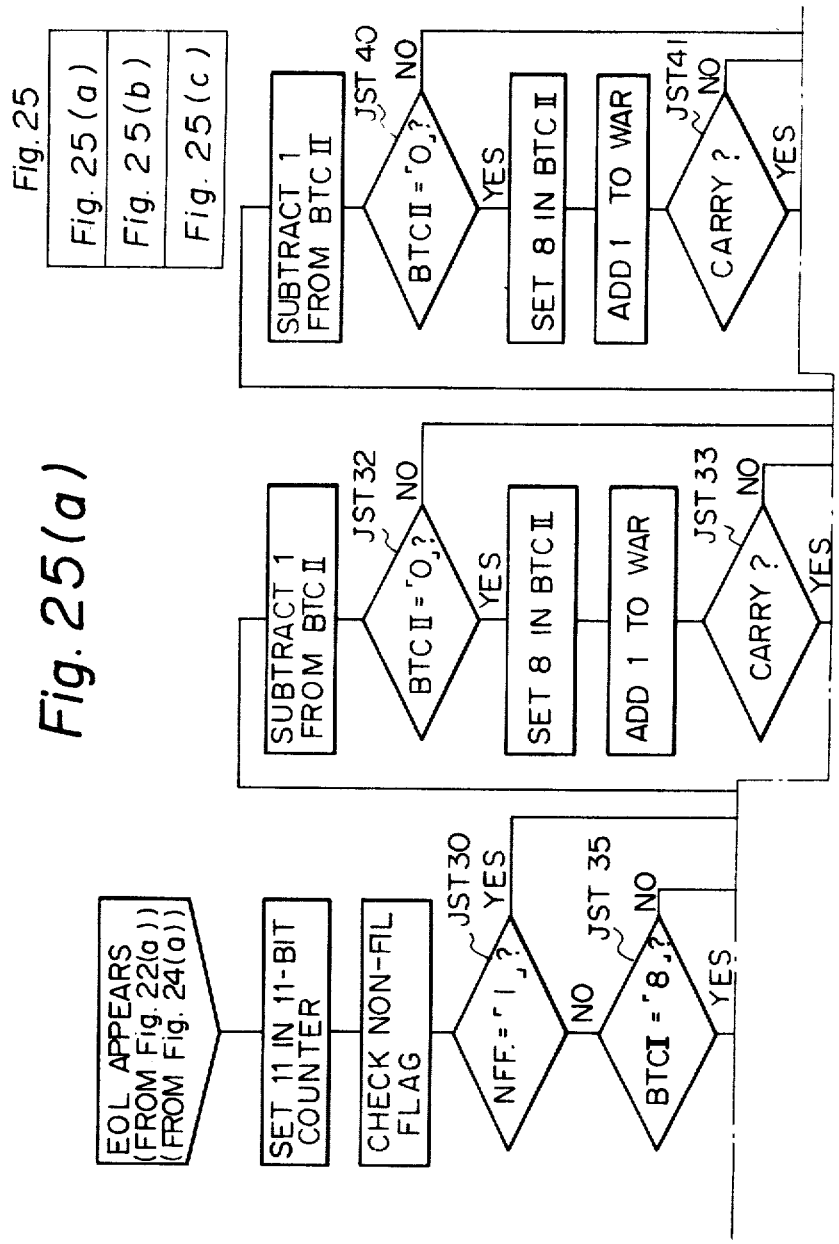
FIG. 25, including A-C, is a flow chart showing a procedure in the duty E for generating a sync code and transferring data to the FIFO area.
Figure 25B:
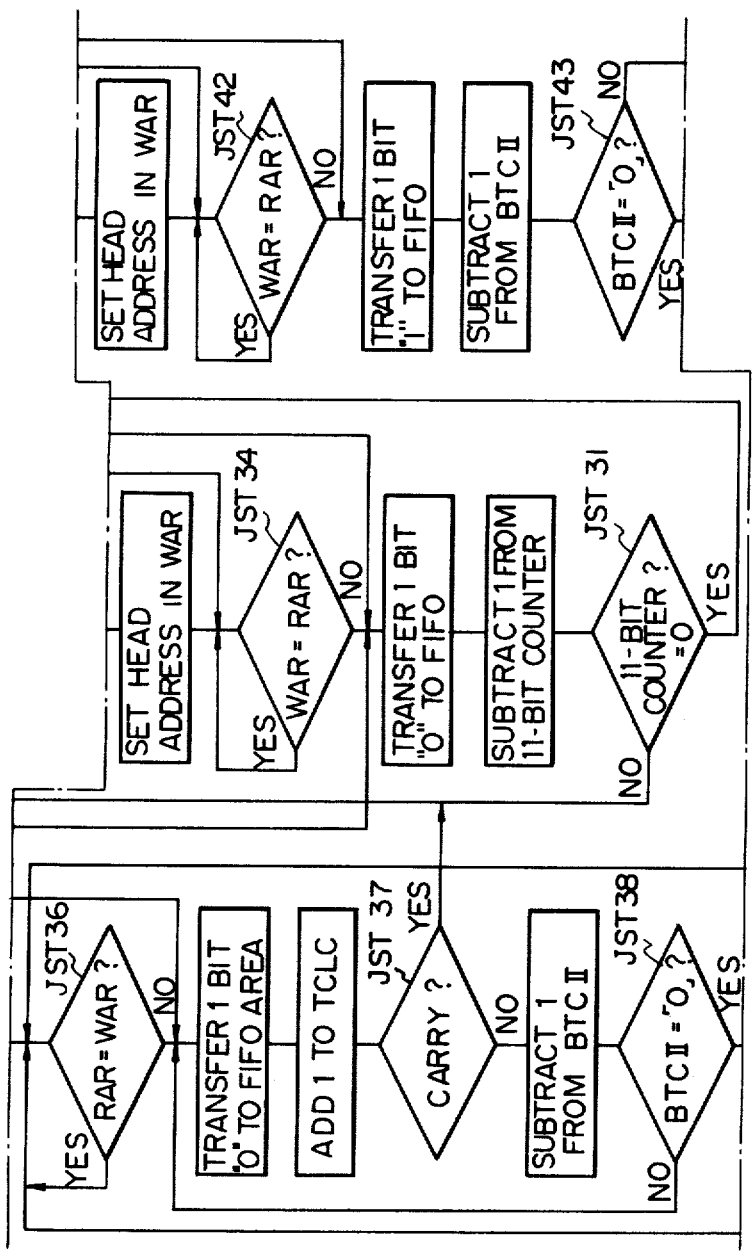
Figure 25C:
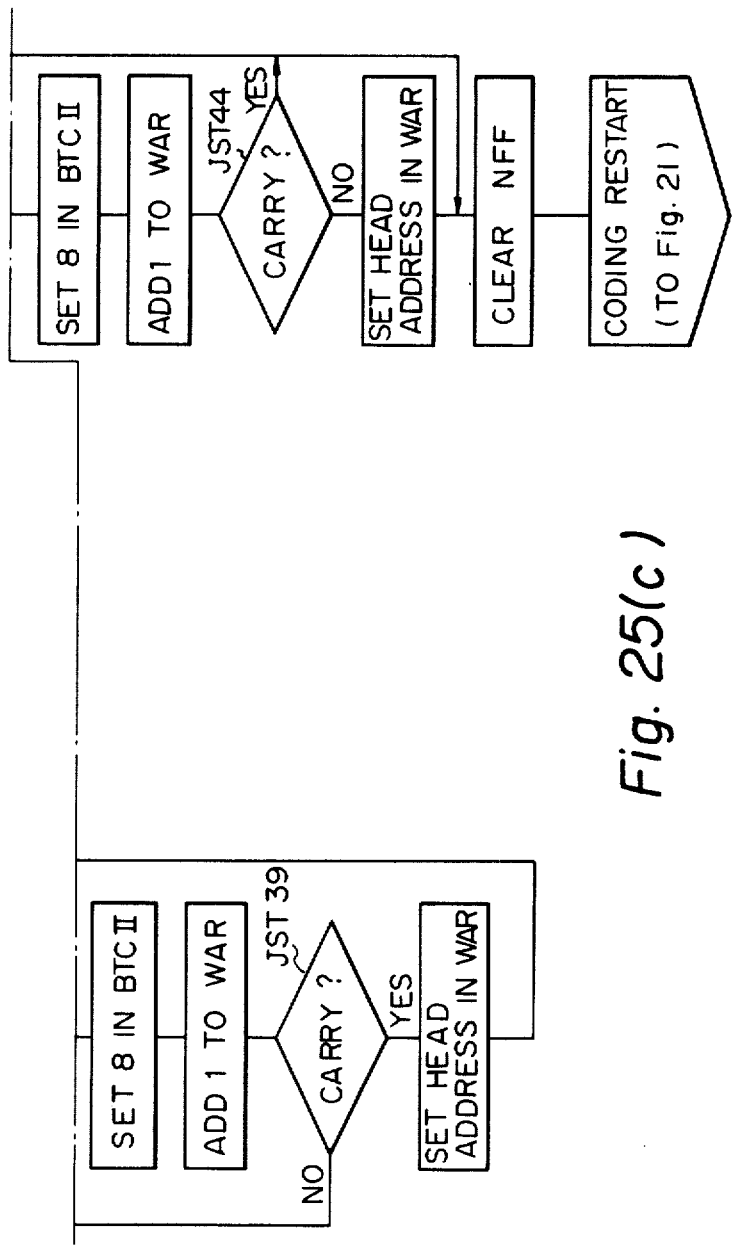

If one line of the coding process is finished when the flow of FIGS. 24(a) and 24(b) has been completed, the operation shifts to the flow shown in FIG. 25 for preparing a sync code EOL. If it is not finished, operation will return to the flow of FIG. 21 since coding of "white" data will again occur.

FIG. 25 shows a flow for preparing a sync code EOL. As described, the sync code is made up of 11 "0"s and "1" and has its 11 "0"s counted by an 11-bit counter. The initial value "11" is set in the 11-bit counter.

Where one line of data is less than a predetermined number, fill bits need to preceed the sync code EOL and, for this purpose, whether the non-fill flag NFF is set is determined.

The non-fill flag NFF will have been seen if the coded data exceeded a predetermined number when the flow of FIG. 22 or that of FIG. 24 has been carried out. Therefore, if step $JST_{30}$ gives YES, preparation of the sync code is immediately started.

First, "0" is transferred to the FIFO area and "1" is subtracted from the 11-bit counter whereupon, at step $JST_{31}$, whether the number of "0"s transferred to the FIFO area reached "11" is checked.

If the result is NO, "1" is subtracted from the bit counter $BTC_{II}$ to check at step $JST_{32}$ whether one byte of data was transferred to the FIFO area. If NO, one bit of "0" is again transferred to the FIFO area.

If one byte has been transferred to the FIFO area, "8" is set in the bit counter $BRC_{II}$ and "1" is added to the write address register WAR to update the write address.

In this instance, whether a carry appeared from the write address register is determined at step $JST_{33}$. If YES, the initial value is set in the register WAR.

At step $JST_{34}$, coincidence between the write and read addresses is checked to determine whether data can be written in the FIFO area. If possible, the transfer of one bit of "0" to the FIFO area is repeated.

If the result at step $JST_{30}$ is NO indicating the need for fill bits, whether it is a new write address or the write address partly loaded with data that is to accommodate fill bits or "0" is determined at step $JST_{35}$. If it is the new address, whether the new address can accommodate fill bits is determined at step $JST_{36}$. If possible, then "0" will be transferred to the FIFO area.

At this instant, "1" is added to the total code length counter TCLC and, at step $JST_{37}$, whether the counter TCLC reached the given number of bits is checked.

If the result is NO, "1" is subtracted from the bit counter $BTC_{II}$ and, at step $JST_{38}$, whether one byte of data entered the determined address of the FIFO area is discriminated. If not, transfer of "0" to that address is repeated.

As the delivery of one byte to that address is completed, "8" is set in the bit counter $BTC_{II}$ and "1" is added to the write address register WAR.

At step $JST_{39}$, whether a carry then appeared is determined. Appearance of a carry suggests the transfer of data to the last address of the FIFO area; the next byte of data must be fed to the first address of the FIFO area. Thus, the initial value which is the first address is set in the write address register.

In this way, fill bits which are "0" are transferred bit by bit to the FIFO area until the total code length reaches the predetermined one. Then the step $JST_{37}$ will give YES. Thereafter, 11 "0"s are transferred to the FIFO area as stated in order to add the sync code EOL.

The result at the step $JST_{31}$ therefore become YES, and "1" is subtracted from the bit counter $BTC_{II}$.

Again, whether one byte was transferred to the determined address of the FIFO area is checked and, if so, whether that address must be reset to the first address in the event of updating of the address and whether the updated write address of the FIFO area can accommodate the next date are determined in the successive steps $JST_{40}$–$JST_{42}$. After processing based on the results, the last "1" of the sync code is transferred to the FIFO area.

Thereafter, "1" is subtracted from the bit counter $BTC_{II}$ and, again in step $JST_{43}$, whether "8" needs be set in the counter $BTC_{II}$ and at step $JST_{44}$, whether the write address needs to be set to the first address of the FIFO area are determined. After processing based on the results, the operation goes back to the flow of FIG. 21 so as to perform the next one line of coding.

Image data stored in the RBF area are in this way read out to the CPU byte by byte, compressed and stored in the FIFO area.

Figure 26:
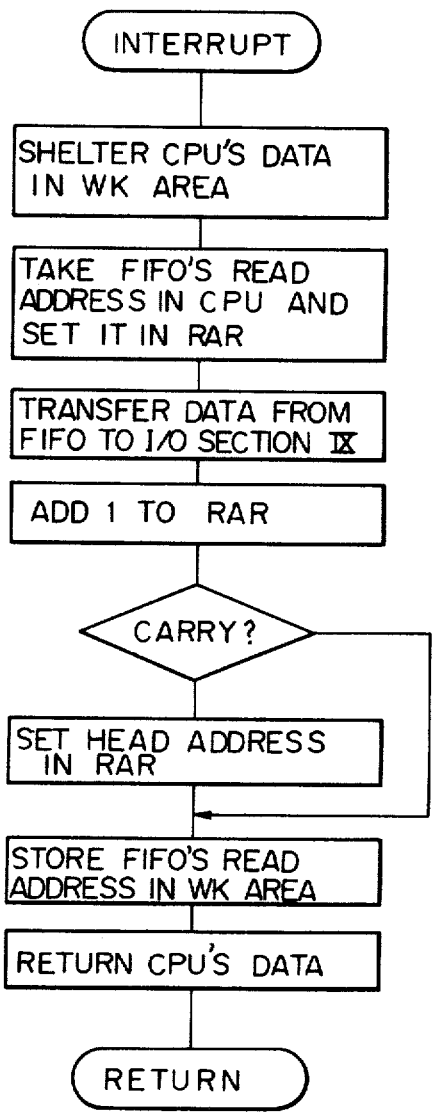
FIG. 26 is a flow chart showing a procedure in the duty C for transferring coded image data from the FIFO area to the data input/output section IX.

FIG. 26 demonstrates the procedure of the duty C wherein coded data thus stored in the FIFO area are transferred byte by byte to the data input/output section IX.

As aforementioned, the duty C is carried out in response to an interrupt request signal $int_c$ which appears from the input/output section IX every time 8-bit data transferred to the section OX are delivered serially to the modem.

The interrupt request signal $int_c$ appears at the frequency of 8/4800 (sec) = 1.6 (msec) in case where the transmission rate is 4800 bps by way of example.

Upon generation of the signal $int_c$, the CPU suspends the duty D or E which it has been performing and shifts the data stored in the respective counters and registers of the CPU to the WK area of the random access memory RAM.

Then the CPU reads the read address in the FIFO area from the WK area and sets it in the read address register RAR of the CPU. One byte of data is delivered from that address of the FIFO area to the data input- /output section IX while "1" is added to the register RAR to renew the read address.

Consequently, as in the case of writing data in the FIFO, the register RAR produces a carry.

Then, as in the case of writing data in the FIFO area, that address is stored in the WK area after the initial value is set in the register RAR when the register RAR generates a carry to exceed the last address of the FIFO area. The address will be directly stored in the WK area if the carry does not appear.

Then the CPU resumes the duty D or E returning the recoded data back into the CPU.

In the transmission mode, the system codes picture element data and transmits them from the modem to the addressee's station on the basis of the duties alloted to the CPU.

In the embodiment described above, the CPU performing the duty D temporarily stores in the LBF area of the data storage VIII the 8-bit parallel picture element data fed thereto from the image data input section II; the stored data are again fed to the CPU and thereby coded when the CPU carries out the duty E. Alternatively, if OR processing is permissible also in the case of the vertical scan line density of 3.85 line/mm, the parallel picture element data by each eight bits introduced from the image data input section II may be directly processed for coding as stated and then stored in the FIFO area. This alternative arrangement makes the LBF area needless and, therefore, minimizes the necessary capacity of the data storage VIII, and cuts down the cost of the facsimile apparatus. Furthermore, since the work of the CPU for delivering picture element data by each eight bits into and out of the LBF area is omissible, the CPU can operate with an extra time which is usable for another processing. In short, proportioning of time for various duties of the CPU becomes quite easy at the designing stage.

RECEPTION MODE

Figure 15B:
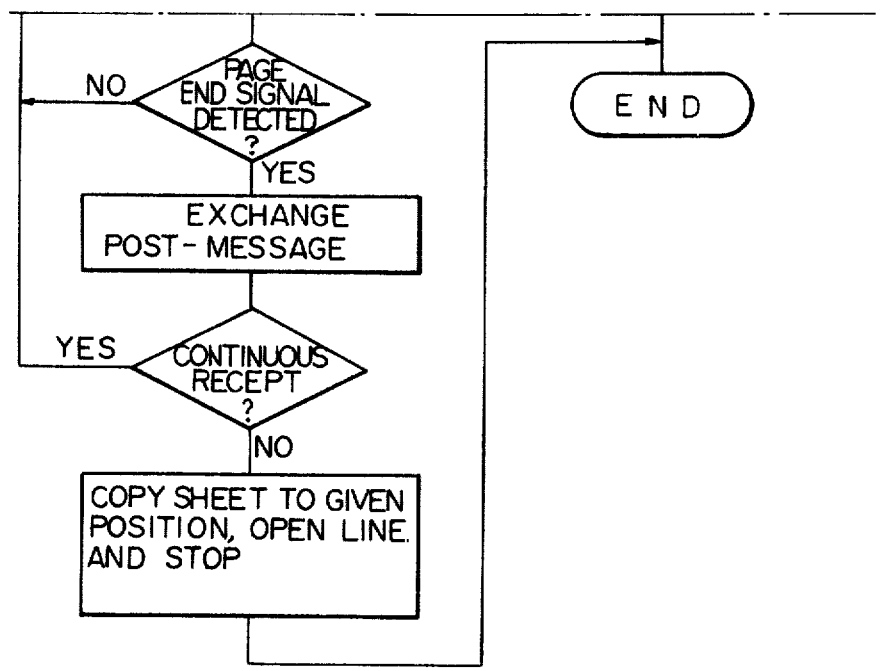
FIG. 15, including A–B, is a flow chart showing the general operation of a facsimile system of the present invention.

In the reception mode, the CPU performs various actions which have been generally discussed with reference to FIG. 15. The CPU is designed to perform the following duties F-I on a time division basis in response to various interrupt request signals coupled thereto.

During data reception, the CPU receives an interrupt request signal $int_f$ based on a sync signal $s_1$ and from the timing signal generator VI and an interrupt request signal $int_h$ based on a sync signal $s_2$ as well as the interrupt request signal $int_g$ from the data input/output section IX as mentioned with reference to FIG. 11, each through the common signal line INT. The priority order of the duties F, G and H which the CPU performs in response to interrupt request signals $int_f$–$int_h$ is F>G>H. Usually, the CPU will be carrying out the duty I.

Figure 27:
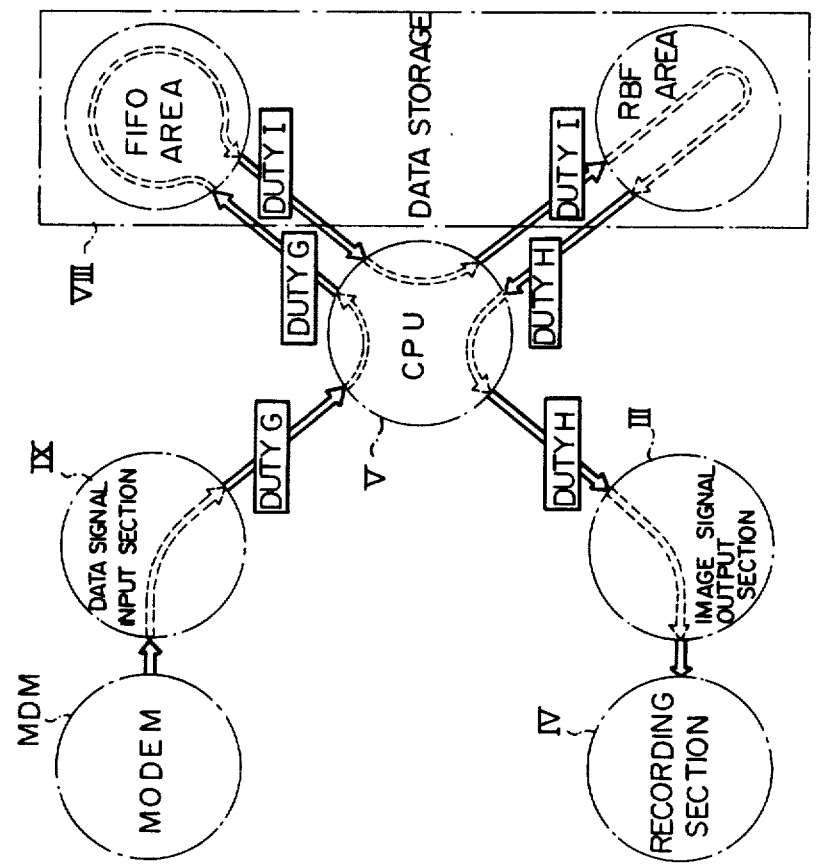
FIG. 27 shows paths which image data follow during data reception.

The duties F-I will be outlined hereinafter with reference to FIG. 27 which shows the flow for data processing.

DUTY F

In response to an interrupt request signal $int_f$, the CPU carries out duty F.

When in duty F, if the memory full flag $MFF_I$ or $MFF_{II}$ has been set indicating that one line of decoded picture element data has been stored in the RBF area I or II of the random access memory RAM, the CPU resets the memory full flag and sets a data read flag I or II. If the memory full flag $MFF_I$ or $MFF_{II}$ has been reset, then the CPU will reset the data read flag $DRF_I$ or $DRF_{II}$.

This data read flag $DRF_I$ or $DRF_{II}$ will be made reference to in the event the CPU performs duty H.

DUTY G

The CPU practices duty G in response to an interrupt request signal $int_g$.

The interrupt request signal $int_g$ appears when 8 bits of received image data are coupled from the modem MDM to the data input/output section IX. The duty G of the CPU is to respond to this signal $int_g$ and transfer the 8-bit or 1-byte data to the FIFO area and write it in a preselected address thereof.

By the next duty I, the image data transferred to the FIFO area will be decoded into picture element data and transferred to and stored in the RBF area.

DUTY I

This is the duty which the CPU usually performs. If the memory empty flag $MEF_I$ or $MEF_{II}$ has been set, the CPU resets it and takes in image data from the FIFO area. The image data in the CPU are decoded and transferred sequentially to the RBF area to be stored therein. At the instant one line of image data is fully decoded, the CPU checks errors in the received image data and, if no errors, sets the memory full flag $MFF_I$ or $MFF_{II}$.

DUTY H

When applied with an interrupt request signal $int_h$, the CPU accepts the request and performs the duty H only if the data read flag $DRF_I$ or $DRF_{II}$ has been set.

The duty H is to advance the vertical scan pulse motor of the recorder IV one step and to supply the received image output section III with 256 bits of decoded image data by each 8 bits.

However, the timing the CPU performs the duty H somewhat differs from one density of vertical scan lines to another. Where the vertical scan line density is 7.7 line/mm, the CPU when the flag DRF is set advances the pulse motor one step in response to each interrupt request signal $int_h$ and fully delivers one line of image data to the section III after eight times of interrupt. In the case of the vertical scan line density of 3.85 line/mm, the CPU when the flag DRF is set accepts every second interrupt request signal $int_h$ to advance the pulse motor one step and delivers one full line of image data to the section III continuously two times in response to 16 interrupt request signals $int_h$.

Figure 28:
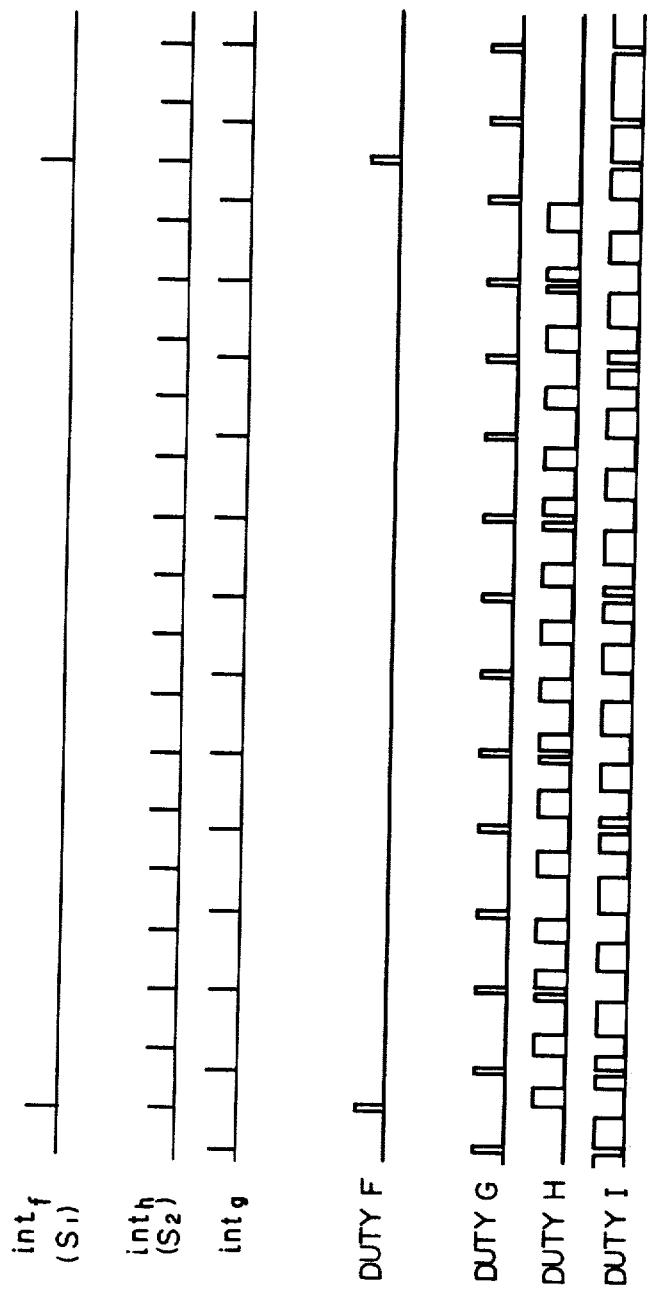
FIG. 28 is a time chart showing duties F-I which the microprocessor section V performs during the data reception mode.

FIG. 28 is a timing chart showing an exemplary relationship between the duties F-I based on the vertical scan line density of 3.85 line/mm. Suppose that the CPU is in duty I wherein image data are fed to the CPU by each 8 bits from the FIFO area and sequentially supplied to the line buffer or RBF area as decoded image data. When an interrupt request signal $int_f$ or $int_h$ based on the sync signal $s_1$ or $s_2$ is applied to the CPU, the CPU first sets or resets the data read flag DRF, performs duty F, and then advances the vertical scan pulse motor one step while supplying the received image output section III with the decoded image data from the RBF area, duty H. In the meantime, the modem MDM delivers received image data serially to the data input/output section IX and, as already discussed, the input/output section IX produces an interrupt request signal $int_g$ every time the input data reaches 8 bits.

Responding to this signal $int_g$, the CPU interrupts the duty H or I and carries out duty G wherein it transfers the 8-bit data from the input/output section IX to the FIFO area.

After performing the duty G, the CPU resumes the duty H or I.

When one line of image data is coupled to the section III by eight interrupt requests made by the signals $int_h$, the CPU again supplies the section III with the same one line of image data in response to other interrupt request signals $int_h$. Consequently, the recorder section IV writes the image data twice.

More detailed procedures for the various duties will be described with reference to FIG. 29 and onward.

Figure 29:
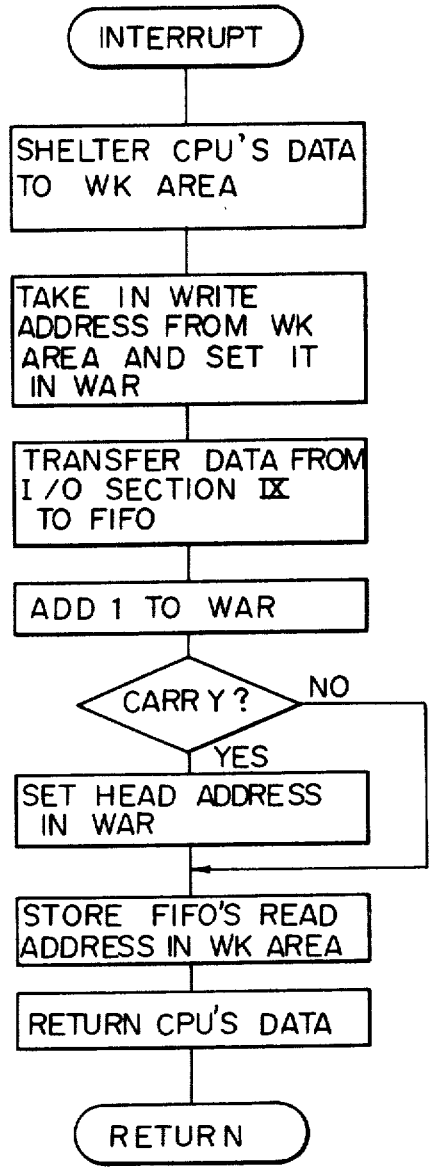
FIG. 29 is a flow chart of the duty G wherein coded data are transferred from the data input/output section IX to the FIFO area.

FIG. 29 is a flow chart showing the duty G which transfers 8-bit data introduced in the input/output section IX to the FIFO area.

It will be recalled that an interrupt request signal $int_g$ appears when 8-bit data arrive at the section IX from the modem MDM.

As in the transmission mode, the signal $int_g$ appears at the frequency of 8/4800 (sec)=1.6 (msec) where the transmission rate is 4800 bps by way of example.

Accepting the signal $int_g$, the CPU initiates the duty G after interrupting the duty H or I.

The CPU first transfers the contents of the counters, registers and the like from the preceding program to the WK area of the random access memory RAM in order that they can be re-used when the CPU goes back to the program.

The CPU brings the write address in the FIFO area from the WK area and sets it in the address register of the CPU.

Then the CPU takes in 8 bits of data applied to the data input/output section IX, delivers them to the FIFO area and writes them in its address.

After the transfer, "1" is added to the address register ADR to check the for appearance of a carry.

A carry, if appeared, indicates that the above-mentioned one byte of data has been written in the last address of the FIFO area and, therefore, the next data must be written in the first address of the FIFO area. The initial value is therefore set in the address register ADR and stored in the WK area.

If without any carry, the write address will be directly stored in the WK area.

The CPU then sets the previous contents again in the CPU to resume the preceding duty.

In this way, coded data stored in the FIFO area are decoded in the next duty I.

Figures 2, 30A:
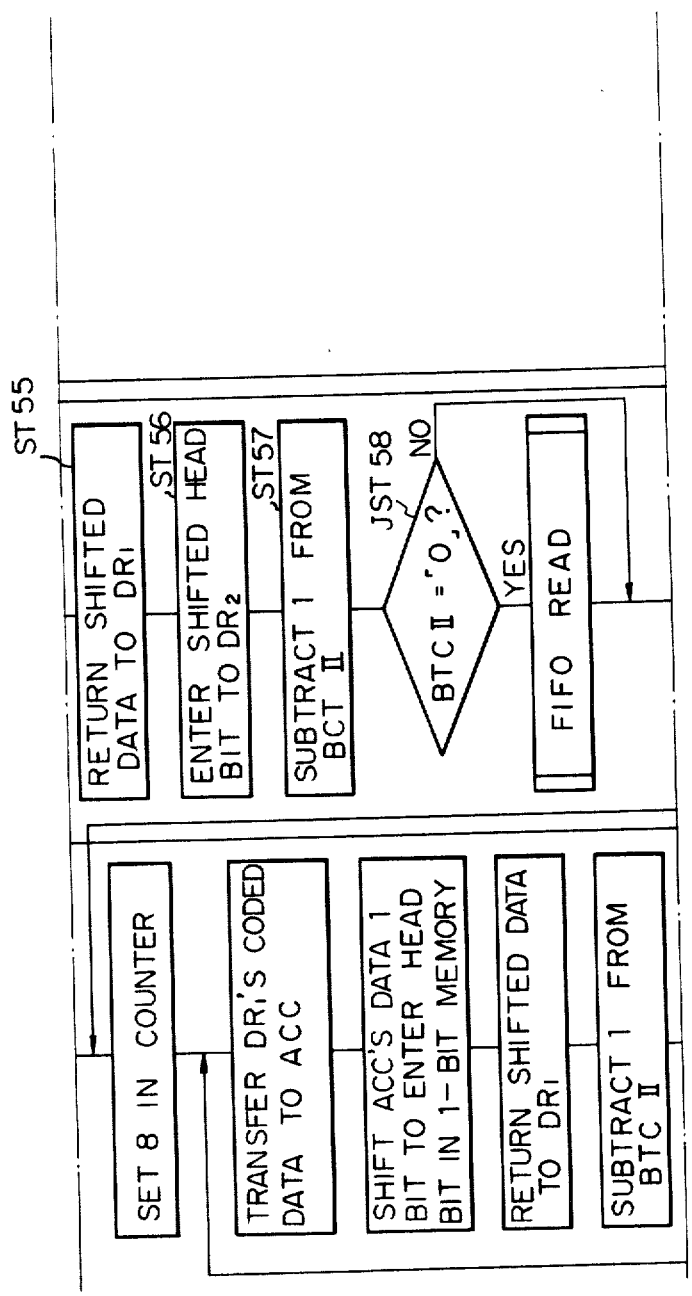
FIG. 30(a) is a flow chart showing a procedure in the duty I for obtaining a run-length code by consulting the table on the basis of data unloaded from the FIFO area.
Figures 3, 30A:
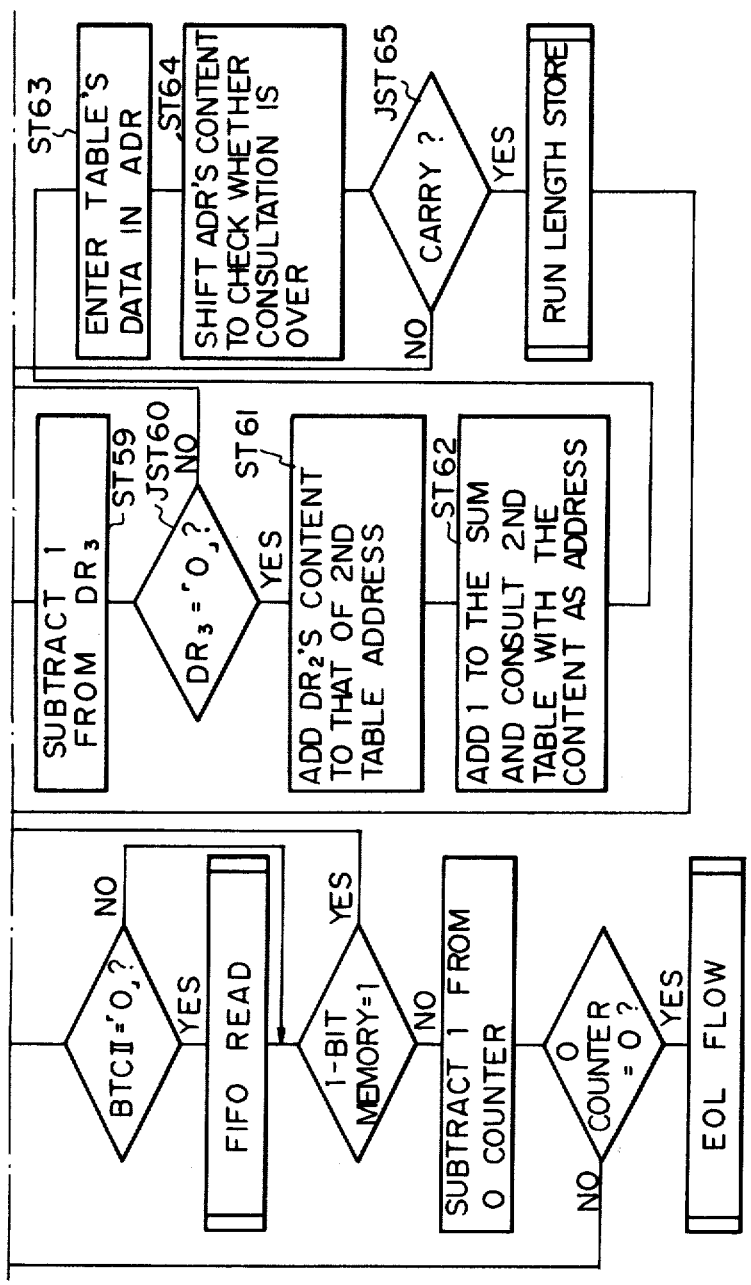

FIG. 30 shows a flow for the duty I for reading out a run-length (binary number) by consulting the table on the basis of the received coded data.

Entering this flow, the CPU first performs initial settings on the registers and their associated elements and checks whether coded data can be read out from the FIFO area. When data are stored in the FIFO area and can be read out therefrom, the CPU stores 8 bits of data in its data register $DR_1$.

The CPU consults the table on the basis of the coded data and picks up a run-length corresponding to the coded data. In this instance, according to this embodiment, the WHITE and BLACK CODES shown in Tables 1 and 2 are divided into groups with respect to a case wherein the leading bit of coded data is "1", a case wherein the leading bit is "0" with "1" appearing as the second bit, a case wherein the first and second bits are "0" with "1" appearing as the third bit, etc. The table is thus arranged to permit a run-length corresponding to a specific code to be picked up.

Therefore, it is necessary at this stage to check how many "0" bits are included in the leading portion of the coded data introduced in the data register $DR_1$ from the FIFO area. For purpose, a 0 counter is installed.

As seen from the tables shown hereinbefore, the number of "0"s which appear at a leading end portion of coded data is 7 bits at the maximum. A code having 8 bits or more of "0"s at its leading portion is a sync cide.

With this in view, "8" is initially set in the 0 counter.

Then the coded data in the data register $DR_1$ are transferred to the accumulator ACC for thereby shifting one bit. This is to examine how many "0" bits are added to the head of the coded data in the data register $DR_1$.

The resultant carry is stored in a 1-bit memory.

The coded data shifted by one bit are again returned to and stored in the data register $DR_1$ so that they can be checked sequentially in a later stage.

In this instance, it is necessary to store up to which bit the coded data were taken out. For this purpose, "1" is subtracted from "8" which was initially set in the bit counter $BTC_H$.

Figure 31:
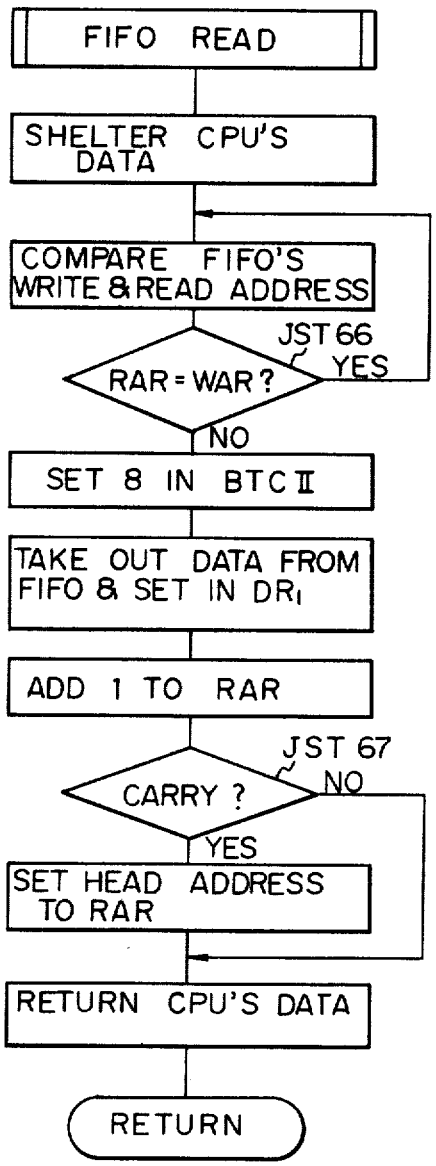
FIG. 31 is a flow chart representing a subroutine FIFO READ in FIG. 30(a)

When all of the 8-bit coded data have been read out of the data register $DR_1$, the next 8-bit coded data must be introduced in the data register $DR_1$. In such a case, the subroutine DIDO READ shown in FIG. 31 is performed.

Thereafter, whether a carry which resulted from the preceding one-bit shifting is "0" or "1" is determined. If "1", then the CPU advances to the flow for consulting the table to pick up a run-length.

If "0", "1" will be subtracted from the 0 counter. If the resultant count is "7" or less, the coded data are again shifted to count "0"s.

Where 8 bits of "0"s appear continuously in the head portion of the coded data, subtraction of "1" from the 0 counter will leave "0" indicating that the coded data is a sync code. This serves to check errors in received data and detect return marks.

When a carry "i" appears as a result of the shifting of the coded data, a program step $ST_{50}$ will be performed for consulting a first table $T_1$ with the content of the 0 counter as an address.

The tables are divided into two types: one for picking up run-length which correspond to "white" coded data and the other corresponding to "black" coded data. These tables have substantially a common construction. FIG. 30(b) shows a table arramgement for "white" coded data. As shown, the table consists of a first table $T_1$ and a second table $T_2$ located in a preselected area of the ROM. The first table $T_1$ has addresses 1-8 in which $WH_7$-$WH_0$ are stored to indicate leading addresses of the second table.

The second table $T_2$ on the other hand is divided into multiple blocks with respect to the number of "0" bits which will appear at leading portions of coded data. Each of the blocks store data necessary to pick up a run-length corresponding to coded data.

FIG. 30(c) shows a part of the second table $T_2$ which extends from address $WH_1$ to $WH_2$ and corresponds to a case wherein only the leading one bit of coded data is "0".

The program step $ST_{50}$ and onward shown in FIG. 30(a) with be described in combination with the tables depicted in FIGS. 30(b) and 30(c) and taking for example a set of coded data having "0" as its leading one bit only.

When step $ST_{50}$ is reached, the coded data will have been shifted 2 bits "0, 1" and the contents of the 0 counter and bit counter $BTC_{II}$ will have become "7" and "6", respectively.

Therefore, at step $ST_{50}$, data $WH_1$ can be read out of the address 7 of the first table $T_1$.

Then, based on the data, the CPU picks up data 2 from the address $WH_1$ of the second table $T_2$ at steps $ST_{51}$ and $ST_{52}$ and loads a data register $DR_3$ with the data 2.

Why "2" is in the address $WH_1$ of the second table $T_2$ will become apparent from the following description. Let it suffice to mention here that, as Tables 1 and 2 clearly show, coded data having "0, 1" in its leading portion always have two or more bits to follow. This is because coded data starting with "0, 1" has four or more bits.

At step $ST_{53}$, the data register $DR_2$ is cleared to accommodate selected data in a subsequent step.

Next, at step $ST_{54}$, the content of the data register $DR_1$ is transferred to the accumulator ACC and shifted. The shifted data are again brought back to the data register $DR_1$ and, at step $ST_{56}$, the shifted 1-bit data are loaded in the previously cleared data register $DR_2$.

The coded data in the data register $DR_1$ will then have been shifted up to 3 bits. To store this, "1" is subtracted from the content of the bit counter $BTC_{11}$.

The result at a judgement step $JST_{58}$ is NO so that the CPU goes to step $ST_{59}$ and subtracts "1" from the content "2" of the data register $DR_3$.

This makes the content of the data register $DR_3$ "1" and the result at a judgement step $JST_{60}$ is NO. Then the step goes to step $ST_{54}$ whereupon the steps $ST_{54}$–$ST_{59}$ are repeated.

Accordingly, the second time the step $ST_{59}$ is carried out, the data register $DR_1$ will have been loaded with the remaining 4 bits of the coded data and the data register $DR_2$ will have been loaded with the 3rd and 4th bits of the coded data. The bit counter $BCT_{II}$ will have reached "4" and the data register $DR_3$ "0".

The result at a step $JST_{60}$ is therefore YES so that the CPU goes to step $ST_{61}$.

At this step $ST_{61}$, the content of the data register $DR_2$ is added to the second table address $WH_1$ and, at subsequent steps $ST_{62}$ and $ST_{63}$, "1" is added to the sum whereupon the second table is consulted.

For example, where the 3rd and 4th bits of the coded data are "0, 0", viz., "0", data a will be drawn out from address $WH_{1+0+1}$. Likewise, if the 3rd and 4th bits are "0, 1", data b will be produced from address $WH_{1+1+1}$ while, if they are "1, 0", data c will be picked up from address $WH_{1+2+1}$.

Furthermore, if the 3rd and 4th bits of the coded data are "1, 1", then data will be picked up from address $WH_{1+3+1}$.

Coded data at this instant is "0, 1, 1, 1" which is, as seen from Table 1, coded data having a run-length of "2".

Therefore, the address $WH_{1+3+1}$ stores the run-length "2", a symbol T = "0" showing that the run-length is that of a termination code, and a symbol "1" showing that the run-length has been determined, that is, coding has completed.

Generally, a selected address in the second table stores as viewed in FIG. 30(d) a run length (binary number) RUN (in a case where the coded data is a makeup code, a number given by dividing the corresponding run-length by 64), a symbol T/M indicating that the run-length is that of a termination code or that of a makeup code, and a symbol "1" indicating completion of the coding. These symbols will be utilized in subsequent program steps.

In step $ST_{64}$, the data from the table is shifted one bit to determine whether the coding is over and, in step $JST_{65}$, whether a carry "1" has appeared is checked.

Where, for example, data is picked up from address $WH_{1+3+1}$ due to its 3rd and 4th bits which are "1, 1", a carry "1" appears. Then a subroutine RUN LENGTH STORE will be carried out wherein picture element data each having one bit are transferred to the RBF area on the basis of the run-length.

Where the 3rd and 4th bits of coded data are "0, 0" and data a is loaded from address $WH_{1+0+1}$ in the register ADR, a carry is "0" so that the operation goes back to the step $ST_{52}$.

At this step $ST_{52}$, the second table is now consulted on the basis of the content a of the register ADR so that "1" is set in the data register $DR_3$.

Accordingly, at step $ST_{56}$, the 5th bit of the coded data is fed into the data register $DR_2$ and, at step $ST_{63}$, data stored in address $a+0+1$ or $a+1+1$ is loaded in the register ADR in accordance with the content of the 5th bit.

The same procedure will thereafter be repeated. When during this period all of the 8 bits of data stored in the data register $DR_1$ are shifted out, the result at step $JST_{58}$ becomes YES. Then, the next data will be transferred from the FIFO area to the data register $DR_1$, this being referred to as a subroutine FIFO READ.

FIG. 31 is a flow chart representing the subroutine FIFO READ. When entering this flow, the CPU first causes various data stored therein to retire.

Thereupon, data will be read out of the FIFO area. Again, as stated in connection with the transmission mode, the delivery of data into and out of the FIFO area must satisfy two conditions: (1) that the read address should not pass ahead of the write address so the data written in the FIFO area would not be lost, and (2) that the read address should not be passed by the write address so the FIFO area would be prevented from being emptied.

Thus, it is not until whether the read address and write address in the FIFO area are equal to each other is checked, data are transferred from the input/output section IX to the FIFO AREA and the result at step $JST_{66}$ becomes NO that data are allowed to be read out.

When the step $JST_{66}$ gives NO, the initial value "8" is set in the bit counter $BTC_{II}$ to prepare for the return of the operation to the flow shown in FIG. 30(a).

Then, one byte of coded data is read out of the FIFO area and stored in the data register $DR_1$ and the read address in the FIFO area is updated.

At this instant, whether the read address needs to be re-set to the first address is judged at step $JST_{67}$. If unnecessary, the condition is unchanged. If necessary, the initial value is set in the read address register and then the data in the CPU which were retired are brought back to the original state whereupon the flow shown in FIG. 30(a) is resumed.

Figure 32B:
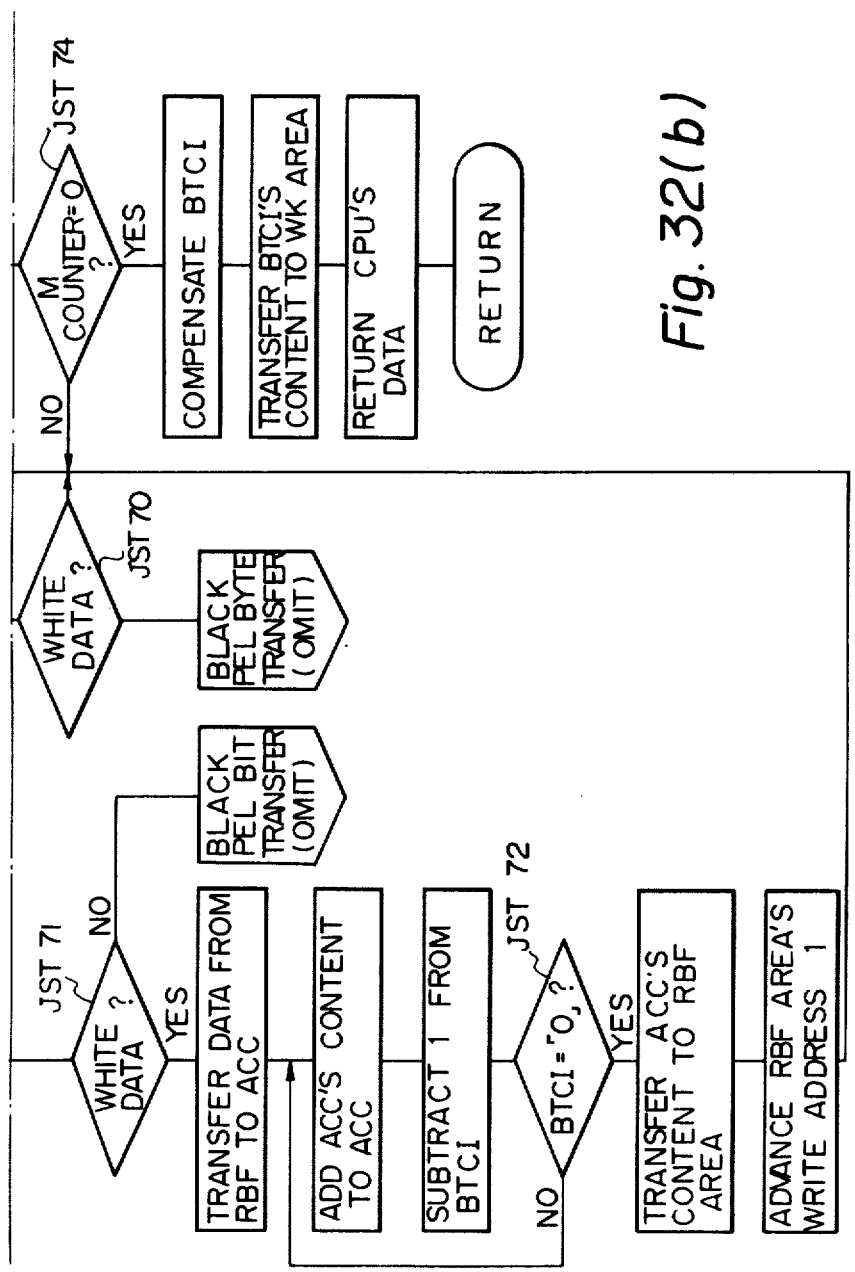
FIG. 32, including A-B, is a flow chart of a subroutine RUN LENGTH STORE in FIG. 30(a)

The subroutine RUN LENGTH STORE is demonstrated in the flow chart of FIG. 32.

First, various data in the CPU are sheltered in the WK area while data necessary for performing this flow are picked up from the WK area to thereby set initial values of various data.

Thereupon, the run-length shifted one bit and stored in the register ADR at the step $ST_{64}$ when the flow of FIG. 30(a) was carried out is again shifted one bit in order to determine whether said run-length corresponds to a termination code or a makeup code.

This shifts T="0" and, if then a carry "1" does not appear, step $JST_{68}$ gives NO suggesting that the run-length stored in the register ADR is that of a termination code. Hence, there occurs a flow wherein picture element data corresponding to the run-length are generated and transferred to the RBF area.

Meanwhile, the register ADR has stored a makeup run-length M which, as discussed, is a numerical code given by dividing a run-length corresponding to a mekeup code by "64". Therefore, if the result at the step $JST_{68}$ is YES, picture element data of a number 64 times the makeup run-length are generated and transferred to the RBF area.

In this flow, the makeup run-length of the register ADR is set in the M counter.

Then at step $JST_{69}$, whether byte-by-byte processing is possible or bit-by-bit processing must be done is determined.

More specifically, in practicing this flow, if the picture element data previously transferred to the RBF area are short of 8 bits, the fraction bits must be transferred first and the address must be filled with transferred first and the address must be filled with 8-bit data.

The number of the fraction bits has been stored in the bit counter $BTC_f$.

Therefore, whether the bit counter $BTC_f$ is "8" is discriminated at the step $JST_{69}$ and, if YES, the data will be processed on a byte-by-byte basis and, if NO, on a bit-by-bit basis.

In the case of byte processing, whether the subject data is "white" or "black" is judged at step $JST_{70}$ and, if "black", a flow described later will be carried out. If "black", there will be performed a flow wherein "black" picture element data are produced by each 8 bits and transferred to the RBF area. This flow on "black" data is substantially similar to that on "white" data, as will be described, except for the difference in the kind of picture element data and, therefore, detailed description thereof will be omitted.

In the case of bit processing, whether the subject data is "white" or "black" is judged at step $JST_{17}$.

As will be recalled, data transmitted from an addresser's station always has "white" coded data immediately following a sync code EOL. Therefore, when the table is consulted on the basis of the coded data by performing the flow of FIG. 30(a) and the corresponding run-length is picked up, the initial run-length is "white" and, thereafter, no color changes occur if with a makeup run-length while the color changes if with a termination code every time a termination run-length is picked up. It follows that, by memorizing a color change which will occur every time a carry "0" appears when at step JST, the content of the register ADR is shifted to check the appearance of the carry "1", whether the run-length is "white" or "black" can be discriminated at step $JST_{71}$.

If the result at the step $JST_{70}$ is "black", "black" picture element data will be produced and transferred to the RBF area. This flow proceeds in substantially the same way as in the case of "white" and therefore will not be discussed any further.

When the result at the step $JST_{71}$ is "white", the CPU temporarily loads in the accumulator ACC the 8-bit data in the address in which fraction bits of the picture element data are to be written.

Then, the content of the accumulator ACC is added to that of the ACC in order to shift the content one bit. As a result, the accumulator accommodates one bit of white picture element data "0" next to the 8-bit data previously loaded therein.

As one bit of the fraction is processed in this way, "1" is subtracted from the bit counter $BTC_f$ and, at step $JST_{72}$, whether the fraction has been fully processed is checked.

If the processing of the fraction has not yet been completed and reflected by NO at the step $JST_{72}$, the content of the accumulator ACC is again shifted to repeatedly introduce "0".

When the bit counter reaches "0" and the fraction area is entirely filled with "0", the content of the accumulator ACC is transferred to the RBF area and the write address in the RBF area is updated.

This completes bit-by-bit processing and permits byte-by-byte processing thereafter. Thus, the initial value "8" is first set in the T counter.

Then the content of the accumulator ACC is made all "0" and delivered to the RBF area, the write address of the RBF area is updated, and "1" is subtracted from the T counter. This procedure is repeated eight times.

If the result at the step $JST_{73}$ is YES meaning that 64 bits of picture element data have been transferred to the RBF area, "1" is subtracted from the M counter.

At step $JST_{74}$, whether the content of the M counter was made "0" by the above procedure is checked and, if No, then "8" will again be set in the T counter to transfer 64 bits of "white" picture element data.

If all of the "white" picture element data equal to the run-length which corresponds to the makeup code have been transferred to the RBF area and the step $JST_{74}$ thus gives YES, the content of the bit counter $BTC_f$ is compensated.

More specifically, a run-length corresponding to a makeup code is a multiple of "8". Where picture element data of the run-length are generated and stored in the RBF area, the picture element data written in the last address of the RBF area is effective only in its bits given by substracting the fraction written in the initial address on a bit-by-bit basis from the entire 8 bits. When subsequently the picture element data of a termination run-length are transferred, it needs be memorized how many more bits of picture element data should be loaded in the address. For this purpose, the content of the bit counter $BTC_f$ is compensated to regain the initial fraction.

After it has been stored in the WK area and various data of the CPU previously sheltered have brought to their initial states, the flow shown in FIG. 30(a) is resumed.

Turning back to the flow of FIG. 30(a), the CPU operates to pick up a run-length from the table as discussed so that the register ADR is loaded with a termination run-length after a makeup run-length. The result at the step $JST_{68}$ therefore becomes NO and picture element data of that termination run-length is generated and transferred to the RBF area.

Figure 33B:
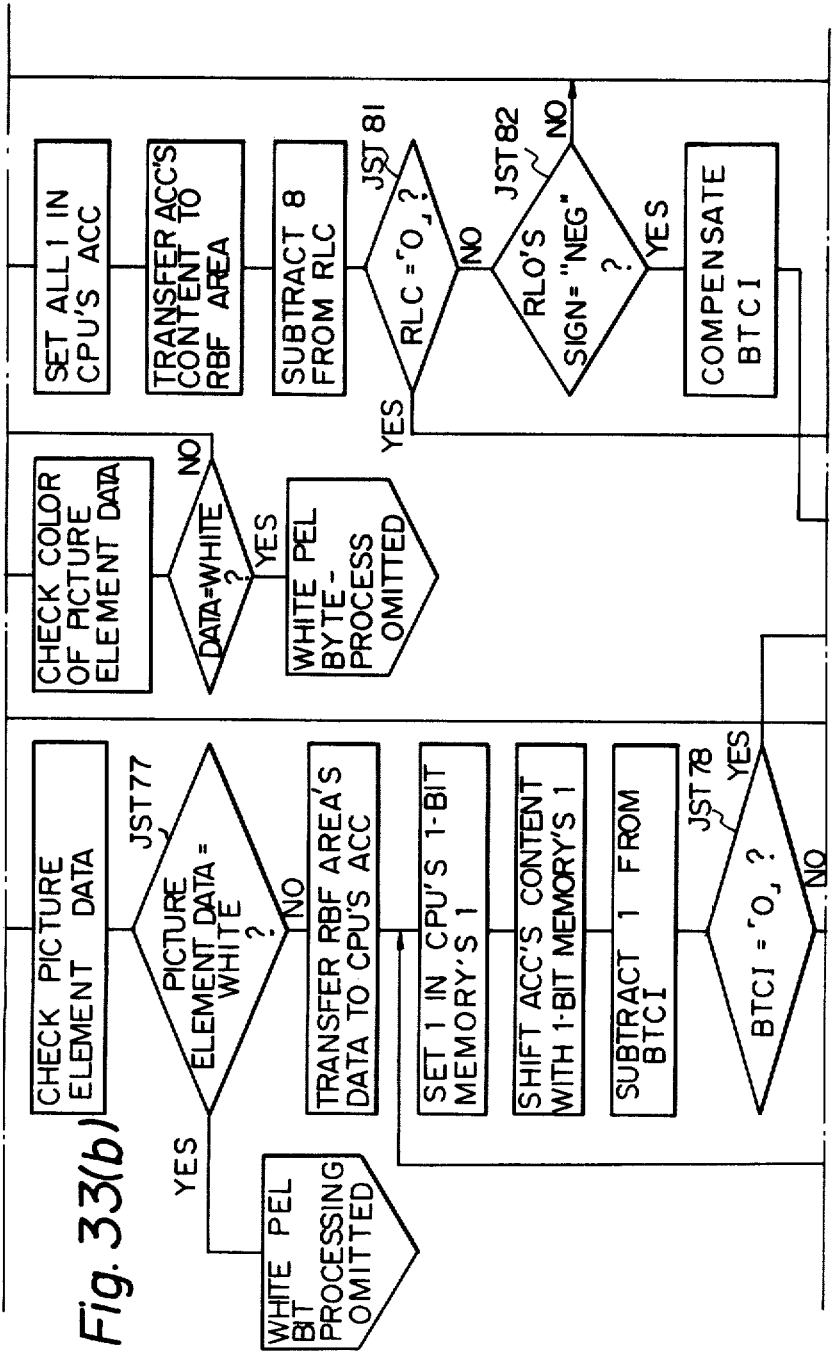
FIG. 33, including A-C, is a flow chart showing a procedure for storing the termination picture element data in the RBF area.
Figure 33C:
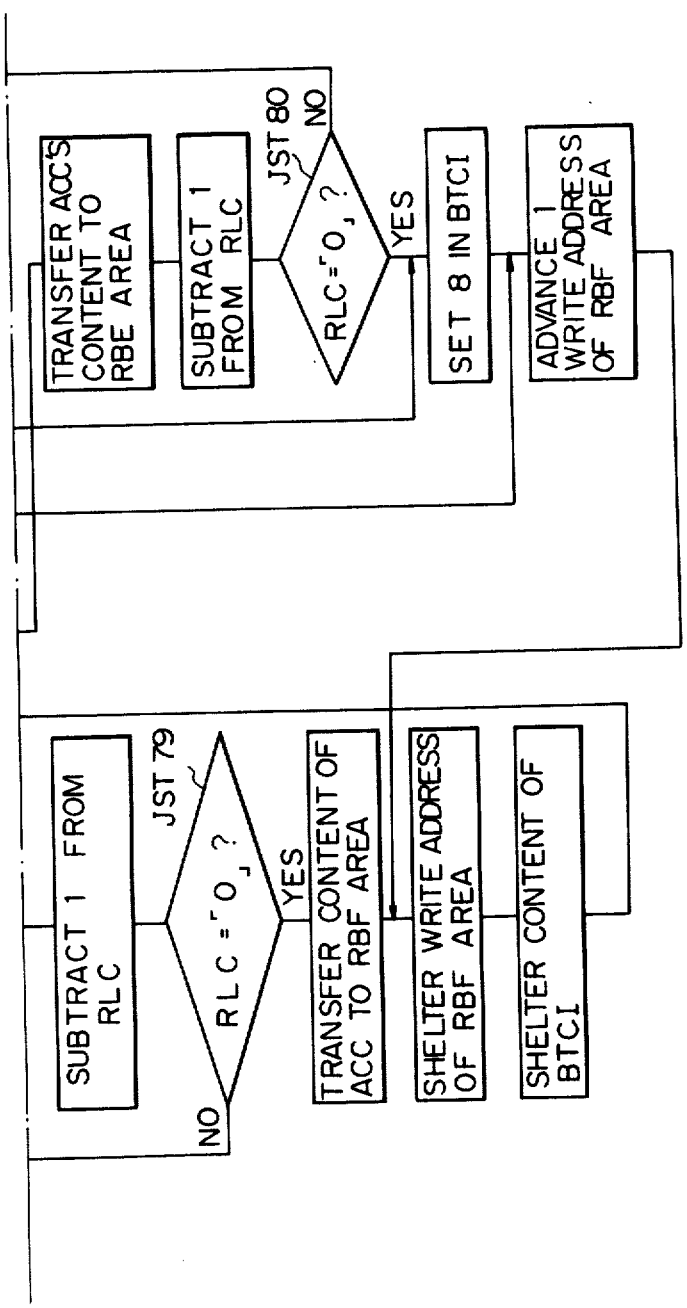

This flow is indicated in FIG. 33 and determines whether the run-length loaded in the register ADR is "0".

If the result at step JST$_{75}$ is YES indicating that it is needless to transfer picture element data to the RBF area since the run-length is "0", the various data sheltered previously will regain the initial states and the flow of FIG. 30(a) will be resumed.

If the result at the step JST$_{75}$ is NO, the fraction of data in the address which is to be loaded with data in the RBF area is checked.

Whether the bit counter BTC$_I$ is "8" is examined and, if step JST$_{76}$ gives YES showing that the fraction is "0" and 8-bit data can be written in the write address, whether the data which should be generated is "black" or "white" is determined. This is followed by a byte-by-byte processing flow.

The byte-by-byte processing for "black" data will be described hereinafter. The same processing for "white" data is substantially similar to the processing for "black" and, therefore, its details will not be described.

If the result at the step JST$_{76}$ is NO meaning that the previously transferred data is short of 8 bits, fraction bits will first be transferred to the address and bit-by-bit processing will be performed to make the number of bits in that address "8".

For this purpose, whether the picture element data which should then be produced is "white" or "black" is determined and, if step JST$_{77}$ determines said picture element data should be "white", "white" picture element data will be produced and transferred to the RBF area. This flow proceeds essentially the same way as the flow for "black" data which will be described and, therefore, details thereof will be omitted.

If the step JST$_{77}$ gives NO, of the picture element data, data which is about to be transferred is loaded in the accumulator.

Thereupon, "1" is set in the 1-bit memory and the data in the accumulator ACC is shifted one bit through the 1-bit memory.

As a result, the accumulator ACC is now loaded with the previously written 8-bit picture element data and one bit of which has been replaced by black picture element data "1" which is to be loaded this time.

As the picture element of the fraction one bit is produced in this way, "1" is subtracted from the bit counter BTC$_1$.

As step JST$_{78}$, whether the above step made the bit counter "0" is judged. If the result in NO, indicating that fraction bits to be processed are still left, "1" is subtracted from the run-length stored in the ADR and, at step JST$_{79}$, whether the termination run-length was completely processed is checked.

If No at the step JST$_{79}$, the accumulator ACC is again shifted and the process for loading one bit of "black" picture element data is repeated.

If YES at the step JST$_{79}$, suggesting that picture element data for the termination length has been produced before the fraction is processed, the content of the accumulator ACC is transferred to the right address of the RBF area.

Thereafter, the write address and content of the counter BTC$_I$ are stored in the WK area and the internal conditions of the CPU are brought back to the original. Then the flow shown in FIG. 30(a) is resumed.

If the fraction has been processed before the processing of the termination run-length is completed and "black" picture element data corresponding to the fraction bits have been introduced in the picture element data unloaded from the accumulator ACC with the ACC thus filled with selected data, the result at the step JST$_{78}$ becomes YES and the content of the accumulator ACC is transferred to the RBF area while "1" is subtracted from the termination run-length.

Then, if the result at step JST$_{80}$ is NO indicating that the termination run-length has not yet been fully processed, the write address in the RBF area will be incremented by one and the CPU enters byte-by-byte processing.

If the step JST$_{80}$ gives YES, "8" will be set in the bit counter BTC$_I$ and the write address in the RBF area will be incremented by one whereupon they will be stored in the WK area.

Then the CPU regains the original internal conditions therein and shifts to the flow of FIG. 30(a).

Entering byte processing, the CPU sets all "1" in 8 bits in its accumulator and transfers them to the RBF area.

Thereupon, "8" is subtracted from the termination run-length and, at step JST$_{81}$, whether this made the termination run-length "0" is discriminated.

If YES at the step JST$_{81}$, suggesting that the termination run-length has been fully processed with just 8-bit picture elements, data loaded in the write address of the RBF area, "8" is set in the bit counter BTC$_I$ and the write address is incremented by one. Thereafter, as in the aforementioned case, such data are stored in the WK area and the CPU regaining the original internal conditions goes to the flow of FIG. 30(a).

If NO at the step JST$_{81}$, whether the result given by subtracting "8" from the run-length is positive or negative, that is, whether its sign is "0" or "1" is determined.

If NO at the step JST$_{82}$, indicating the run-length is still remaining, the write address is incremented and then one byte of "black" picture element data is again transferred to the RBF area.

If YES at the step JST$_{82}$, indicating that picture element data exceeding the termination run-length have been transferred to the RBF area, the bit counter BCT$_I$ is loaded with a fraction. This fraction represents the number of bits which should be introduced when the next picture element is transferred to that address of the RBF area.

In this instance, that write address of the RBF area will have been loaded with extra "black" data. This extra data is of no consequence, however, since it will be replaced by the next picture element data as will be apparent from the foregoing description.

After the compensation of the bit counter BRC$_I$, the write address is renewed and these data are stored in the WK area. Then the CPU regains the original internal conditions and returns to the flow of FIG. 30(a).

By this duty I which the CPU performes, the data in the FIFO area are loaded in the CPU byte by byte and decoded thereby to be stored in the RBF area.

When the CPU carries out the duty H in response to the aforementioned interrupt request signal int$_h$, the decoded data will be delivered through the output section III to the recorder section IV to be thereby recorded on a sheet.

Figure 34:
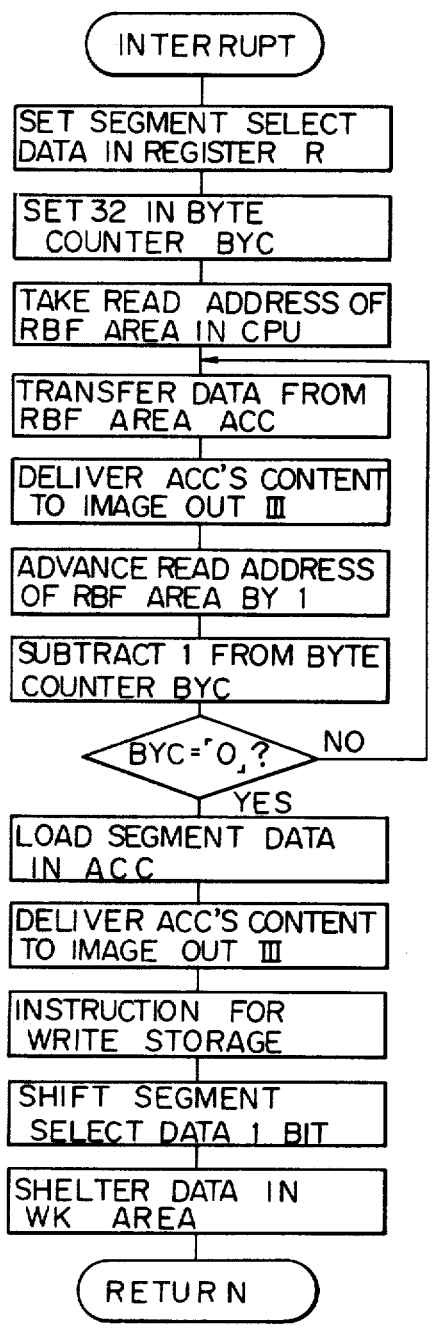
FIG. 34 is a flow chart representing a procedure for transferring picture element data from the RBF area to the received image output section III.

The transfer of picture element data to the output section III in the duty H is represented by a flow chart in FIG. 34.

Entering this flow, the CPU first draws out segment selection data for the thermal element discussed with reference to FIGS. 5(a) and 5(b) from the WK area.

As stated, segment selection data are adapted to sequentially select eight segments of the thermal element. Hence, at the instant the initial segment of a line is to be selected, the WK area will have stored "0, 0, 0, 0, 0, 0, 0, 1" therein.

Then the initial value "32" is set in a byte counter BYC.

This is because, as described, one segment of data comprises 256 bits or 32 bytes and image data must be processed 32 times by each 8 bits in order that they may be loaded in the received image output section III.

Also, the read address of the RBF area is unloaded from the WK area and loaded in the CPU.

Subsequently, one byte of data is transferred from the read address to the accumulator ACC. The one byte of data is coupled from the accumulator to the output section III while the read address is updated. This completes transfer of one byte of data and, thus, "1" is subtracted from the byte counter BYC.

As the CPU repeats such data transfer 32 times in succession, the received image output section III becomes loaded with one segment of data.

Then the byte counter BYC reaches "0" whereupon segment selection data are transferred from the register R to the accumulator and therefrom to the output section III.

The output section III is now loaded with one segment of picture element data and segment selection data. Then the CPU supplies the output section III with a write strobe $ws_2$ for generating a power enable signal already mentioned.

Consequently, the thermal element is activated in the described manner so that the revorder section IV records one segment of data on a recording sheet.

The CPU shifts the segment selection data one bit to become prepared for another duty H, causes the read address of the RBF area to be sheltered in the WK area, and then starts the duty which it had undertaken before the interrupt.

The duty H the CPU performs in response to an interrupt request signal $int_h$ also includes the delivery of a phase exciting signal to the vertical scan pulse of the recorder section in addition to the data delivery discussed hereinabove. The supply of such a signal is substantially the same as the one described with reference to FIGS. 18(a)-18(c) and, therefore, will not be described any further.

It will thus be seen that, in a reception mode, the CPU performing the various duties F-I decodes received image data and records them to produce a copy.

To realize a facsimile system using a microcomputer, the embodiment shown and described had the following design conception. First, duties which the CPU is to perform are determined. In a data transmission mode, the duties are divided into A-D and carried out by the CPU on a time division basis at predetermined timings so that picture element data read out by the scanner section I are coded and delivered to the modem. In a data reception mode, the duties are divided into F-I and carried out by the CPU on a time division basis at predetermined timings so that coded image data from the modem are decoded and delivered therefrom to the recorder section IV to be recorded on a recording sheet. This is not restrictive but only illustrative, however. Operations the CPU performs to process data necessary for facsimile communication may be divided as desired and the timings at which the CPU will perform the duties are open to choice.

An example of alternative designs will be described taking for example operations to be carried out in the data reception mode.

Operations the CPU should carry out in a reception mode are divided into duties J-M as will be described; duty M is usually performed while duties J-L will be effected in response to individual interrupt request signals $int_f$-$int_h$. The order or priority of the duties J-L is predetermined as K>L>J.

When in duty J, if a memory full flag $MFF_I$ or $MFF_{II}$ indicating that one line of decoded picture element data have been stored in the LBF area I or II of the random access memory RAM is set, the CPU resets the flag MFF and sets a data read flag $DRF_I$ or $DRF_{II}$ and supplies the received image output section III with 256 bits of image data by each 8 bits from the LBF area I or II.

The duty K of the CPU is to transfer to and store in a selected address of the FIFO area coded data applied from the modem serially to the CPU and transformed by the input section IX into parallel data in 8 bits blocks.

In duty L, when the data read flag DRF is set, the CPU will apply the selected phase exciting pattern to the control signal output section XI so as to advance the vertical scan pulse motor of the recorder section IV.

Figure 35:
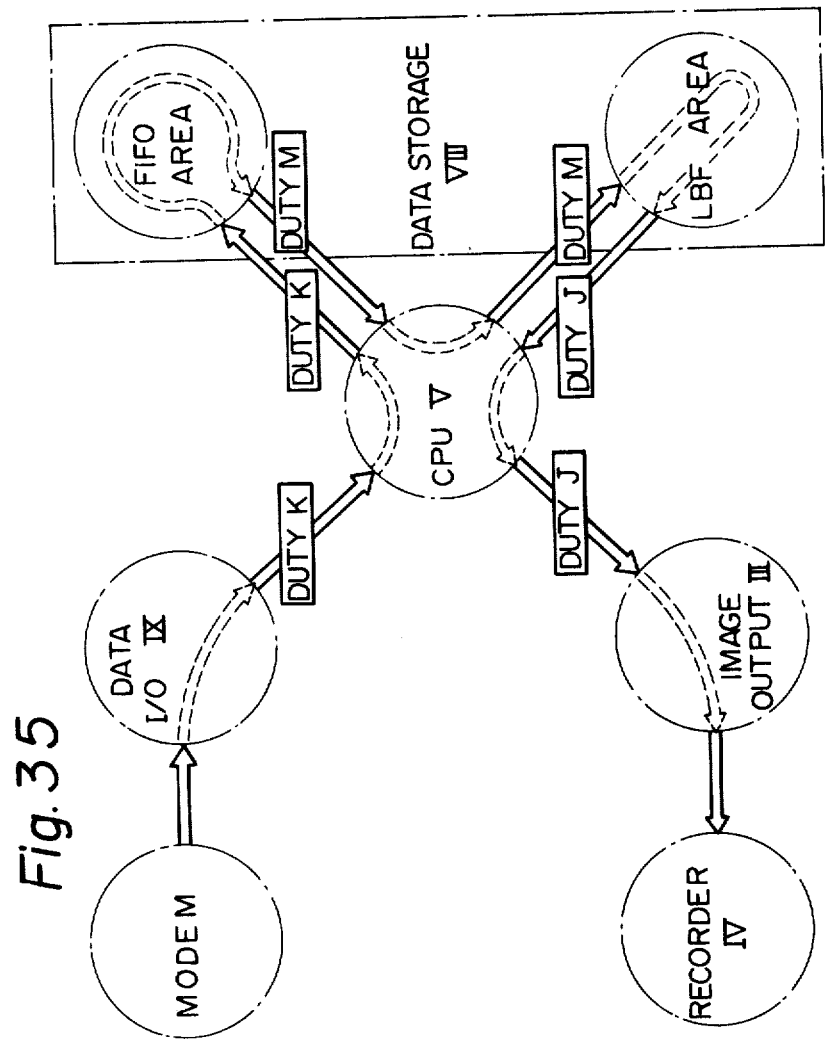
FIG. 35 shows image data processing paths according to another embodiment of the present invention.
Figure 36:
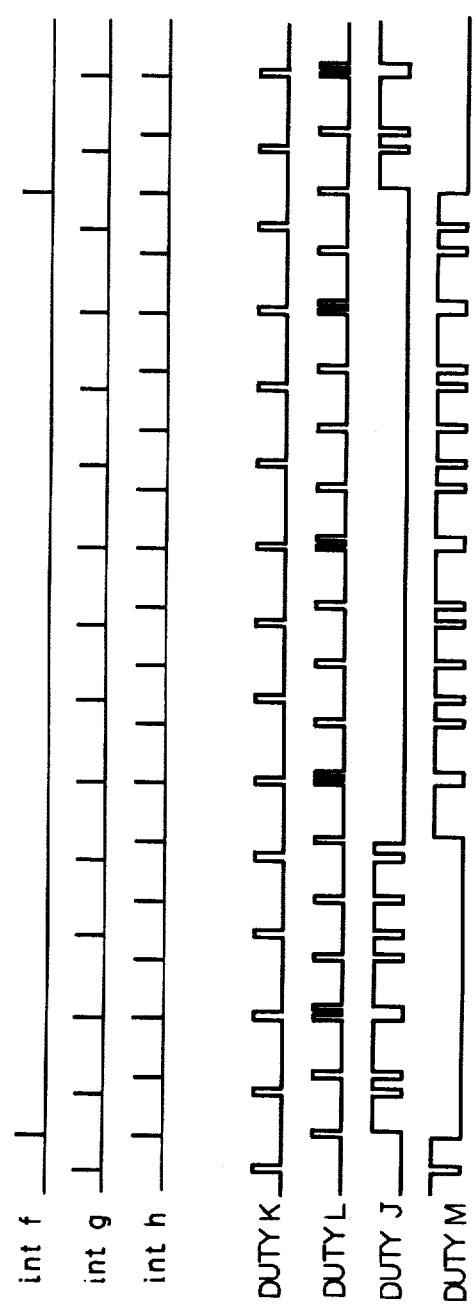
FIG. 36 is a time chart demonstrating the operation of the embodiment shown in FIG. 35.

In duty M, if the LBF area I or II is empty with the memory empty flag $MEF_I$ or $MEF_{II}$ thus set, the CPU resets the memory empty flag and takes in coded data from the FIFO area. The coded data are decoded and transferred to the LBF area to be stored therein. Upon completion of one line of decoding operation, errors in the received image data are checked and, if no errors, the memory full flag $MFF_I$ or $MFF_{II}$ is set.

Where the CPU is allocated with duties J-M to perform in a reception mode and carry them out at given timings on a time division basis in response to interrupt request signals $int_f$-$int_h$, facsimile data can be received and processed by the CPU as indicated by FIGS. 35 and 36.

More specifically, the CPU usually carries out duty M in which image data are loaded in the CPU each by 8 bits from the FIFO area and transferred sequentially therefrom to the LBF area as decoded data. Receiving an interrupt request signal based on the sync signal $s_1$, the CPU interrupts the duty M and performs the duty J whereby the decoded picture element data stored in the LBF area are coupled to the received image output section IV on an 8 bit basis. When the interrupt request signal $int_h$ based on the sync signal $s_2$ appears while the CPU is performing the duty J, the CPU now interrupts the duty J and carries out the duty L which supplies the control signal output section XI with a phase exciting pattern to advance the vertical scan pulse motor of the recorder station IV one step. In response to a further interrupt request which may be made by the signal $int_g$ while the CPU is performing the duty L, the CPU carries out this duty L having priority over the others and transfers coded image data from the data input/output section XI to the FIFO area and, thereafter, returns to the duty L. After this duty L, the CPU will go back to the duty J and then to the duty M. In this way, the CPU performs the various duties on a time division basis in accordance with the order of priority of the duties.

Practically, these individual duties follow substantially the same procedures as those discussed with reference to FIGS. 29-34 and, therefore, detailed description thereof will be omitted.

While various registers, counters and the like necessary for the CPU to achieve various duties have been shown and described as being incorporated in the CPU, such registers, counters and the like naturally be located outside the CPU.

Obviously, the present invention is practicable not only with a public line using a modem as in the illustrated embodiment but with a digital line.

The 8-bit CPU employed in the embodiment for processing data may obviously be replaced by a 16-bit CPU, 4-bit CPU, 32-bit CPU, bit slice CPU or like suitable type of CPU.

Furthermore, the scanner section I and recorder section IV shown in the embodiment may have any suitable designs. For instance, the scanner section may be constructed to pick up picture element data from a magnetic tape, memory or like image source while the recorder section may comprise a computer.

Additionally, an apparatus at the addresser's station or at the addressee's station may take the form of a computer or a storage exchange apparatus.

In summary, a facsimile communication system according to the present invention permits a microcomputer installed therein to process facsimile data by each predetermined number of bits; the processing is divided into a plurality of duties which the microcomputer will practice on a time division basis at predetermined timings. Accordingly, the microcomputer operates with such an efficiency that high-speed data processing necessary for facimile communication is achievable despite a relatively low operating rate of the microcomputer. Therefore, high-speed hardware portions of a conventional apparatus can be replaced by a microcomputer to constitute quite a compact and economical apparatus for facsimile communication.

The illustrated embodiment of the present invention is so designed that the CPU performing the duty I decodes coded data drawn out from the FIFO area and temporarily stores them in the LBF area whereafter the CPU performing the duty H delivers the picture element data to the received image output section III. Alternatively, the decoded picture element data may be directly coupled to the output section III without the temporary storage in the LBF area. This type of arrangement makes the LBF area needless and thereby minimizes the necessary capacity of the data storage section VIII with the resultant cut-down in cost of such apparatus. It is also possible to omit the duty the CPU would perform to deliver picture element data to and out of the LBF area by each 8 bits, so that the CPU obtains an extra time available for processing and, therefore, proportioning of time for the duties of the CPU becomes easy.

Various registers, counters and the like necessary for the CPU to carry out its various duties have been shown and described as being accommodated in the CPU. Obviously, they may be located outside the CPU.

It will be apparent that the present invention is practicable not only with a public line using a modem as in the illustrated embodiment but with a digital line.

Also, the 8-bit CPU employed in the embodiment for processing data may be replaced by a 16-bit CPU, 4-bit CPU, 32-bit CPU, bit slice CPU or like suitable type of CPU.

The scanner section I and recorder section IV shown in the embodiment may have any suitable designs. For instance, the scanner section may be constructed to pick up picture element data from a magnetic tape, memory or like image source while the recorder section may comprise a computer.

Additionally, an apparatus at the addressee's station or at the addresser's station may take the form of a computer or a storage exchange apparatus.

It will now be appreciated from the foregoing description that, since according to the present invention a buffer unit, coder/decoder unit, communication control unit and other hardware sections of a conventional apparatus for facsimile communication are replaced by a microcomputer, there can be provided a very compact and inexpensive apparatus for facsimile communication.

What is claimed is:

1. A facsimile apparatus comprising:
scanner means;
recorder means;
microcomputer means having a central processing unit, a read only memory containing an operating program and a random access memory;
modem means;
first interface means connected between the scanner means and the microcomputer means;
second interface means connected between the microcomputer means and the modem means; and
third interface means connected between the microcomputer means and the recorder means;
in a transmission mode, the operating program controlling the microcomputer means to store image data from the scanner means in a first section of the random access memory through the first interface means, encode the data and store the encoded data in a second section of the random access memory and transfer the encoded data from the second section of the random access memory through the second interface means to the modem for transmission;
in a reception mode, the operating program controlling the microcomputer means to store encoded data received through the modem in the second section of the random access memory through the second interface means, decode the data and store the decoded data in the first section of the random access memory and transfer the decoded data from the first section of the random access memory through the third interface means to the recorder for producing a facsimile reproduction.

2. An apparatus as in claim 1, in which the microcomputer means comprises a first microprocessor for encoding data and a second microprocessor for decoding data.

3. An apparatus as in claim 1, in which the operating program controls the microcomputer means to perform operations on a priority interrupt basis.

4. An apparatus as in claim 1, in which, in the transmission mode, the operating program controls the microcomputer means to perform the following operations on a priority interrupt basis, with the priority decreasing from the first listed operation to the last listed operation:
control the scanning means to perform vertical scan;
transfer data from the second section of the random access memory to the second interface means;
store image data from the scanner means in the first section of the random access memory; and
encode the data and store the encoded data in the second section of the random access memory.

5. An apparatus as in claim 1, in which, in the reception mode, the operating program controls the microcomputer means to perform the following operations on a priority interrupt basis, with the priority decreasing from the first listed operation to the last listed operation;
   store received encoded data from the modem means in the second section of the random access memory;
   control the recorder means to perform vertical scan and transfer decoded data from the first section of the random access memory to the recorder means; and
   decode the data and store the decoded data in the first section of the random access memory.

6. An apparatus as in claim 1, in which the first interface means comprises serial to parallel converter means, the second interface means comprising parallel to serial converter means for converting data passing therethrough from the microcomputer to the modem from parallel to serial form; and serial to parallel converter means for converting data passing therethrough from the modem to the microcomputer from serial to parallel form, the microcomputer storing and operating on data in bytes, each byte comprising a predetermined number of bits.

7. An apparatus as in claim 1, in which the first section of the random access memory comprises a line buffer section and the second section of the random access memory comprises a first-in-first-out section.

8. An apparatus as in claim 1, in which the second interface means comprises a shift register and at least one latch for performing serial to parallel and parallel to serial conversion.

9. An apparatus as in claim 1, in which the operating program controls the microcomputer means to perform run length encoding and decoding on the data.

10. An apparatus as in claim 9, in which the read only memory has stored in a table section thereof, a look-up table for encoding and decoding the data.

11. An apparatus as in claim 10, in which the operating program controls the microcomputer means to, in the transmission mode, apply run lengths to the table section as address inputs.

12. An apparatus as in claim 10, in which the operating program controls the microcomputer means to, in the reception mode, apply run length codes to the table section as address inputs.

* * * * *